United States Patent
Katsuta et al.

(10) Patent No.: US 10,162,214 B2
(45) Date of Patent: Dec. 25, 2018

(54) LIQUID CRYSTAL DISPLAY DEVICE, OPTICAL CONTROL MEMBER, AND BASE MATERIAL FOR MANUFACTURING OPTICAL CONTROL MEMBER

(71) Applicant: SHARP KABUSHIKI KAISHA, Sakai, Osaka (JP)

(72) Inventors: Shohei Katsuta, Sakai (JP); Yasushi Asaoka, Sakai (JP); Sho Ochi, Sakai (JP); Emi Yamamoto, Sakai (JP); Hideomi Yui, Sakai (JP); Tsuyoshi Maeda, Sakai (JP); Tsuyoshi Kamada, Sakai (JP); Yuhsuke Tsuda, Sakai (JP); Katsumi Kondoh, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 25 days.

(21) Appl. No.: 15/311,628

(22) PCT Filed: May 15, 2015

(86) PCT No.: PCT/JP2015/064106
§ 371 (c)(1),
(2) Date: Nov. 16, 2016

(87) PCT Pub. No.: WO2015/178321
PCT Pub. Date: Nov. 26, 2015

(65) Prior Publication Data
US 2017/0082894 A1 Mar. 23, 2017

(30) Foreign Application Priority Data

May 21, 2014 (JP) .................................. 2014-105368
Apr. 7, 2015 (JP) .................................. 2015-078513

(51) Int. Cl.
G02F 1/1335 (2006.01)
G02B 1/118 (2015.01)
(Continued)

(52) U.S. Cl.
CPC ........ G02F 1/133528 (2013.01); G02B 1/118 (2013.01); G02F 1/1335 (2013.01);
(Continued)

(58) Field of Classification Search
CPC ............... G02F 2001/133562; G02F 1/133504
(Continued)

(56) References Cited

U.S. PATENT DOCUMENTS 5,726,727 A * 3/1998 Shibahara ......... G02F 1/134336
349/129
2002/0012169 A1 1/2002 Kashima
(Continued)

FOREIGN PATENT DOCUMENTS

JP 11-295523 10/1999
JP 2006-113208 4/2006
(Continued)

*Primary Examiner* — Christopher Raabe
(74) *Attorney, Agent, or Firm* — ScienBiziP, P.C.

(57) ABSTRACT

A liquid crystal display device according to one aspect of the present invention includes a liquid crystal panel of a vertical alignment mode, and an optical control member disposed on a light-exiting side of the liquid crystal panel. The liquid crystal panel includes a plurality of pixels having at least two domains (50a, 50b), in which directors of liquid crystal molecules are in a first direction. An absorption axis of a first polarizing sheet and an absorption axis of a second polarizing sheet are a mutually orthogonal and form angle that is approximately 45°. The optical control member includes a base, a light diffusion part, a light blocking layer and a low refractive index part. A planar shape of the light blocking layer (40) when seen from a normal line direction of the base (Continued)

has a straight line part parallel to the absorption axis (P1, P2) of one of the first polarizing sheet and the second polarizing sheet and a straight line part forming an angle of less than 45° with the absorption axis (P1, P2) of one polarizing sheet.

20 Claims, 35 Drawing Sheets

(51) Int. Cl.
    *G02F 1/1337*     (2006.01)
    *F21V 8/00*     (2006.01)
    *G02F 1/1343*     (2006.01)

(52) U.S. Cl.
    CPC ...... *G02F 1/1337* (2013.01); *G02F 1/133504* (2013.01); *G02F 1/133512* (2013.01); *G02B 6/0053* (2013.01); *G02F 2001/133531* (2013.01); *G02F 2001/133742* (2013.01); *G02F 2001/134345* (2013.01)

(58) Field of Classification Search
    USPC ........................................................ 349/130
    See application file for complete search history.

(56) References Cited

U.S. PATENT DOCUMENTS

| | | | |
|---|---|---|---|
| 2010/0283947 A1* | 11/2010 | Nishihara ............ | G02B 17/006 349/112 |
| 2011/0199549 A1 | 8/2011 | Washizawa | |
| 2012/0307172 A1* | 12/2012 | Yoshida ............ | G02F 1/133707 349/43 |
| 2013/0329401 A1* | 12/2013 | Yamamoto ............. | F21V 13/02 362/97.2 |
| 2014/0111862 A1* | 4/2014 | Yamamoto ........ | G02F 1/133504 359/599 |
| 2014/0160410 A1* | 6/2014 | Yamamoto ....... | B29D 11/00798 349/112 |
| 2014/0253844 A1* | 9/2014 | Yamamoto ............. | G02B 6/005 349/64 |
| 2014/0320777 A1 | 10/2014 | Fukushima | |
| 2014/0354927 A1* | 12/2014 | Kanno ............. | G02F 1/133504 349/112 |
| 2015/0042934 A1* | 2/2015 | Kanno .................... | G02B 5/00 349/112 |
| 2015/0042935 A1* | 2/2015 | Yamamoto ........... | G02B 5/0231 349/112 |
| 2015/0062491 A1* | 3/2015 | Sakuragi ............. | G02B 5/3083 349/64 |
| 2015/0160507 A1* | 6/2015 | Katsuta ............. | G02F 1/133504 349/61 |
| 2015/0205151 A1 | 7/2015 | Kamada | |
| 2015/0285963 A1* | 10/2015 | Asaoka ................ | G02B 5/0242 349/112 |
| 2015/0286101 A1* | 10/2015 | Katsuta ............. | G02F 1/133504 349/33 |
| 2016/0018572 A1* | 1/2016 | Katsuta ............. | G02F 1/133504 349/112 |
| 2016/0139453 A1* | 5/2016 | Yui ....................... | G02B 5/0236 359/599 |
| 2016/0139454 A1* | 5/2016 | Katsuta ................ | G02B 5/0242 359/599 |
| 2016/0370512 A1* | 12/2016 | Yamamoto .......... | G02F 1/13363 |
| 2017/0003545 A1* | 1/2017 | Asaoka ............... | G02F 1/13363 |
| 2017/0038634 A1* | 2/2017 | Katsuta ................ | G02B 6/0046 |

FOREIGN PATENT DOCUMENTS

| | | |
|---|---|---|
| JP | 2011-169942 | 9/2011 |
| JP | 2012-243526 | 12/2012 |
| JP | 2013-114142 | 6/2013 |
| WO | WO 2013/080495 | 6/2013 |
| WO | WO 2013/151034 | 10/2013 |
| WO | WO 2014/034471 | 3/2014 |
| WO | WO 2014/065363 | 5/2014 |

* cited by examiner

LIQUID CRYSTAL DISPLAY DEVICE, OPTICAL CONTROL MEMBER, AND BASE MATERIAL FOR MANUFACTURING OPTICAL CONTROL MEMBER

TECHNICAL FIELD

The present invention relates to a liquid crystal display device, an optical control member, and a base material for manufacturing an optical control member.

This application is the U.S. national phase of International Application No. PCT/JP2015/064106 filed on May 15, 2015 which designated the U.S. and claims priority to JP patent application No. 2014-105368 filed on May 21, 2014 and JP patent application No. 2015-078513 filed on Apr. 7, 2015, the entire contents of each of which are hereby incorporated by reference.

BACKGROUND ART

Liquid crystal display devices are widely used as displays for portable electronic devices such as smartphones, or for televisions and personal computers and the like. Recently, with progress particularly in high-definition displays, development is progressing of displays capable of accommodating super Hi-Vision video (7680 pixels×4320 pixels), which has four times the resolution of conventional full Hi-Vision video (1920 pixels×1080 pixels). In general, when the display screen of a liquid crystal display device is viewed straight on from the front, it exhibits superior display characteristics. In contrast, when the display screen is viewed from at an inclination, the contrast tends to decrease and the viewability worsens. For that reason, various methods have been proposed for broadening the observable screen viewing angle range with good viewability.

For example, VA (vertical alignment) mode and MVA (multi-domain vertical alignment) mode liquid crystal display devices with good viewing angle characteristics have been disclosed by the patent document 1.

PRIOR ART DOCUMENT

Patent Document

[Patent Document 1] Japanese Patent Application Publication No. 2006-113208

SUMMARY OF THE INVENTION

Problem to be Solved by the Invention

As indicated in Patent Document 1, if division is made into multiple domains of four or more within one pixel, although the viewing angle range can be broadened, there are drawbacks, such as dark lines between domains, a lowering of the liquid crystal cell transmissivity due to the influence of interconnects required by the domain division, and an increase in the complexity of construction within the cell. Because the dark line width and the interconnect width do not increase with an increase in the pixel size, the result is that, in high-definition displays, in which the pixel size is reduced, their influence increases. If the number of domains within one pixel is reduced, for example in a VA-mode liquid crystal display device with two domains, compared with the case of four domains, the transmissivity of the liquid crystal cell is improved and the cell structure is simplified. If there are two domains, the average direction of the long axis of the liquid crystal molecules included in each domain are mutually 180° different when a voltage is applied. In the following, the direction parallel to the long axis of the liquid crystal molecules will be called the director.

If it is assumed that, when a voltage is applied, the liquid crystal molecules fall over in the up/down direction of the screen of the liquid crystal display device, if the liquid crystal display device is viewed at an inclination from the left or right, there is no great change in the display screen compared to the case of viewing the liquid crystal display device from straight on. In contrast, if the liquid crystal display device is viewed at an inclination from above or below, there is a change in the color of the display screen, compared with the case of viewing the liquid crystal display device from straight on. That is, there is a problem in that a VA-mode liquid crystal display device with two domains in one pixel has a directivity angle with a high viewing angle dependency and viewing angle characteristic with a high orientation angle dependency.

One aspect of the present invention is made to solve the above-noted drawbacks and has as an object to provide a liquid crystal display device with a small viewing angle dependency. One aspect of the present invention has as an object to provide an optical control member used for reducing the viewing angle dependency of a liquid crystal display device. One aspect of the present invention has as an object to provide a base material for manufacturing an optical control member used when manufacturing the above-noted optical control member.

Means for Solving the Problems

To achieve the above-described object, a liquid crystal display device according to one aspect of the present invention includes: a liquid crystal panel comprising a first substrate having a first vertical alignment film, a second substrate having a second vertical alignment film, a liquid crystal layer having negative dielectric anisotropy sandwiched between the first vertical alignment film and the second vertical alignment film, a first polarizing sheet disposed on the light incidence side of the liquid crystal layer, and a second polarizing sheet disposed on the light-exiting side of the liquid crystal layer; and an optical control member disposed on the light-exiting side of the liquid crystal panel. The liquid crystal panel comprises a plurality of pixels having at least two domains, in which the directors of liquid crystal molecules in the liquid crystal layer are in a first direction and are in mutually opposite orientations. The absorption axis of the first polarizing sheet and the absorption axis of the second polarizing sheet are mutually orthogonal and form angle that is substantially 45° with respect to the first direction. The optical control member includes a base having transparency to light, a light diffusion part provided on a first surface of the base, a light blocking part provided at a position of the first surface that does not overlap with the light diffusion part when viewed from the normal direction of the base, and a low refractive index part having a refractive index lower than the refractive index of the light diffusion part, provided at a position that partially overlaps with the light blocking part when viewed from the normal direction of the base. The light diffusion part has a light-exiting end surface positioned on the base side, a light incidence end surface positioned on the side opposite from the base side, and an inclined surface positioned between the light-exiting end surface and the light incidence end surface. The planar shape of the light blocking part when seen from the normal line direction of the base has a straight line part parallel to the absorption axis of one of the first polarizing sheet and the second polarizing sheet and a straight line part forming an angle of less than 45° with the absorption axis of one polarizing sheet.

In the liquid crystal display device according to one aspect of the present invention, the planar shape of the light blocking layer may have a major axis and a minor axis.

In the liquid crystal display device according to one aspect of the present invention, the planar shape may be a polygon.

In the liquid crystal display device according to one aspect of the present invention, the polygon may be a rhombus.

In the liquid crystal display device according to one aspect of the present invention, the planar shape may be a rhombus with at least one corner part cutaway by a straight line or a curved line.

In the liquid crystal display device according to one aspect of the present invention, the planar shape may have a straight line part parallel to the first direction and a straight line part perpendicular to the first direction. The total of the lengths of the straight line part parallel to the first direction and of the straight line part perpendicular to the first direction may be shorter than the total of the lengths of a straight line part parallel to or forming an angle of smaller than 45° with the absorption axis of the one polarizing sheets.

In the liquid crystal display device according to one aspect of the present invention, the ratio of the major axis dimension to the minor axis dimension of the polygon may be 1 or greater and no greater than 3.

In the liquid crystal display device according to one aspect of the present invention, the direction of the minor axis in the planar shape of the light blocking part forms an angle that may be substantially 45° with respect to the absorption axis of one of the first polarizing sheet or the second polarizing sheet.

In the liquid crystal display device according to one aspect of the present invention, the planar shape of the light blocking part and the cross-sectional shape of the low refractive index part cut by a plane parallel to the first surface may be different.

In the liquid crystal display device according to one aspect of the present invention, the light blocking part may be constituted by a plurality of point-like parts.

In the liquid crystal display device according to one aspect of the present invention, the planar shapes of at least half of the plurality of point-like parts may be rhombic, and the other planar shapes may be different from rhombic.

In the liquid crystal display device according to one aspect of the present invention, the angle formed by the light incidence end surface of the light diffusion part and the inclined surface may be 80°±5°.

In the liquid crystal display device according to one aspect of the present invention, the proportion of surface area occupied by the light blocking parts of the overall surface area of the first surface of the base may be 30%±10%.

In the liquid crystal display device according to one aspect of the present invention, the light diffusion part may include a plurality of light diffusion parts. The surface area of the light incidence end surface may be larger than the surface area of the light-exiting end surface in a part of the plurality of light diffusion parts. The surface area of the light incidence end surface may be smaller than the surface of the light-exiting end surface in another part of the plurality of light diffusion parts.

In the liquid crystal display device according to one aspect of the present invention, an anti-reflective structure may be formed on a second surface of the base.

In the liquid crystal display device according to one aspect of the present invention, the anti-reflective structure may include an anti-glare layer.

In the liquid crystal display device according to one aspect of the present invention, the anti-reflective structure may have a structure having unevenness with a period smaller than the wavelengths of visible light.

In the liquid crystal display device according to one aspect of the present invention, the second substrate of the liquid crystal panel may be disposed on the optical control member side. The thickness of the second substrate may be smaller than the thickness of the first substrate.

The liquid crystal display device according to one aspect of the present invention may include an illumination device disposed on the light incidence side of the liquid crystal panel. The illumination device may have a structure that makes the amount of light exiting in a direction perpendicular to the first direction greater than the amount of light exiting from a direction parallel to the first direction when viewed from the normal line direction of the base.

In the liquid crystal display device according to one aspect of the present invention, the illumination device may include a light-guiding sheet and a light source that is provided at an end surface of the light-guiding sheet.

In the liquid crystal display device according to one aspect of the present invention, the structure may be provided on a light-guiding sheet and is a plurality of convex parts having a triangular cross-section when cut by a plane perpendicular to the end surface and also perpendicular to the light-exiting surface of the light-guiding sheet and extending in a direction parallel to the end surface.

In the liquid crystal display device according to one aspect of the present invention, the illumination device may include a prism sheet.

In the liquid crystal display device according to one aspect of the present invention, the structure may be provided on the prism sheet and has, on the surface of the side opposing the liquid crystal panel, a plurality of convex parts having a triangular cross-section when cut by a plane perpendicular to the end surface and also perpendicular to the light-exiting surface of the light-guiding sheet and extending in a direction parallel to the end surface.

In the liquid crystal display device according to one aspect of the present invention, the structure may be provided on the prism sheet and has, on the surface of the side opposing the light-guiding sheet, a plurality of convex parts having a triangular cross-section when cut by a plane perpendicular to the end surface and also perpendicular to the light-exiting surface of the light-guiding sheet and extending in a direction parallel to the end surface.

In the liquid crystal display device according to one aspect of the present invention, the pixel may include at least a first sub-pixel and a second sub-pixel, the voltage applied to the liquid crystal layer of which can be controlled independently.

In the liquid crystal display device according to one aspect of the present invention, the first vertical alignment film and the second vertical alignment film may be optically aligned films.

In the liquid crystal display device according to one aspect of the present invention, the second substrate may include a switching element provided in the pixels. A semiconductor layer constituting the switching element may be constituted by a quaternary semiconductor material including indium, gallium, zinc, and oxygen.

In the liquid crystal display device according to one aspect of the present invention, the liquid crystal panel may include a black matrix, and when viewed from the normal line direction of the liquid crystal panel, the density of light blocking layers provided in a region that overlaps in a planar manner with the black matrix may be higher than the density of the light blocking layer provided in a region not overlapping in a planar manner with the black matrix.

An optical control member according to one aspect of the present invention includes: a base having transparency to light, a light diffusion part provided on a first surface of the base, a light blocking part provided at a position of the first surface that does not overlap with the light diffusion part when viewed from the normal direction of the base, and a low refractive index part having a refractive index lower than the refractive index of the light diffusion part, provided at a position that partially overlaps with the light blocking part when viewed from the normal direction of the base. The light diffusion part may have a light-exiting end surface positioned on the base side, a light incidence end surface positioned on the side opposite from the base side, and an inclined surface positioned between the light-exiting end surface and the light incidence end surface. The planar shape of the light blocking part when seen from the normal line direction of the base forms an angle with respect to one side of the planar shape of the base that may be larger than 0° and smaller than 90°.

A base material according to one aspect of the present invention for manufacturing an optical control member that includes a region in which at least one optical control member is formed. The optical control member has a base having transparency to light, a light diffusion part provided on a first surface of the base, a light blocking part provided at a position of the first surface other than a region in which the light diffusion part is formed, and a low refractive index part having a refractive index lower than the refractive index of the light diffusion part provided at a position that partially overlaps with the light blocking part when viewed from the normal direction of the base. The light diffusion part has a light-exiting end surface positioned on the base side, a light incidence end surface positioned on the side opposite from the base, and an inclined surface positioned between the light-exiting end surface and the light incidence end surface. The planar shape of the light blocking part when seen from the normal line direction of the base, has a straight line part that forms an angle with respect to one side of the planar shape in the forming region that is larger than 0° and smaller than 90°.

In the base material according to the one aspect of the present invention for manufacturing an optical control member, the planar shape of the light blocking part may have a major axis and a minor axis. The direction of the major axis in the planar shape may form an angle 45°±15° with respect to an edge of the base material for manufacturing an optical control member.

Effect of the Invention

According to one aspect of the present invention, it is possible to provide a liquid crystal display device with a small viewing angle dependency, without adopting a complicated circuit constitution. According to one aspect of the present invention, it is possible to provide an optical control member used for reducing the viewing angle dependency of a liquid crystal display device. According to one aspect of the present invention, it is possible to provide a base material for manufacturing an optical control member used preferably when manufacturing the above-noted optical control member.

BRIEF DESCRIPTIONS OF THE DRAWINGS

Figure 19:
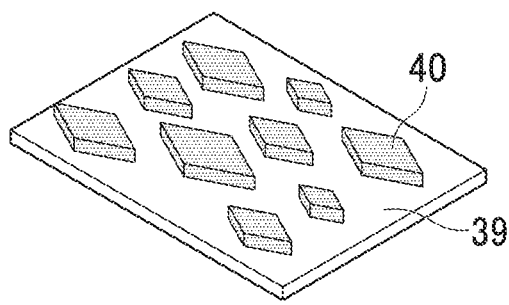
Figure 20:
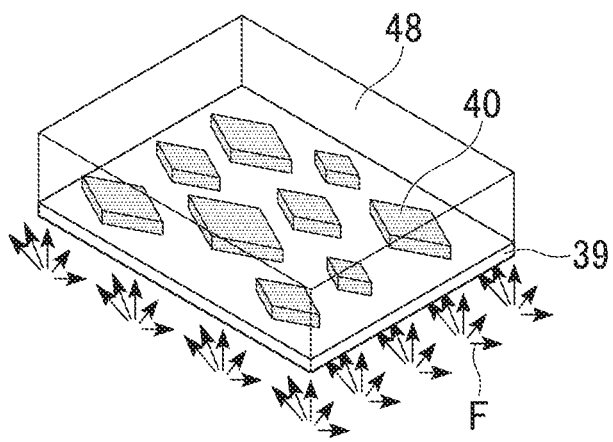
Figure 21:
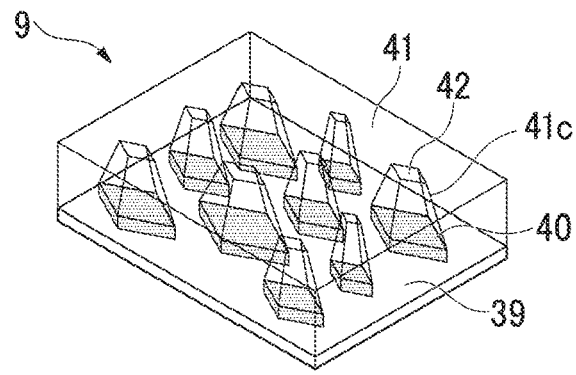
Figure 22:
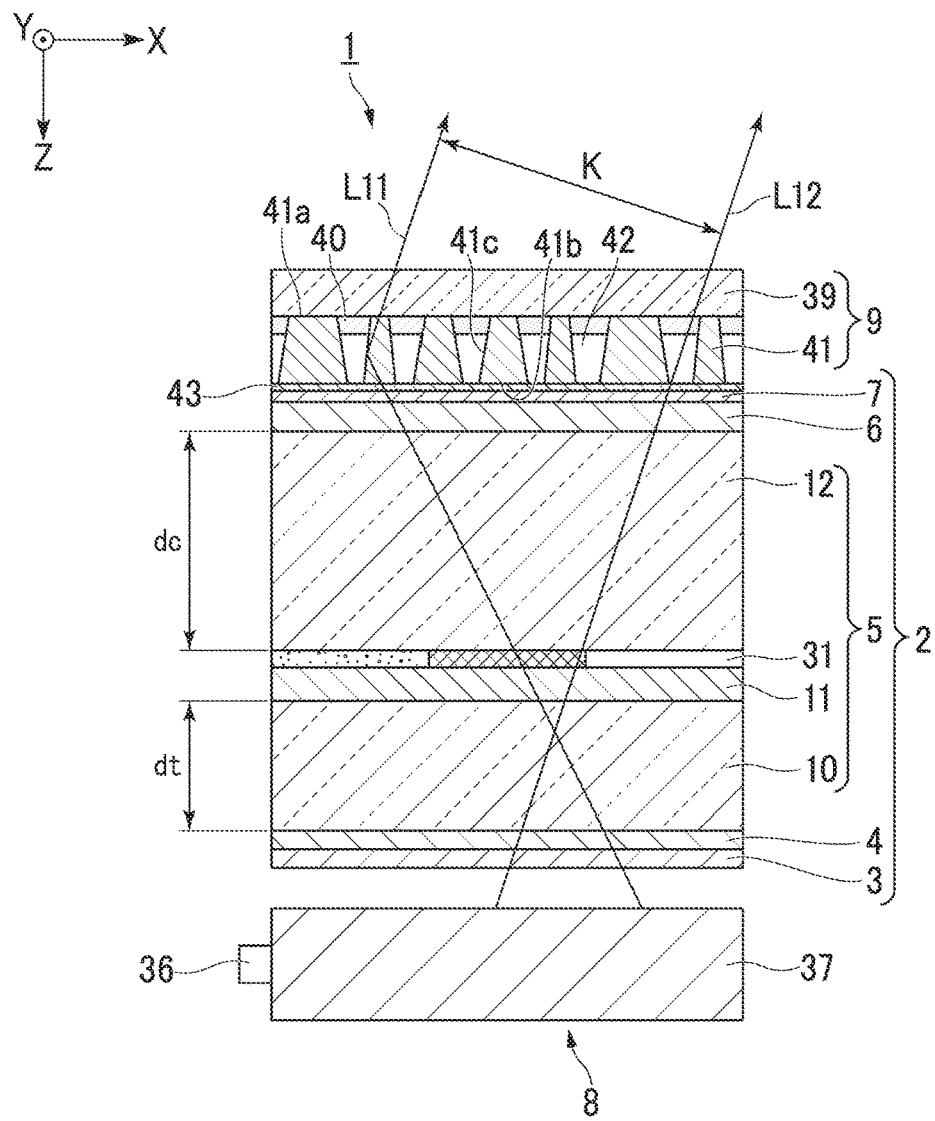
Figure 23:
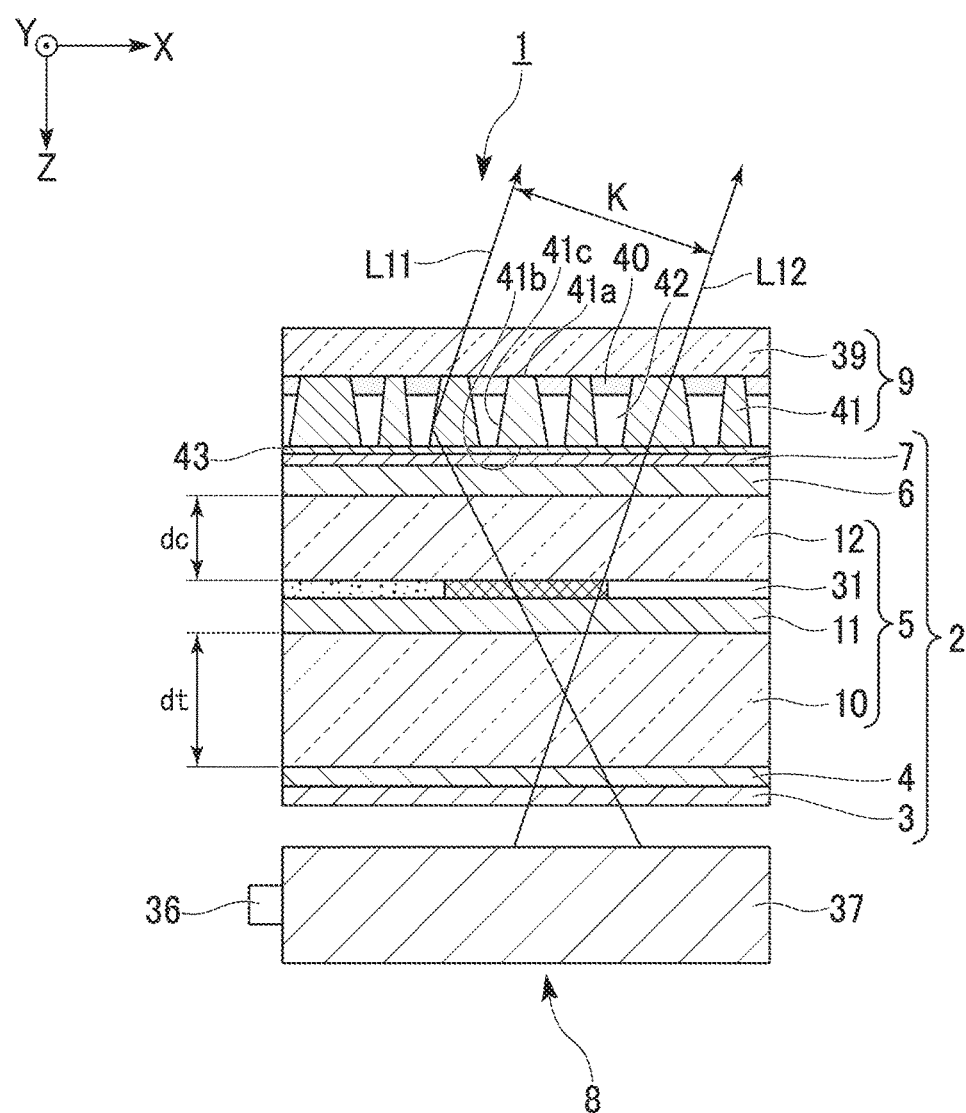
Figure 24:
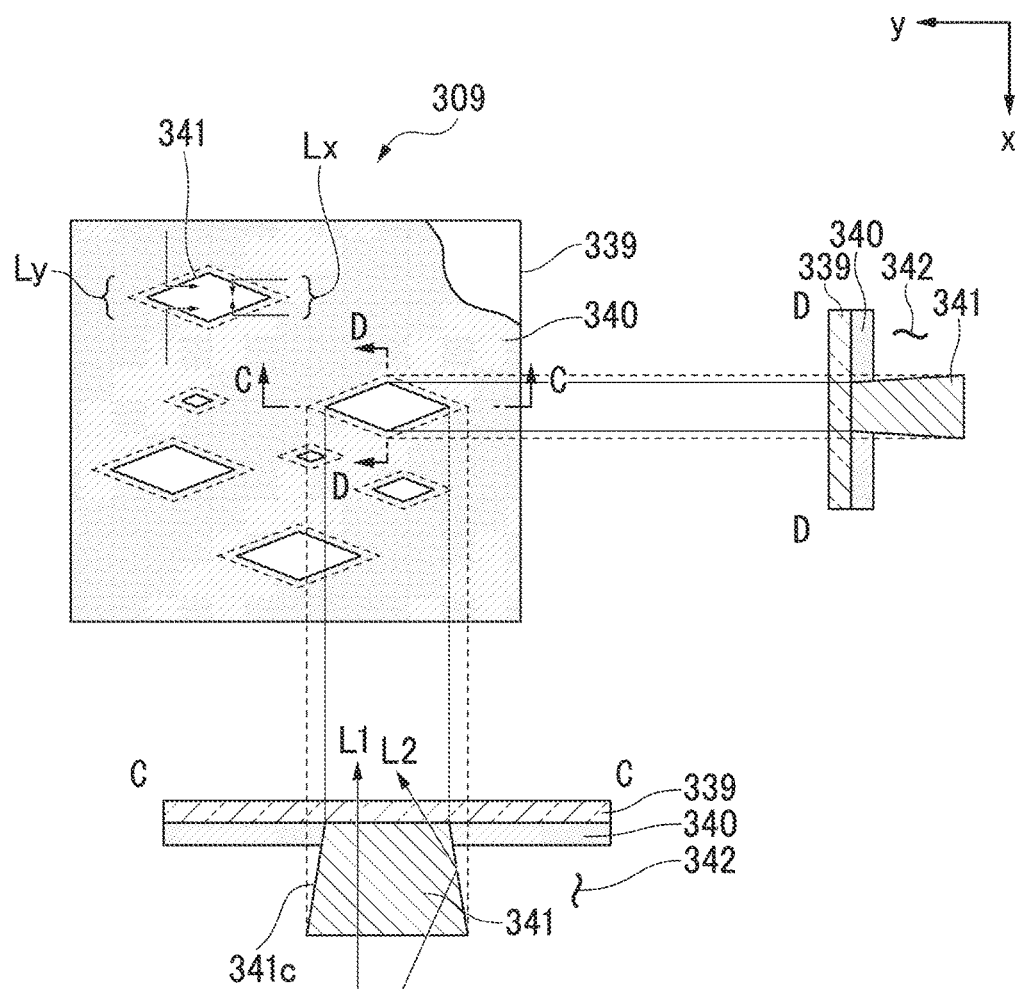
Figure 25:
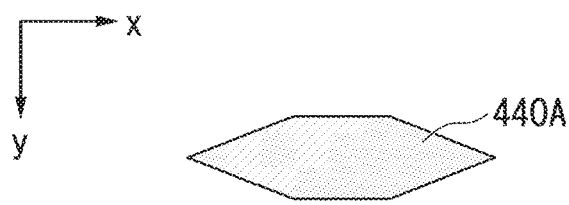
Figure 26:
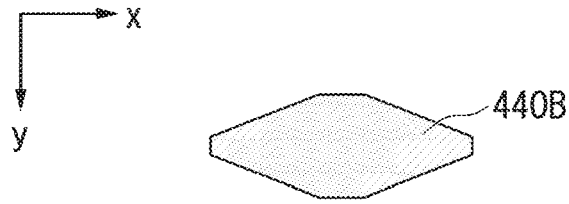
Figure 27:
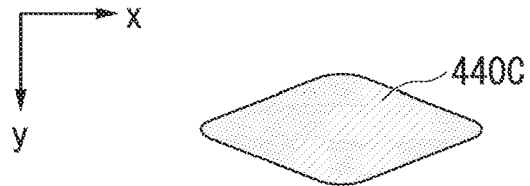
Figure 28:
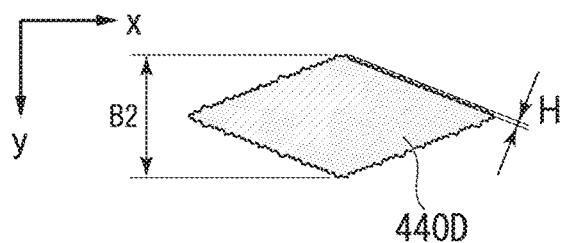
Figure 29:
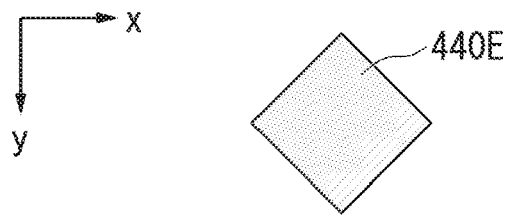
Figure 30:
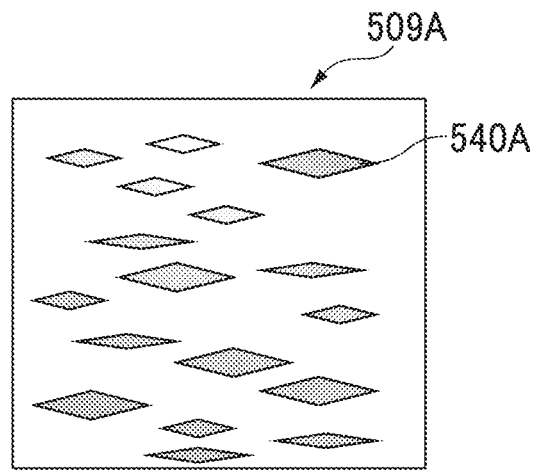
Figure 31:
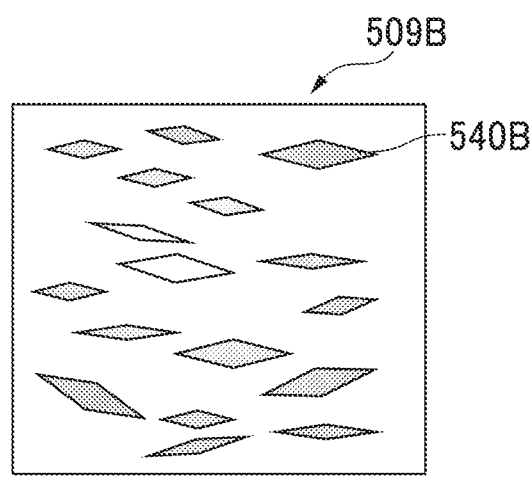
Figure 32:
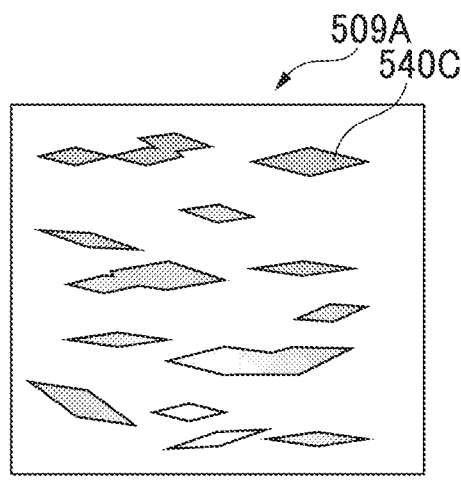
Figure 33:
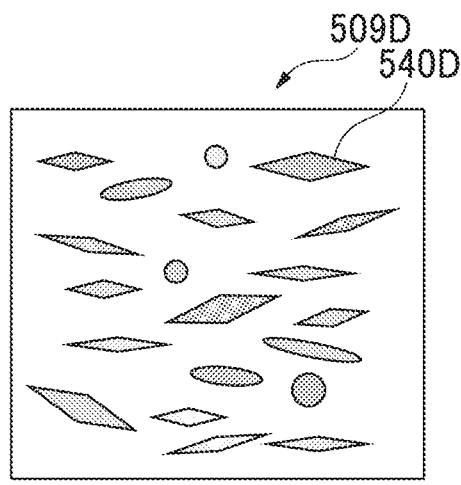
Figure 34:
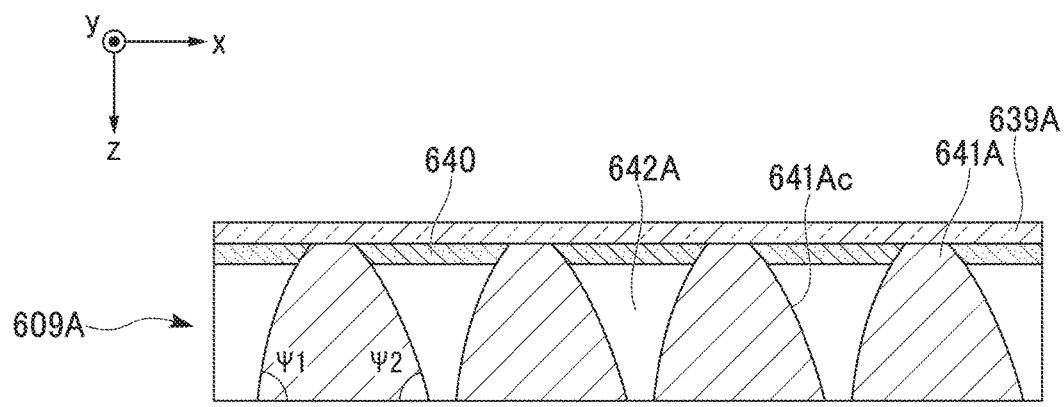
Figure 35:
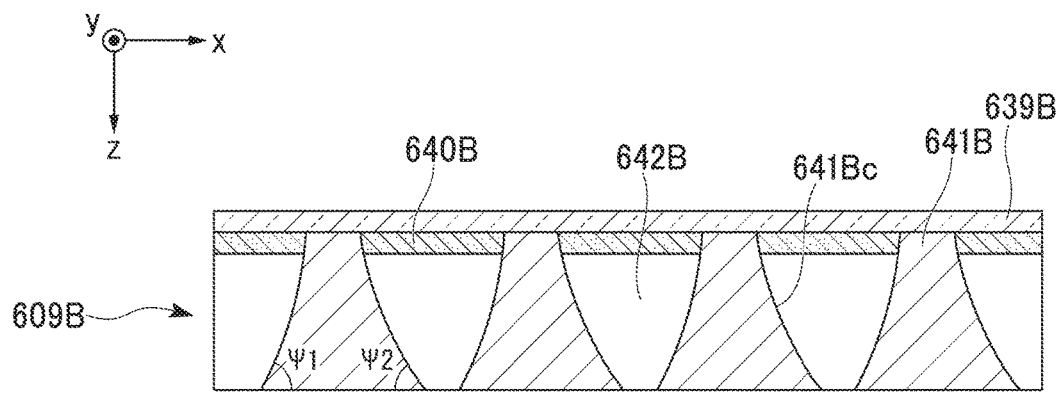
Figure 36:
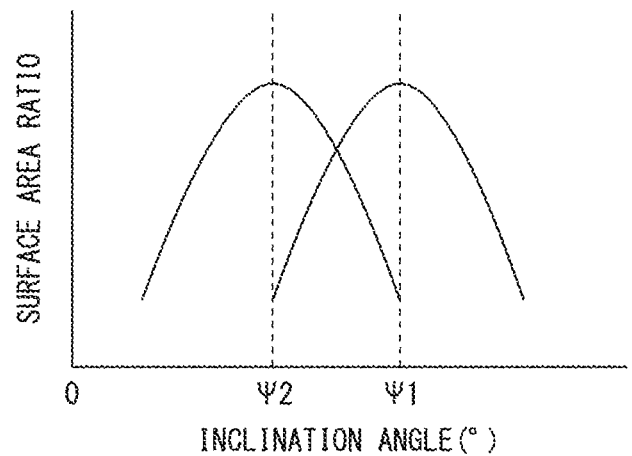
Figure 37:
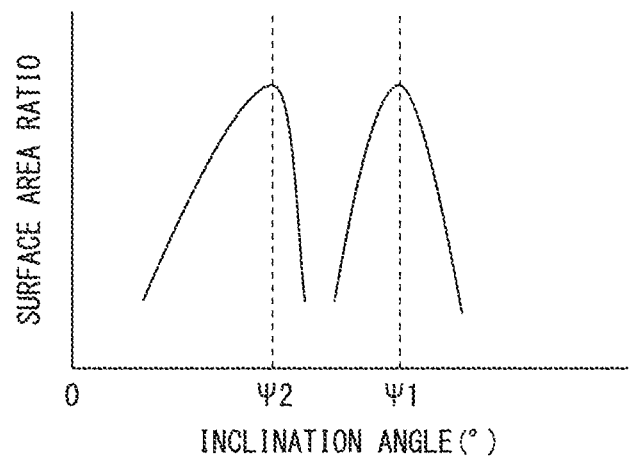
Figure 38:
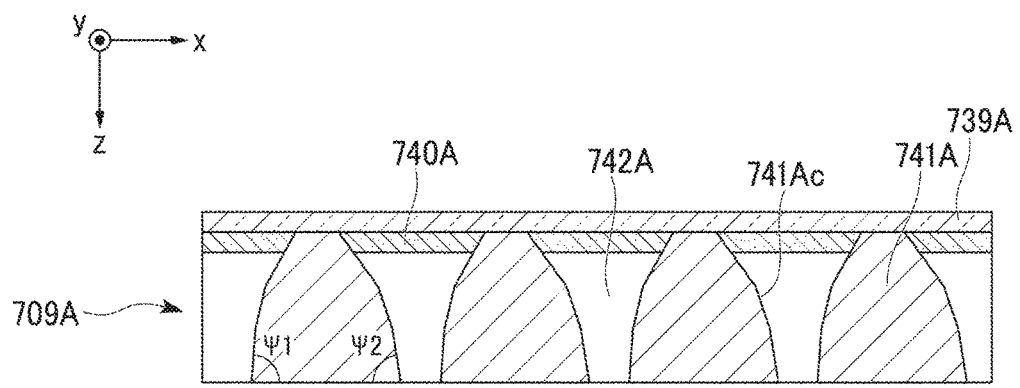
Figure 39:
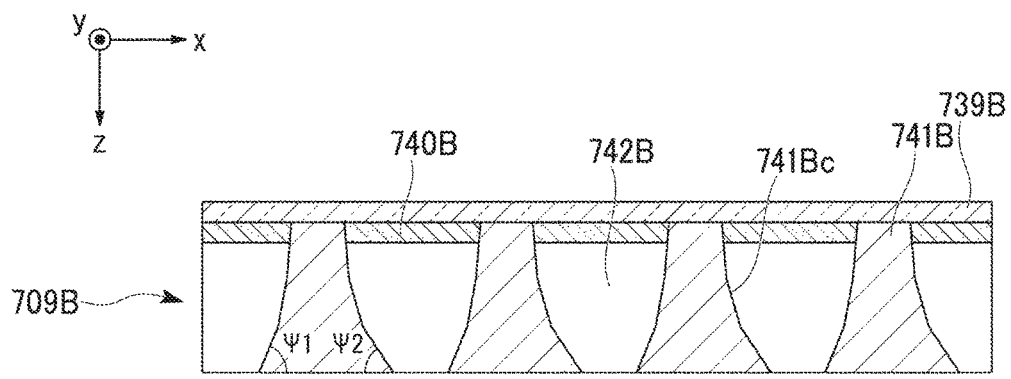
Figure 40:
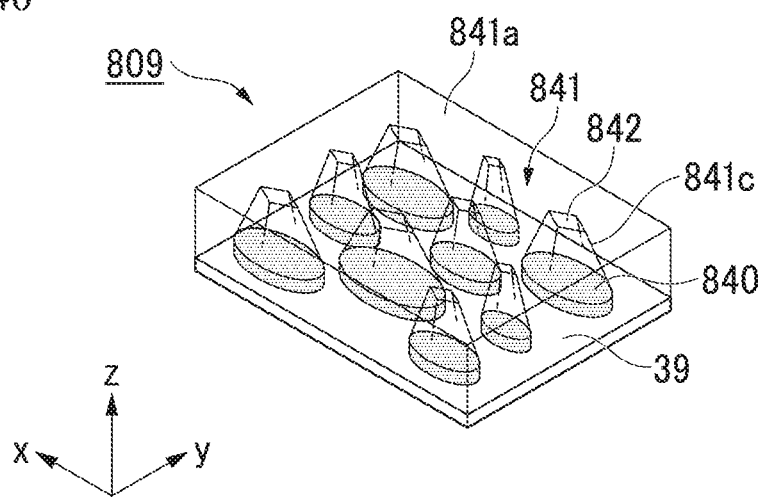
Figure 41:
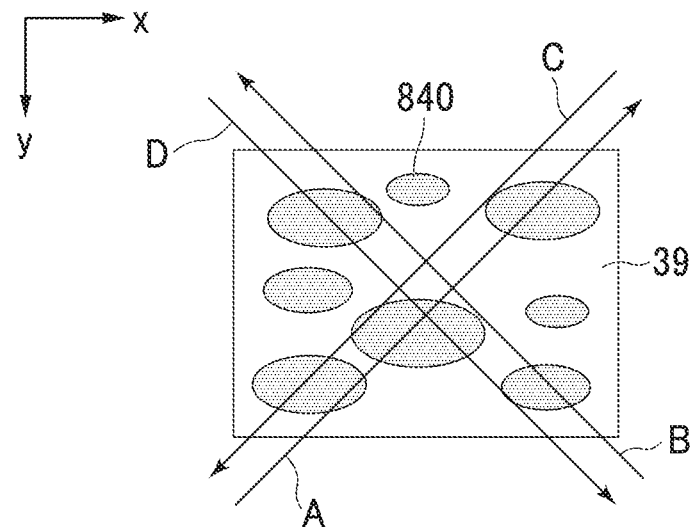
Figure 42:
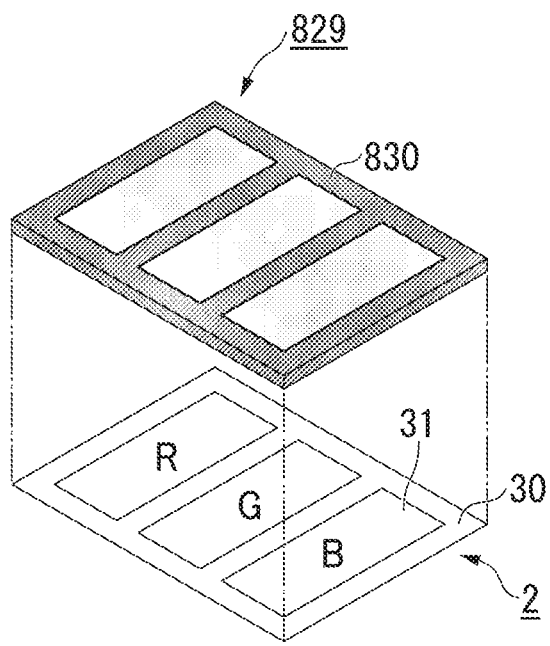
Figure 43:
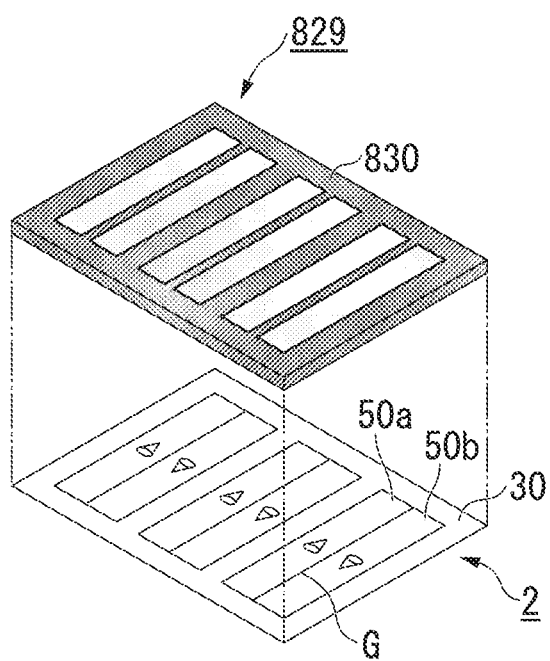
Figure 44:
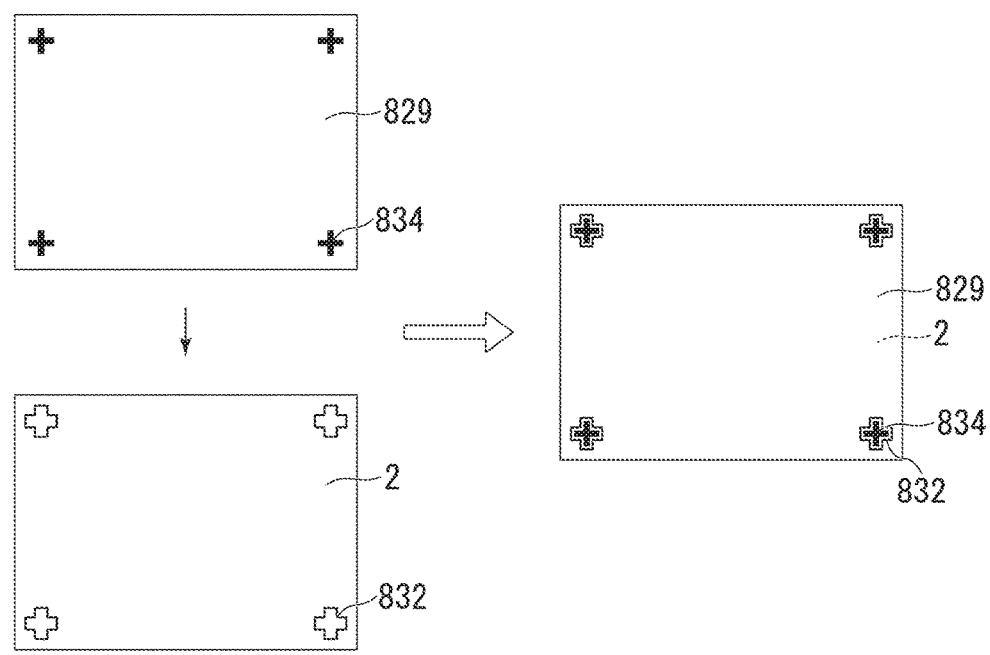
Figure 45:
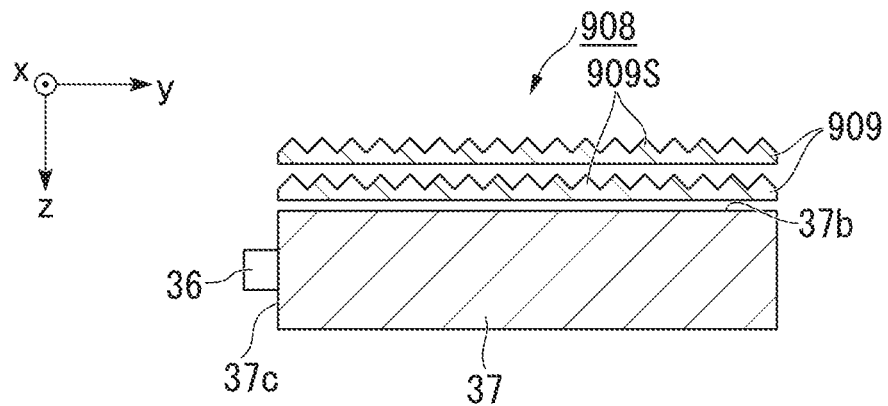
Figure 46:
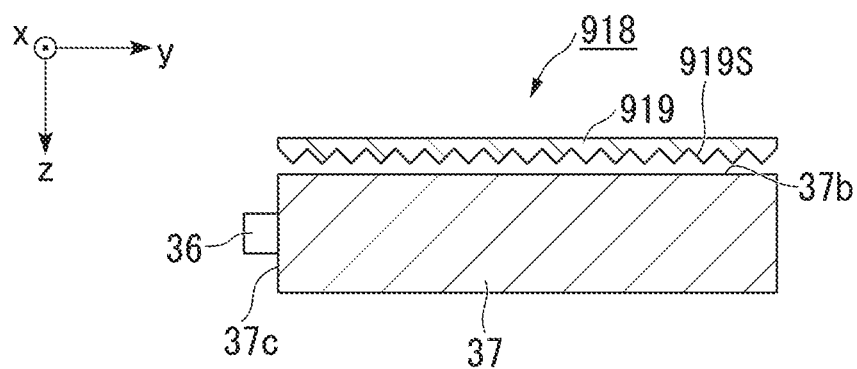
Figure 47:
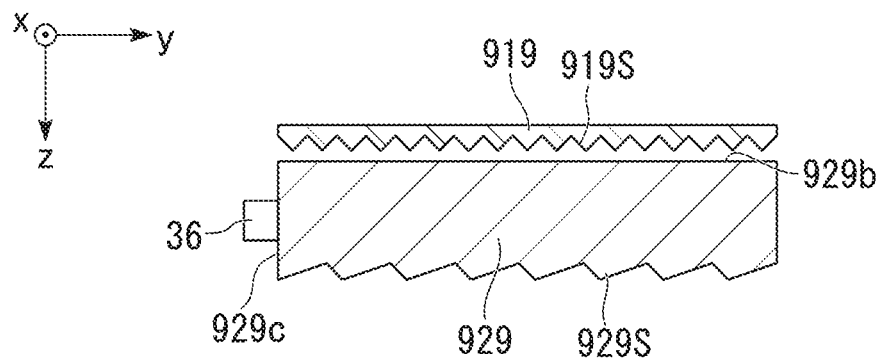
Figure 48:
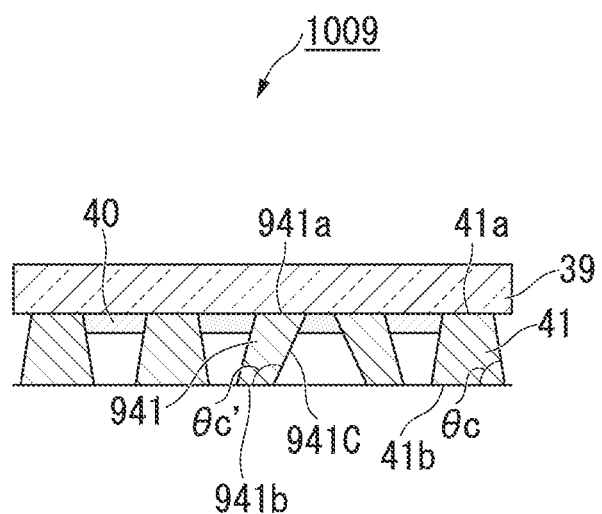
Figure 49:
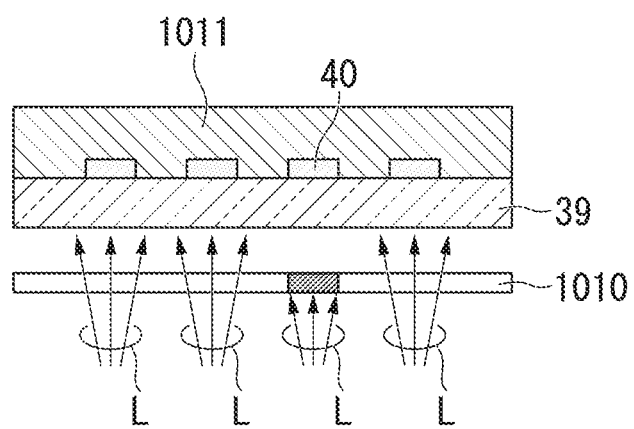
Figure 50:
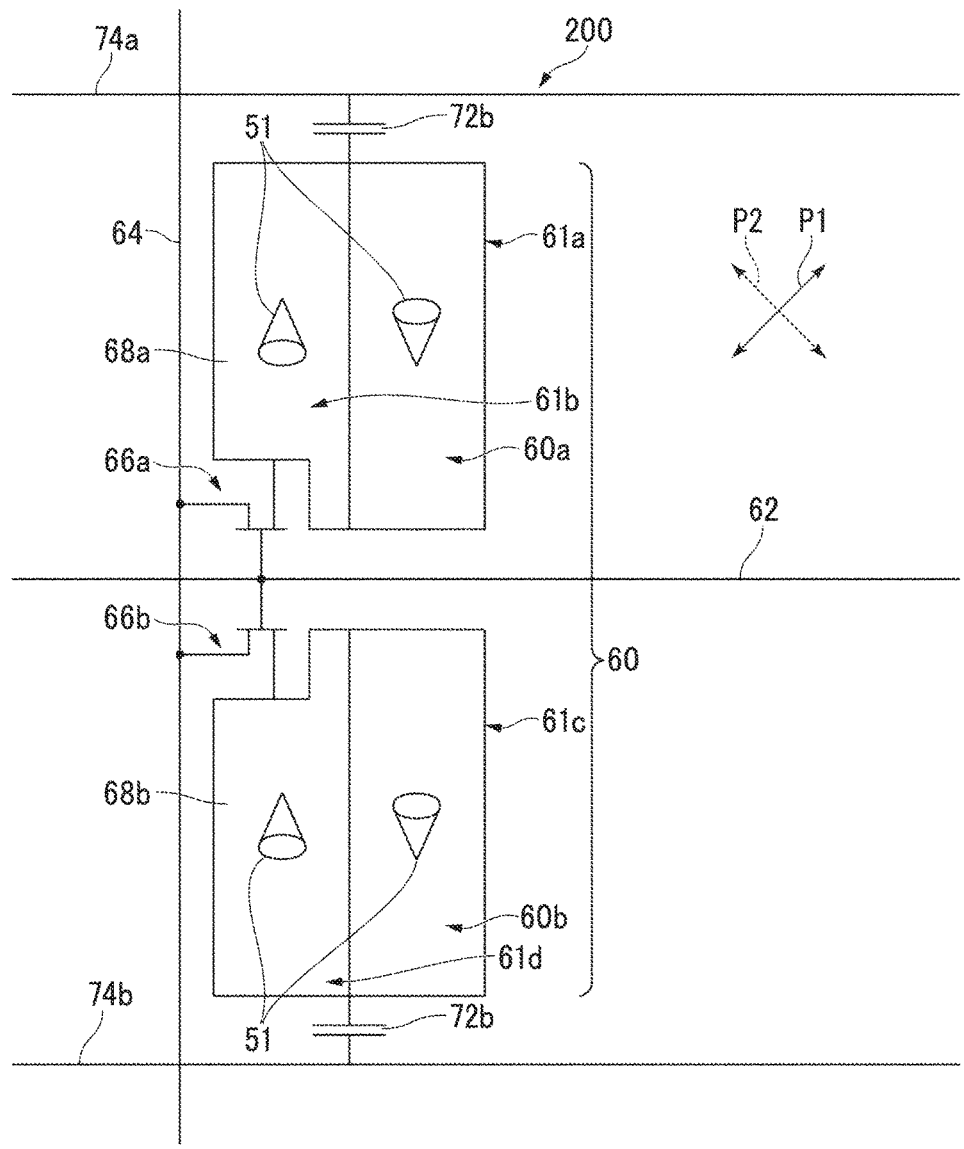
Figure 51:
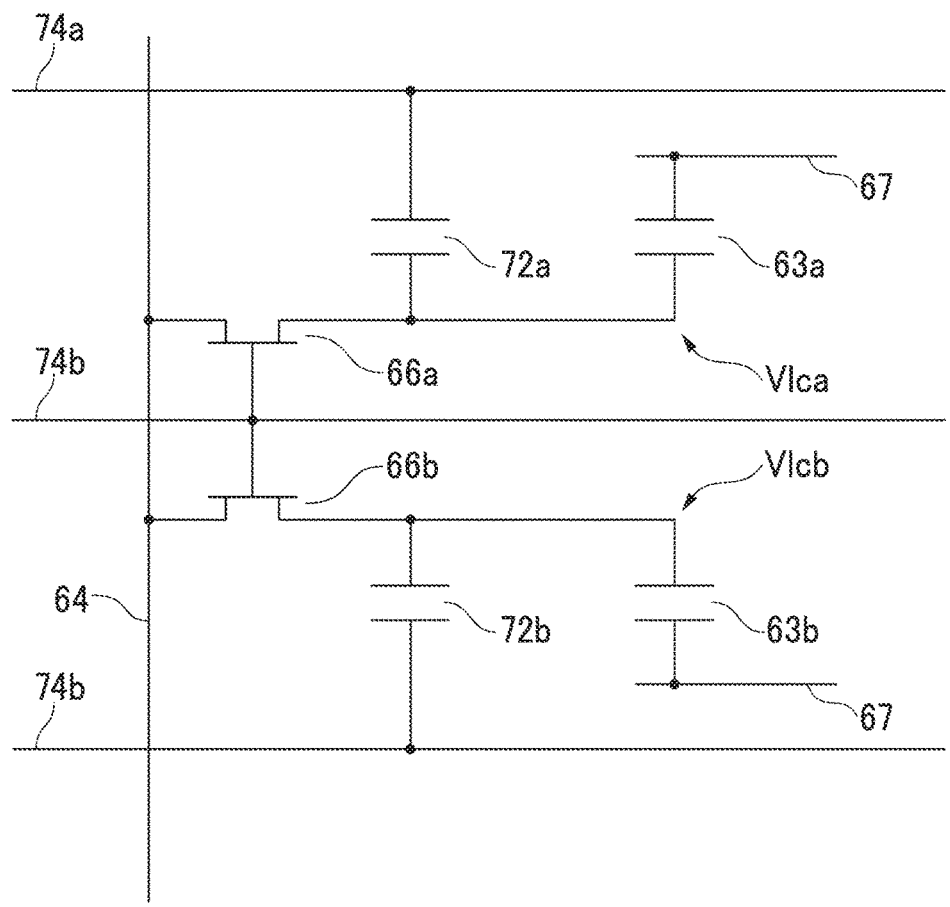
Figure 52:
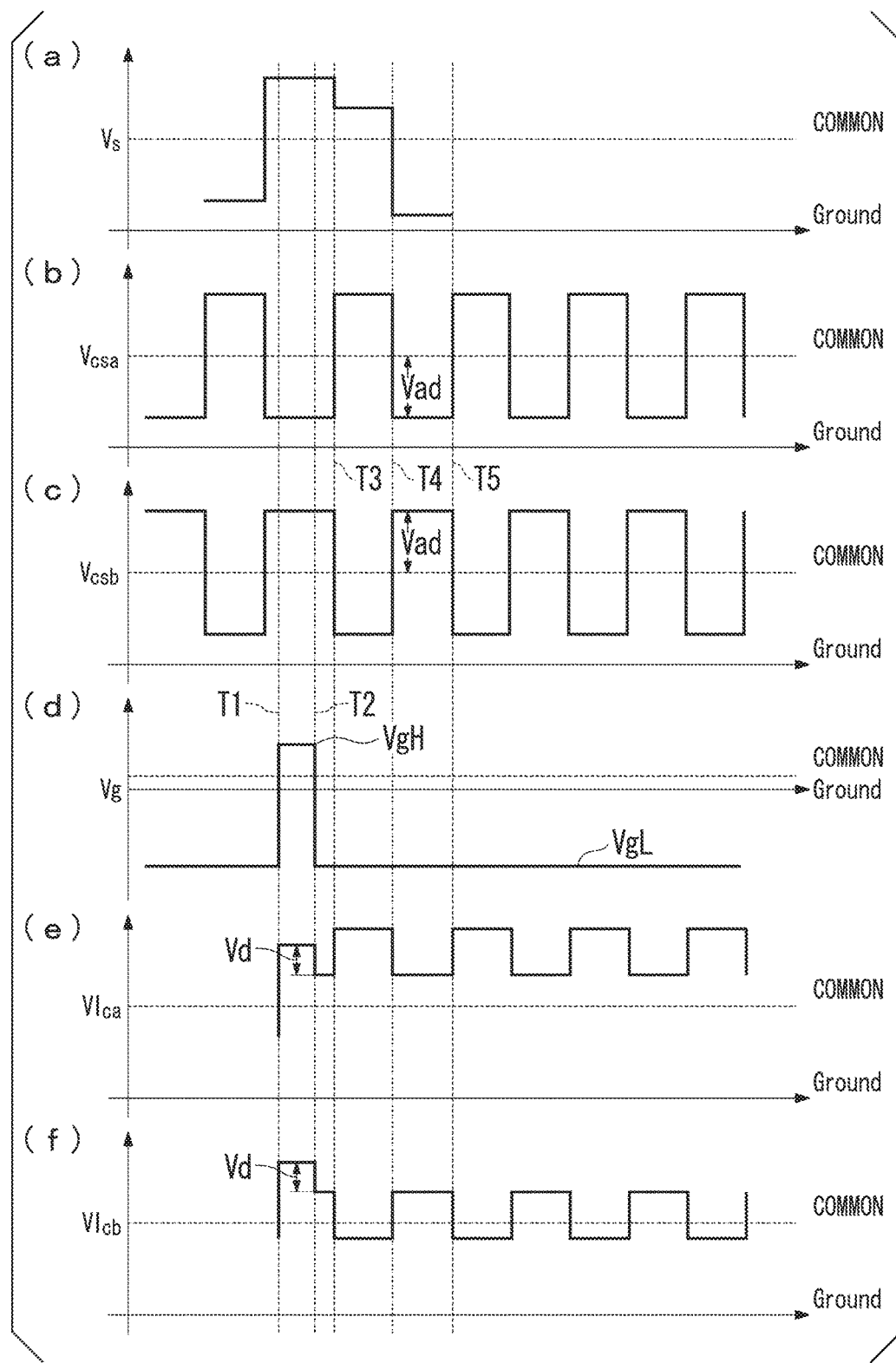
Figure 53:
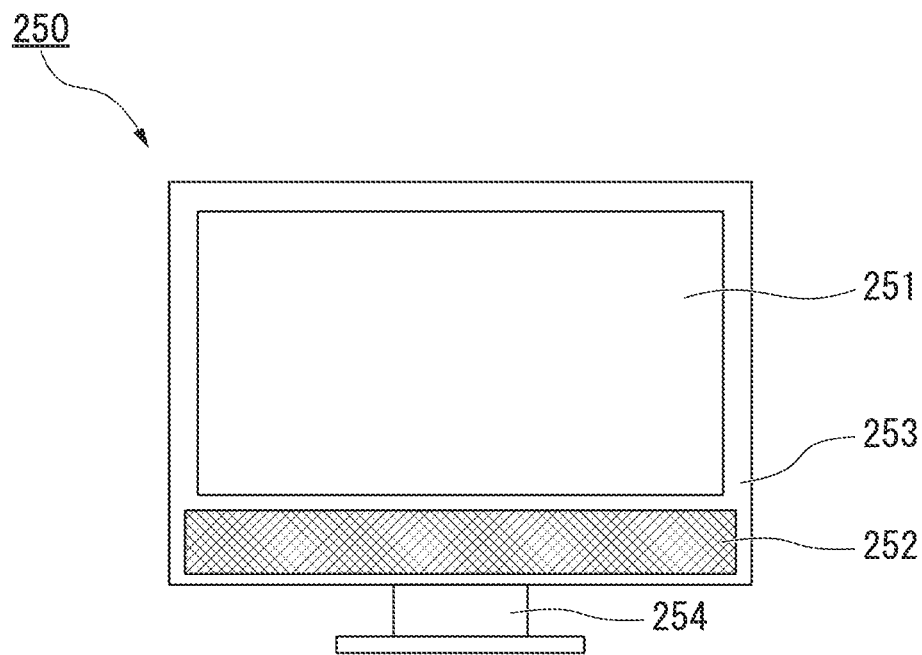
Figure 54:
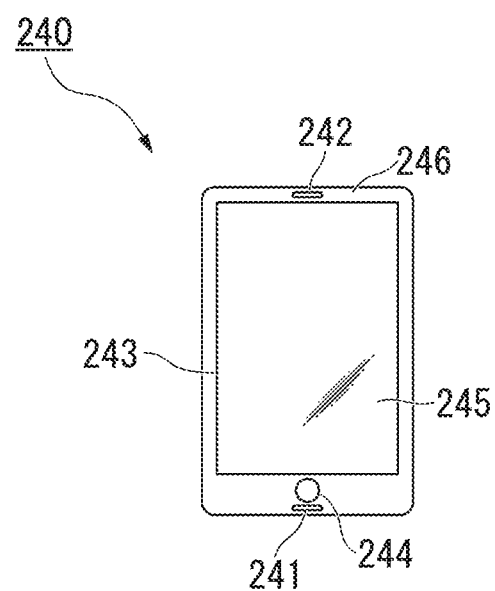
Figure 55:
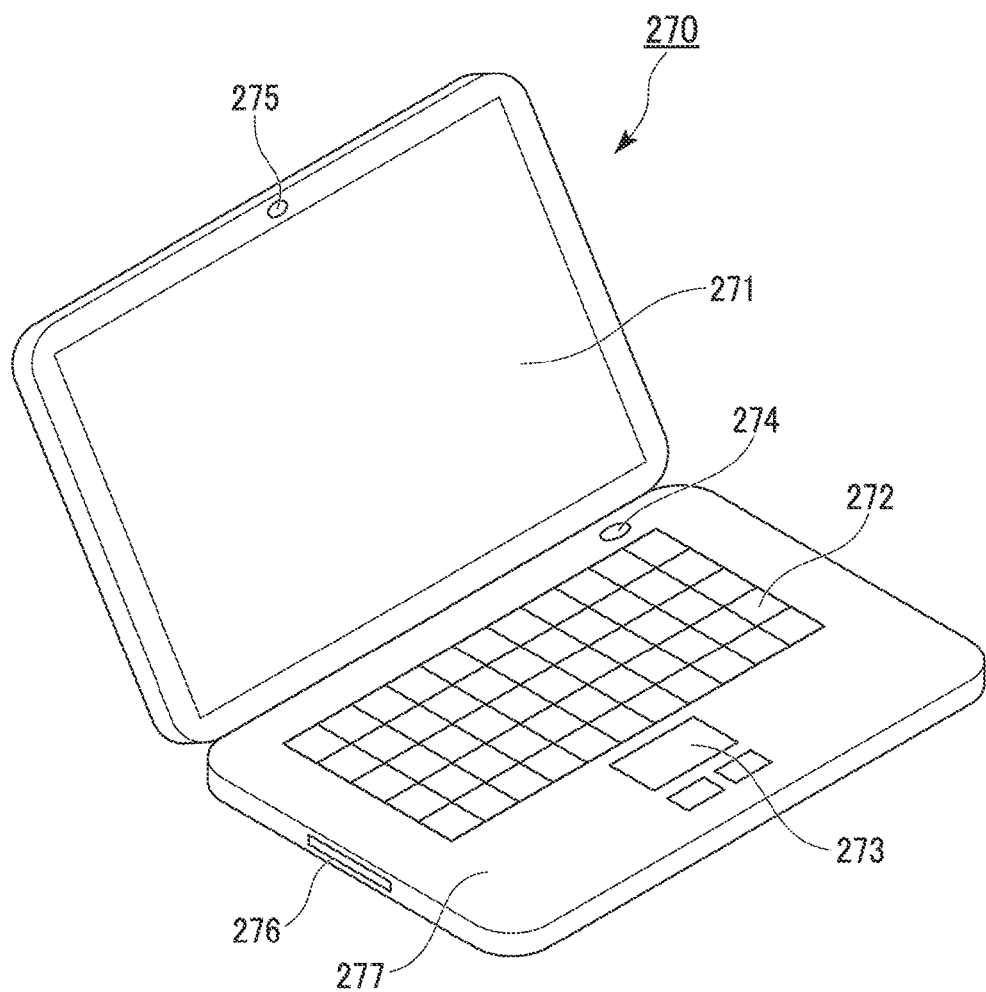
Figure 56A:
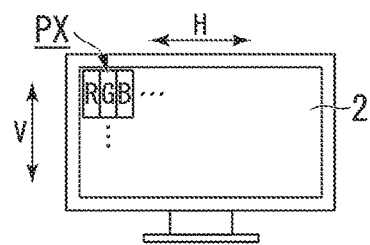
Figure 56B:
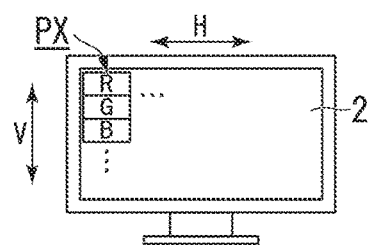
Figure 56C:
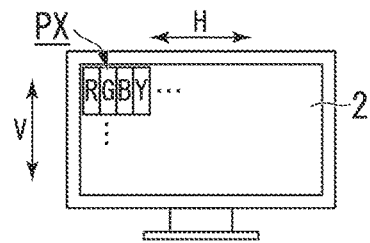
Figure 56D:
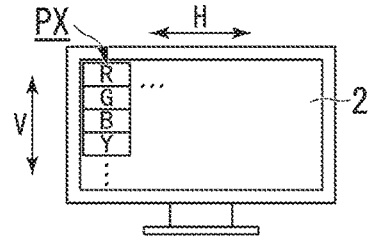
Figure 56E:
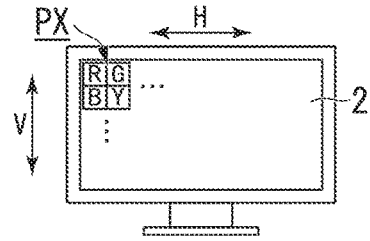
Figure 57:
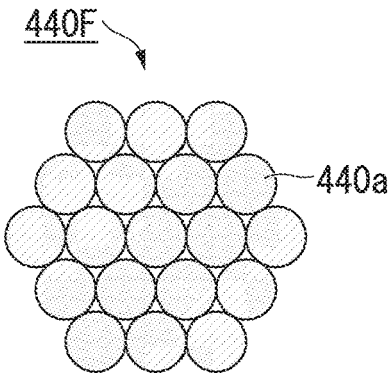
Figure 58:
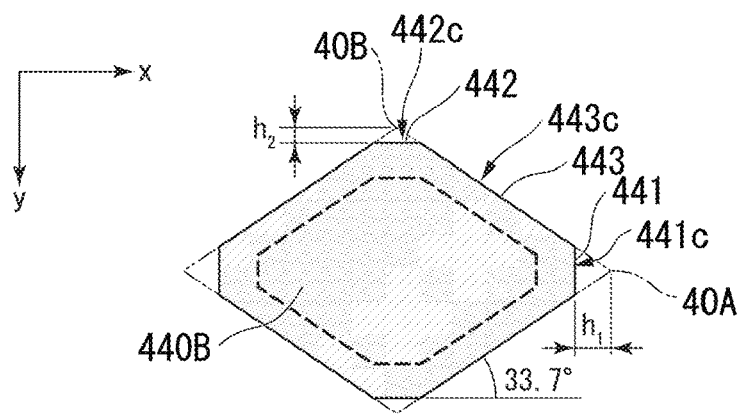
Figure 59:
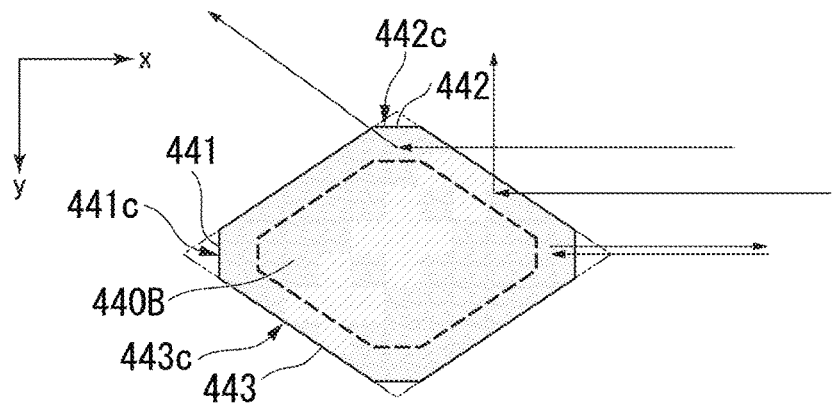
Figure 60A:
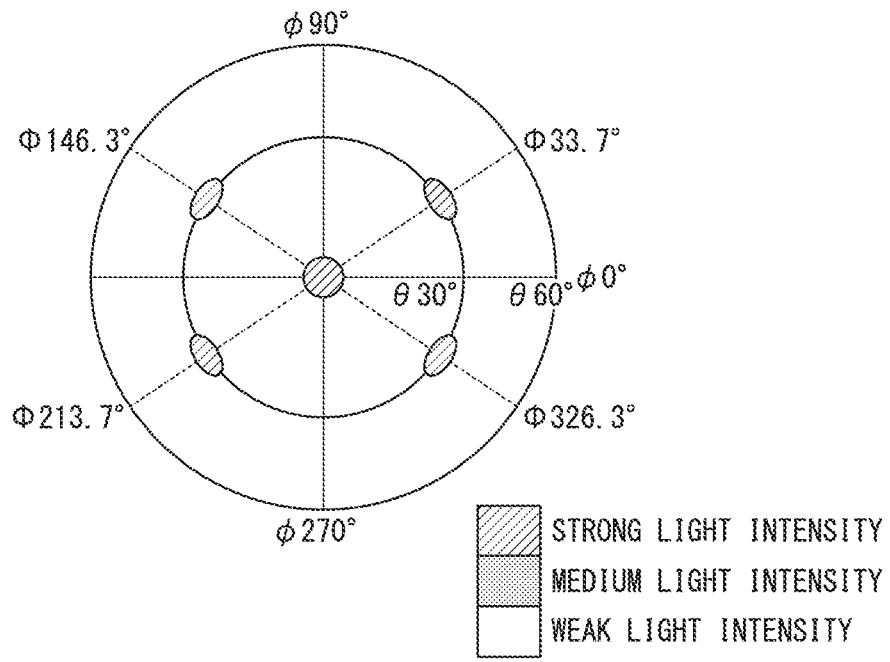
Figure 60B:
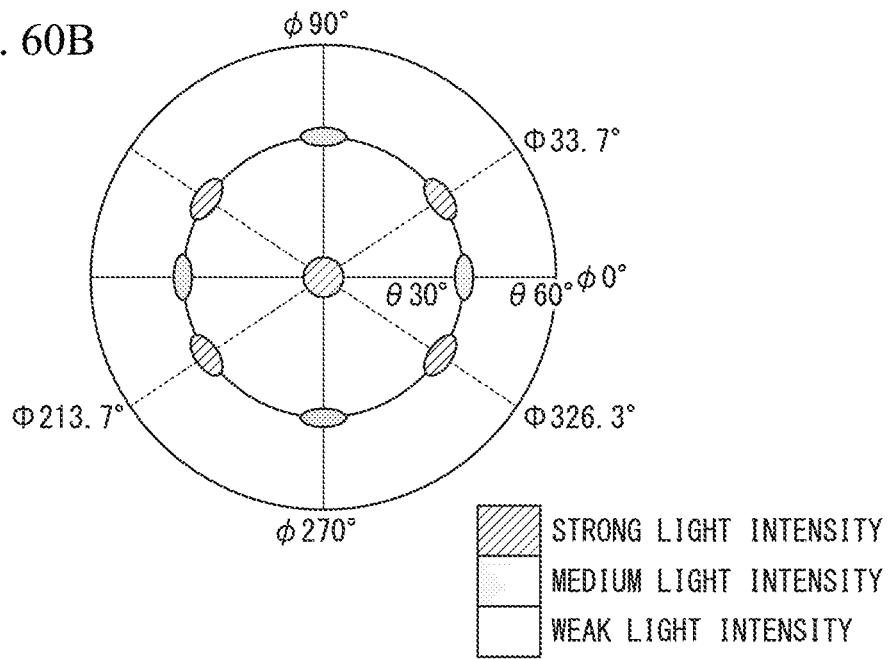
Figure 61:
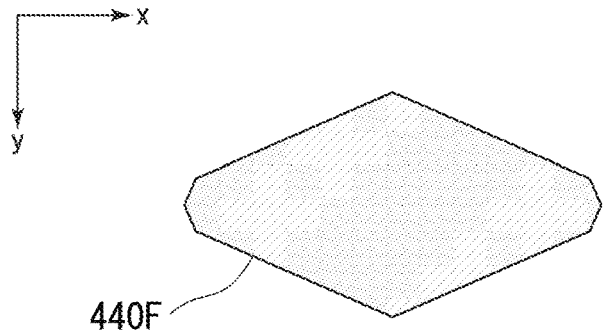
Figure 62:
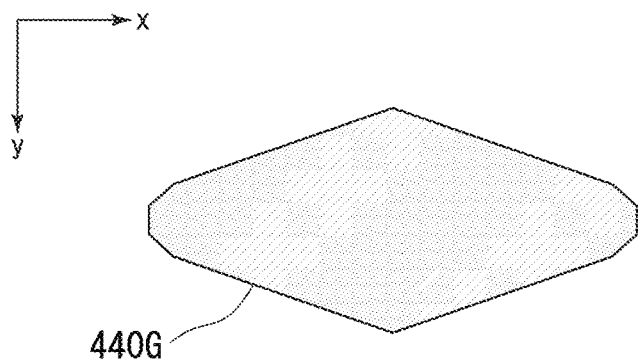
Figure 63:
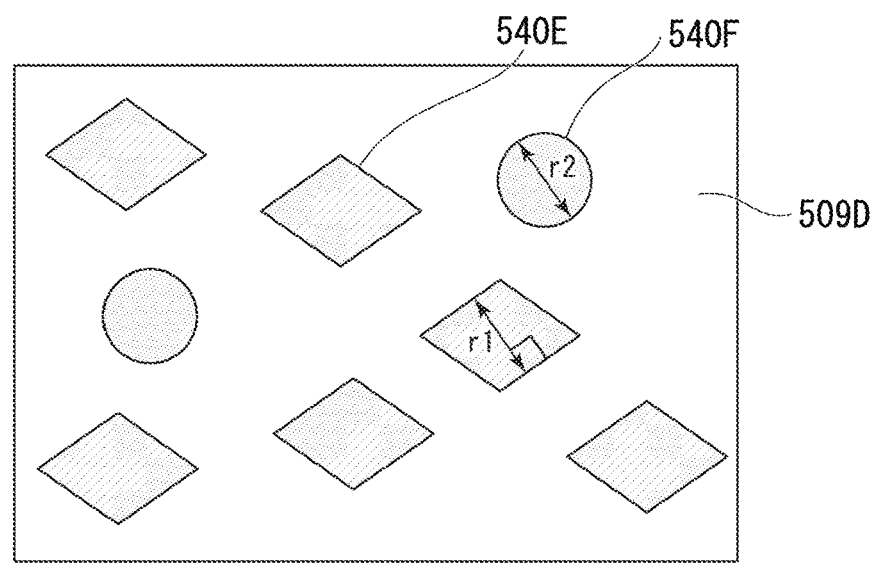
Figure 64:
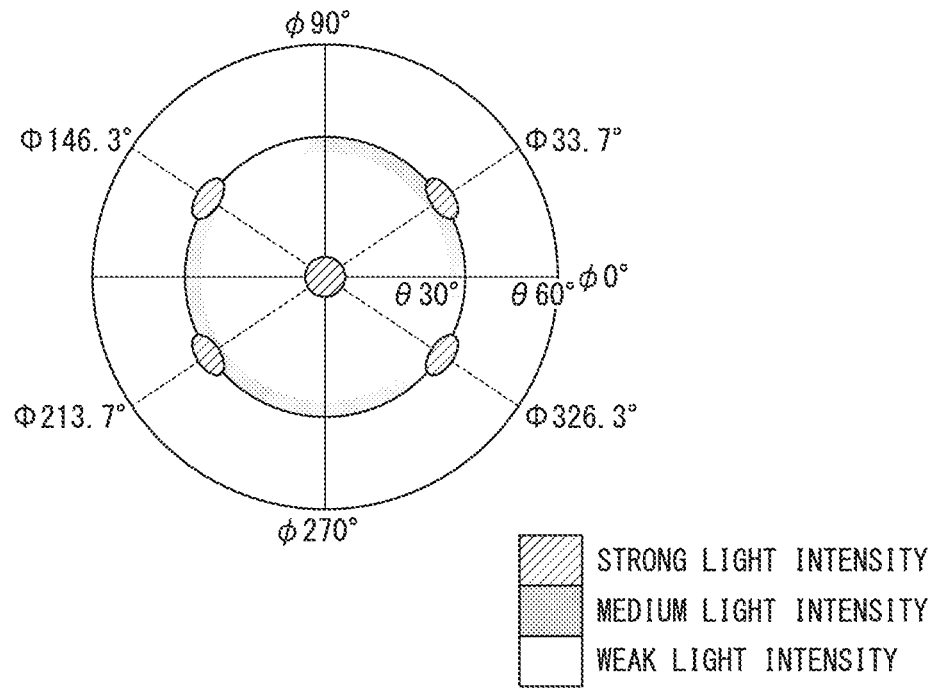
Figure 65:
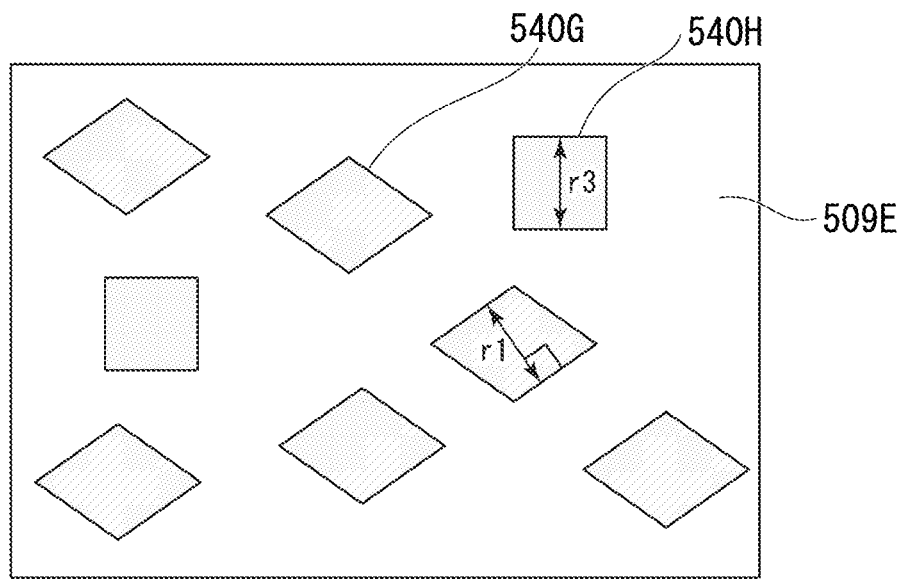
Figure 66:
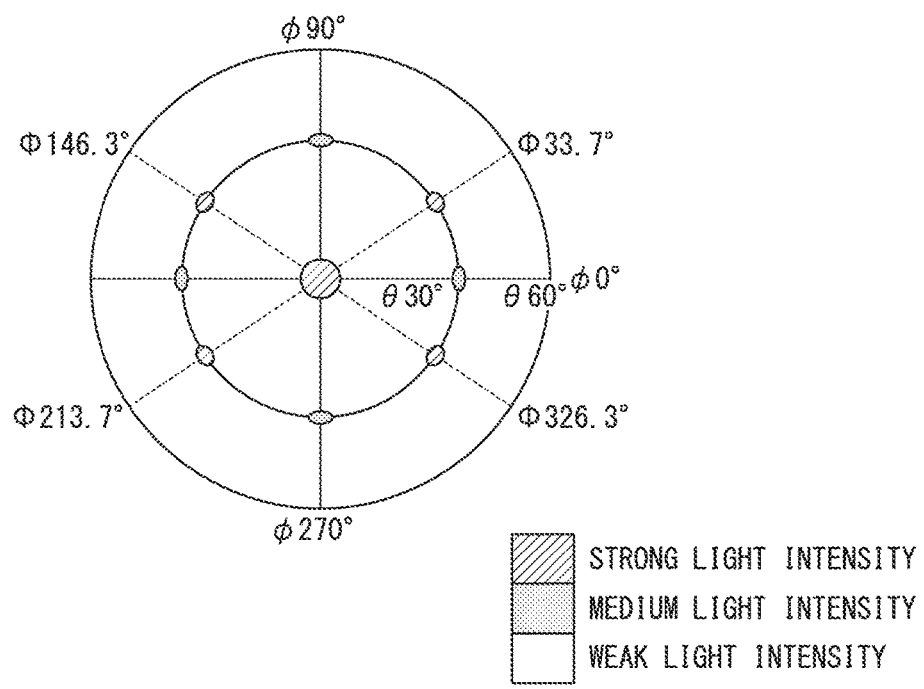

FIG. 19 is the continuation of the manufacturing process.
FIG. 20 is the continuation of the manufacturing process.
FIG. 21 is the continuation of the manufacturing process.
FIG. 22 is a cross-sectional view of a liquid crystal panel of a comparison example.
FIG. 23 is a cross-sectional view of a liquid crystal panel of the present embodiment.
FIG. 24 is a plan view of and cross-sectional views of an optical control member of a second embodiment seen from two directions.
FIG. 25 is a plan view of a light blocking layer of a third embodiment of the present invention.
FIG. 26 is a plan view shown a variation example of the light blocking layer.
FIG. 27 is a plan view shown a variation example of the light blocking layer.
FIG. 28 is a plan view shown a variation example of the light blocking layer.
FIG. 29 is a plan view shown a variation example of the light blocking layer.
FIG. 30 is a plan view of an optical control member of a fourth embodiment of the present invention.
FIG. 31 is a plan view of a variation example of the optical control member.
FIG. 32 is a plan view of a variation example of the optical control member.
FIG. 33 is a plan view of a variation example of the optical control member.
FIG. 34 is a cross-sectional view of an optical control member of a fifth embodiment of the present invention.
FIG. 35 is a cross-sectional view of another example of an optical control member.
FIG. 36 is a drawing for describing the relationship between the inclination angle and the surface area ratio of the reflecting surface of the light diffusion part.
FIG. 37 is a drawing for describing the relationship between the inclination angle and the surface area ratio of the reflecting surface of the light diffusion part.
FIG. 38 is a cross-sectional view of an optical control member of a sixth embodiment of the present invention.
FIG. 39 is a cross-sectional view of another example of an optical control member.
FIG. 40 is an oblique view of an optical control member of a seventh embodiment of the present invention.
FIG. 41 is a drawing for describing the method of manufacturing an optical control member of the seventh embodiment.
FIG. 42 is an oblique view of an optical control member of an eighth embodiment of the present invention.
FIG. 43 is an oblique view showing another example of an optical control member.
FIG. 44 is a drawing for describing the alignment method for an optical control member.
FIG. 45 is a cross-sectional view of an illumination device of a ninth embodiment of the present invention.
FIG. 46 is a cross-sectional view showing another example of an illumination device.
FIG. 47 is a cross-sectional view showing another example of an illumination device.
FIG. 48 is a cross-sectional view of an optical control member of a tenth embodiment of the present invention.
FIG. 49 is a drawing for describing a method of manufacturing an optical control member of the tenth embodiment.
FIG. 50 is a schematic representation of the electrical constitution of a liquid crystal display device of an eleventh embodiment of the present invention.
FIG. 51 is an equivalent circuit diagram of one pixel of a liquid crystal display device of the eleventh embodiment.
FIG. 52 is a timing diagram of the various voltages when driving the liquid crystal display device of the eleventh embodiment.
FIG. 53 is an outer view of a flat-panel TV, which is one application example of a liquid crystal display device of the first to eleventh embodiments.
FIG. 54 is an outer view of a smartphone, which is one application example of a liquid crystal display device of the first to eleventh embodiments.
FIG. 55 is an outer view of a laptop personal computer, which is one application example of a liquid crystal display device of the first to eleventh embodiments.
FIG. 56A shows a first example of color filter placement of a liquid crystal display device.
FIG. 56B shows a second example of color filter placement of a liquid crystal display device.
FIG. 56C shows a third example of color filter placement of a liquid crystal display device.
FIG. 56D shows a fourth example of color filter placement of a liquid crystal display device.
FIG. 56E shows a fifth example of color filter placement of a liquid crystal display device.
FIG. 57 is a plan view showing a variation example of an optical control member.
FIG. 58 is a plan view showing the light blocking layer of FIG. 26 in more detail.
FIG. 59 is a drawing showing reflection of light striking the light blocking layer of FIG. 58.
FIG. 60A shows the transmitted light distribution of parallel light incident to the optical control member, for the case in which the light blocking layer of the first embodiment is a rhombus.
FIG. 60B shows the transmitted light distribution of parallel light incident to the optical control member, for the case in which the light blocking layer shown in FIG. 58 is octagonally shaped.
FIG. 61 is a plan view of the light blocking layer of another form according to the third embodiment.
FIG. 62 is a plan view of the light blocking layer of another form according to the third embodiment.
FIG. 63 is a plan view of an optical control member with a mixture of light blocking layers that are rhombic and circular in planar shape.
FIG. 64 is the transmitted light distribution of parallel light incident to the optical control member of FIG. 63.
FIG. 65 is a plan view of an optical control member with a mixture of light blocking layers that are rhombic and square in planar shape.
FIG. 66 is the transmitted light distribution of parallel light incident to the optical control member of FIG. 65.

EMBODIMENTS FOR CARRYING OUT THE INVENTION

First Embodiment

The first embodiment of the present invention will be described below, with references made to FIG. 1 to FIG. 23.
The present embodiment will be described for the example of a liquid crystal display device that accommodates a display of super Hi-Vision (7680 pixels×4320 pixels) video and has a transmission-type liquid crystal panel.

In all of the drawings noted below, to make each of the constituent elements easy to see, the dimensional scale has been changed, depending upon the constituent element in some cases.

Figure 1:
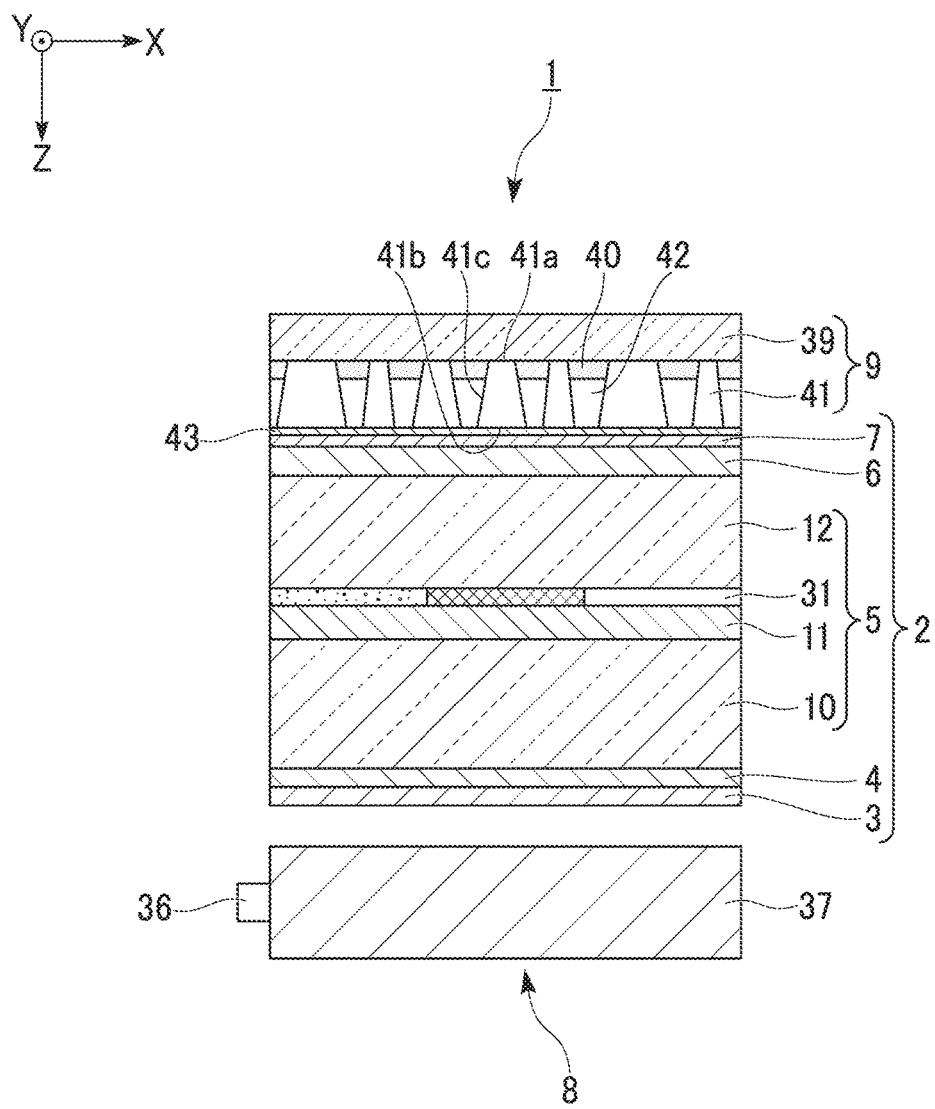
FIG. 1 shows a liquid crystal display device of a first embodiment of the present invention.

FIG. 1 is a cross-sectional view of a liquid crystal display device of the present embodiment.

As shown in FIG. 1, a liquid crystal display device 1 of the present embodiment has a liquid crystal panel 2, a backlight 8, and an optical control member 9. The liquid crystal panel 2 has a first polarizing sheet 3 a first phase difference film 4, a liquid crystal cell 5, a second phase difference film 6, and a second polarizing sheet 7. In FIG. 1, the liquid crystal cell 5 is schematically represented, and the detailed construction thereof will be described later.

The backlight 8 of the present embodiment corresponds to the illumination device recited in the claims.

An observer views the display screen of the liquid crystal display device 1 through the optical control member 9. In the description to follow, the side on which the optical control member 9 is disposed will be called the viewing side, and the side on which the backlight 8 is disposed will be called the reverse side. Also, in the description to follow, the x axis is defined as being the horizontal direction on the screen of the liquid crystal display device 1, the y axis is defined as the vertical direction on the screen of the liquid crystal display device 1, and the z axis is defined as the thickness direction of the liquid crystal display device 1. Additionally, the horizontal axis on the screen corresponds to the left-right direction when an observer views the liquid crystal display device 1 from straight on. The direction perpendicular to the screen corresponds to the up-down directions when an observer views the liquid crystal display device 1 from straight on.

In the liquid crystal display device 1 of the present embodiment, light that has exited from the backlight 8 is modulated by the liquid crystal panel 2 and the modulated light displays prescribed images, characters, and the like. When light that has exited from the liquid crystal panel 2 passes through the optical control member 9, the light distribution of the exiting light is broader as it exits from the optical control member 9 than the light incident to the optical control member 9.

The specific constitution of the liquid crystal panel 2 will now be described.

In this case, the description will take an active matrix type transmission-type liquid crystal panel as an example. However, the liquid crystal panel to which the present embodiment can be applied is not restricted to being an active matrix type transmission-type liquid crystal panel. The liquid crystal panel 2 to which the present embodiment can be applied may be, for example, a semi-transmission type (for both transmission and reflection) liquid crystal panel. Additionally, it may be a simple matrix type liquid crystal panel in which each pixel does not have a switching thin-film transistor. In the following thin-film transistor will be abbreviated TFT.

Figure 2:
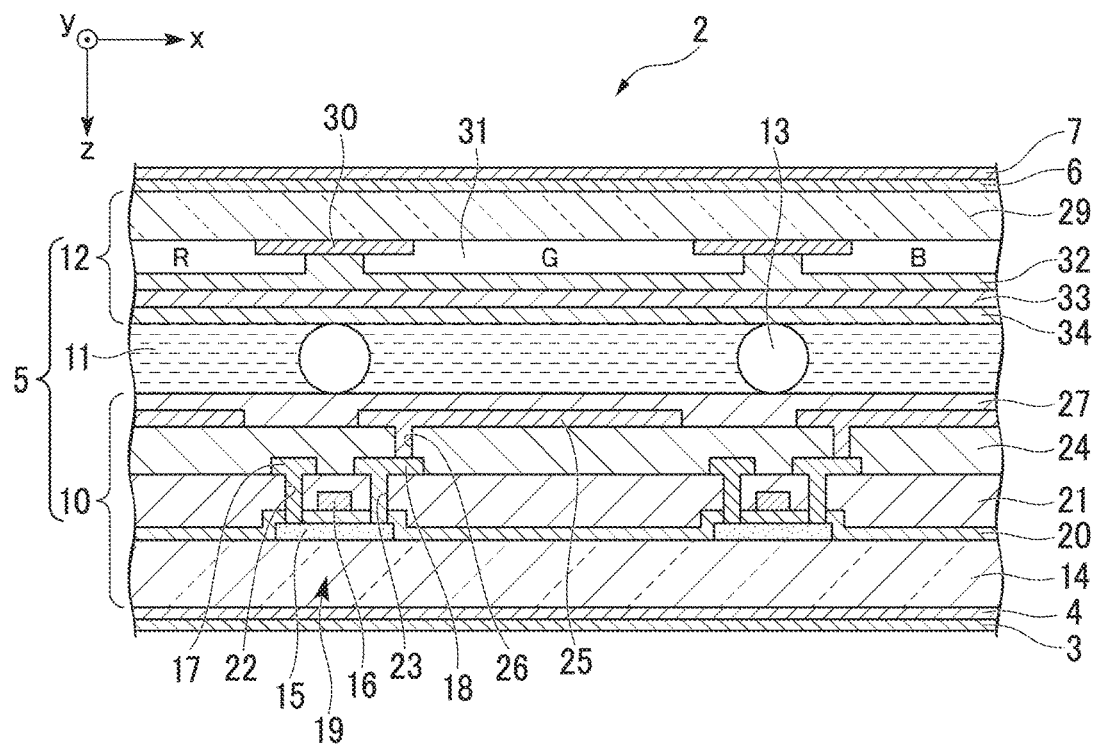
FIG. 2 is a vertical cross-sectional view of a liquid crystal panel of the first embodiment of the present invention.

FIG. 2 is a vertical cross-sectional view of the liquid crystal panel 2.

As shown in FIG. 2, liquid crystal cell 5 has a TFT substrate 10, a color filter substrate 12, and a liquid crystal layer 11. The TFT substrate 10 functions as a switching element substrate. The color filter substrate 12 is disposed so as to oppose the TFT substrate 10. The liquid crystal layer 11 is sandwiched between the TFT substrate 10 and the color filter substrate 12.

The TFT substrate 10 of the present embodiment corresponds to the first substrate as recited in the claims. The color filter substrate 12 of the present embodiment corresponds to the second substrate as recited in the claims.

The liquid crystal layer 11 is sealed into a space that is surrounded by the TFT substrate 10, the color filter substrate 12, and a frame-shaped sealing member (not shown). The sealing member adheres the TFT substrate 10 and the color filter substrate 12 together with a prescribed spacing.

The liquid crystal panel 2 of the present embodiment makes a display in the VA (vertical alignment) mode. The liquid crystal layer 11 uses a liquid crystal with negative dielectric anisotropy. Spacers 13 are disposed between the TFT substrate 10 and the color filter substrate 12. The spacers 13 are spherical or columnar members. The spacers 13 maintain a prescribed spacing between the TFT substrate 10 and the color filter substrate 12.

A TFT 19 having a semiconductor substrate 15, a gate electrode 16, a source electrode 17, a drain electrode 18, and the like is formed on the liquid crystal layer 11 side surface of a transparent substrate 14 of the TFT substrate 10. A glass substrate, for example, can be used as the transparent substrate 14.

The TFT 19 of the present embodiment corresponds to the switching element as recited in the claims.

The semiconductor layer is formed on the transparent substrate 14. The semiconductor layer 15 is constituted by a quaternary semiconductor material, including, for example, indium (In), gallium (Ga), zinc (Zn), and oxygen (O). In addition to an In—Ga—Zn—O based quaternary semiconductor, semiconductor materials such as CGS (continuous grain silicon), LPS (low-temperature poly-silicon), and α-Si (amorphous silicon) and the like are used as the material of the semiconductor layer.

A gate insulating film 20 is formed on the transparent substrate 14 so as to cover the semiconductor layer 15.

A silicon oxide film, a silicon nitride film or a laminated film or the like thereof is used as the material of the gate insulating film 20.

A gate electrode 16 is formed over the gate insulating film 20 so as to oppose the semiconductor layer 15. For example, a W (tungsten)/TaN (titanium nitride) laminated film, Mo (molybdenum), Ti (titanium) or Al (aluminum) or the like is used as the material of the gate electrode 16.

A first interlayer insulating film 21 is formed over the gate insulating film 20 so as to cover the gate electrode 16. A silicon oxide film, a silicon nitride film or a laminated film or the like thereof, for example is used as the material of the first interlayer insulating film 21.

The source electrode 17 and the drain electrode 18 are formed over the first interlayer insulating film 21. A contact hole 22 and a contact hole 23 are formed in the first interlayer insulating film 21 and the gate insulating film 20 so as to pass through the first interlayer insulating film 21 and the gate insulating film 20.

The source electrode 17 is connected to the source region of the semiconductor layer 15 via the contact hole 22. The drain electrode 18 is connected to the drain region of the semiconductor layer 15 via the contact hole 23. The same type of conductive material as the above-described gate electrode 16 is used as the material of the source electrode 17 and the drain electrode 18.

A second interlayer insulating film 24 is formed over the first interlayer insulating film 21 so as to cover the source electrode 17 and the drain electrode 18. The same type of material as the above-described first interlayer insulating film 21 or an organic insulating material is used as the material of the second interlayer insulating film 24.

A pixel electrode 25 is formed over the second interlayer insulating film 24. A contact hole 26 is formed in the second interlayer insulating film 24 so as to pass through the second interlayer insulating film 24. The pixel electrode 25 is connected to the drain electrode 18 via the contact hole 26. The pixel electrode 25 is connected to the drain region of the semiconductor layer 15, with the drain electrode 18 as a relay electrode.

A transparent conductive material such as ITO (indium tin oxide), IZO (indium zinc oxide) is used as the material of the pixel electrode 25.

By this constitution, when a scanning signal is supplied via the gate bus line and the TFT 19 is placed in the on state, an image signal supplied to the source electrode 17 via the source bus line is supplied to pixel electrode 25 via the semiconductor layer 15 and the drain electrode 18. The form of the TFT 19 may be the top-gate TFT as shown in FIG. 2, or may be a bottom-gate TFT.

A first vertical alignment film 27 is formed on the entire surface of the second interlayer insulating film 24, so as to cover the pixel electrodes 25. The first vertical alignment film 27 has alignment controlling force that vertically aligns the liquid crystal molecules of the liquid crystal layer 11. In the present embodiment, the first vertical alignment film 27 is subjected to alignment using optical alignment technology. That is, in the present embodiment, an optically aligned film is used as the first vertical alignment film 27.

On the liquid crystal layer 11 side surface of the transparent substrate 29 of the color filter substrate 12, are formed a black matrix 30, a color filter 31, a planarization layer 32, an opposing electrode 33, and a second vertical alignment film 34, in that sequence.

The black matrix 30 has the function of blocking the transmission of light in the inter-pixel regions. The black matrix 30 is formed from, for example, a metal such as Cr (chromium) or a multilayer film of Cr/chromium oxide Cr, or a photoresist into which photosensitive carbon particles have be dispersed into a photosensitive resin.

The color filters 31 include, for each sub-pixel with a different color constituting one pixel, one of the dyes of red (R), green (G), and blue (B). One color filter 31 of one of R, G, and B is disposed so as to oppose one pixel electrode 25 on the TFT substrate 10. The color filters 31 may have more than the three colors R, G, and B. For example, they may be a four-color constitution by adding yellow (Y), may be a four-color constitution by adding white (W), or may be a six-color constitution by adding yellow (Y), cyan (C), and magenta (M).

The planarization layer 32 is constituted by an insulating film that covers the black matrix 30 and the color filters 31. The planarization layer 32 has the function of alleviating the steps formed by the black matrix 30 and the color filters 31 and achieving planarization thereof.

The opposing electrode 33 is formed over the planarization layer 32. The same transparent conductive material as the pixel electrode 25 is used as the material of the opposing electrode 33.

A second vertical alignment film 34 is formed over the entire surface of the opposing electrode 33. The second vertical alignment film 34 has alignment controlling force that vertically aligns the liquid crystal molecules of the liquid crystal layer 11. In the present embodiment, the second vertical alignment film 34 is subjected to alignment using optical alignment technology. That is, in the present embodiment, an optically aligned film is used as the second vertical alignment film 34.

Returning to FIG. 1, the backlight 8, which is an illumination device, has a light source 36 and a light-guiding element 37. The light source 36 is disposed on an end face of the light-guiding element 37. A light-emitting diode or a cold-cathode tube or the like is used as the light source 36.

The backlight 8 of the present embodiment is an edge light type backlight.

The light-guiding element 37 has the function of guiding that has exited from the light source 36 to the liquid crystal panel 2. A resin material such as an acrylic resin is used as the material of the light-guiding element 37.

Light that strikes the end face of the light-guiding element 37 from the light source 36 is totally reflected and propagated through the light-guiding element 37 and exits from the upper surface (light-exiting surface) of the light-guiding element 37 with a substantially uniform intensity. In the present embodiment, although it is not illustrated, a scattering sheet and prism sheet are disposed on the upper surface of the light-guiding element 37, and a scattering sheet is disposed on the lower surface of the light-guiding element 37. Light that has exited from the upper surface of the light-guiding element 37 is scattered by the scattering sheet, after which it is collected by the prism sheet and exits as substantially parallel. White PET may be used as the scattering sheet. A BEF sheet (product name) made by Sumitomo 3M may be used as the prism sheet.

In the present embodiment, the backlight 8 need not have directionality. As the backlight 8 of the present embodiment, a backlight is used that controls the exiting direction of light and is set to have somewhat moderate directionality (which will sometimes be called a normal backlight). In the present embodiment, the backlight 8 need not have directionality.

A first polarizing sheet 3 is provided between the backlight 8 and the liquid crystal cell 5. The first polarizing sheet 3 has the function of a polarizing element that controls the polarization condition of light incident to the liquid crystal cell 5. A second polarizing sheet 7 is provided between the liquid crystal cell 5 and the optical control member 9. The second polarizing sheet 7 has the function of a photodetector that controls the transmission condition of light that has exited from the liquid crystal cell 5. As will be describe later, the transmission axes of the first polarizing sheet 3 and the second polarizing sheet 7 are disposed in crossed Nicol fashion.

A first phase difference film 4 for compensating the phase difference of the light is provided between the first polarizing sheet 3 and the liquid crystal cell 5. A second phase difference film 6 for compensating the phase difference of the light is provided between the second polarizing sheet 7 and the liquid crystal cell 5.

A TAC film, for example, is used as the phase difference films (first phase difference film 4 and second phase difference film 6) in the present embodiment.

Continuing, the method of driving the liquid crystal display device 1 of the present embodiment will be described.

Because the liquid crystal display device 1 of the present embodiment displays super Hi-Vision video, it has 7680 pixels (horizontal direction)×4320 pixels (vertical direction).

Figure 3:
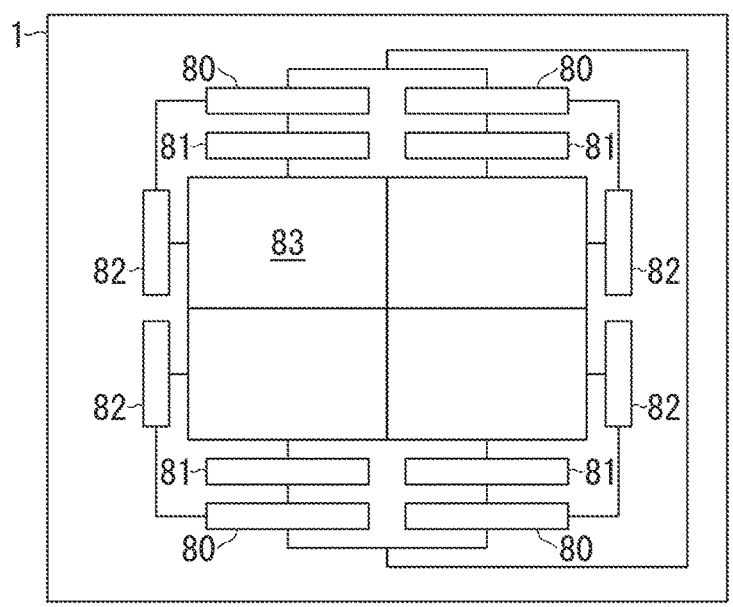
FIG. 3 is a block diagram showing the constitution of a drive circuit of a liquid crystal display device.

FIG. 3 is a schematic representation of the interconnections of the drivers and the timing controllers of the liquid crystal display device 1.

The liquid crystal display device 1 of the present embodiment has four timing controllers 80, and each of the four timing controllers 80 control the input signals to the source drivers 81 and gate drivers 82 of the upper-right region, the upper-left region, the lower-right region, and the lower left region of the screen 83.

Figure 4:
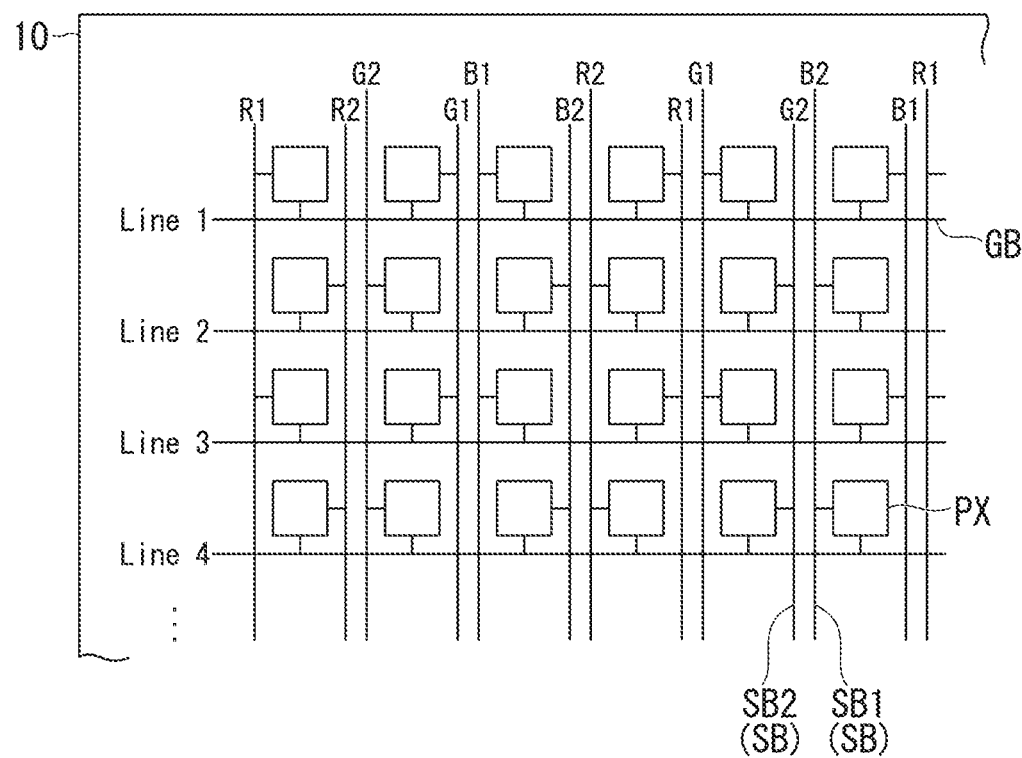
FIG. 4 shows the gate bus lines and the source bus lines of a liquid crystal display device.

FIG. 4 is an enlarged view of the screen display region of the liquid crystal display device 1.

As shown in FIG. 4, a plurality of pixels PX are disposed in matrix fashion on the TFT substrate 10. The pixel PX is the basic unit of display. A plurality of source bus lines SB are formed on the TFT substrate 10 so as to extend in mutually parallel directions. A plurality of gate bus lines GB are formed on the TFT substrate 10 so as to extend in mutually parallel directions. The plurality of gate bus lines GB are orthogonal to the plurality of source bus lines SB. The plurality of source bus lines SB and the plurality of gate bus lines GB are formed on the TFT substrate 10 in a matrix configuration. A rectangular region that is partitioned by neighboring source bus lines SB and neighboring gate bus lines GB forms one pixel PX. The source bus lines SB are connected to source electrodes of TFTs. The gate bus lines GB are connected to gate electrodes of TFTs.

In the liquid crystal display device 1 of the present embodiment, two source bus lines SB1 and SB2 are formed with respect to one row of pixels PX, an odd-numbered pixel PX (line 1, 3, and so on) being connected to the first source bus line SB1, and an even-numbered pixel PX (line 2, 4, and so on) being connected to the second source bus line SB2. When scanning is done, two gate bus lines GB are selected at one time, and a signal is written into a pixel PX simultaneously for the two rows.

When a video signal from outside is input, the video signal is divided into four and supplied to the four timing controllers 80, and also two each gate bus lines GB are simultaneously selected. For that reason, at the first timing, the 1st, the 2nd, the 2161st, and the 2162nd rows display the video, followed by the 3rd, the 4th, the 2163rd, and the 2164, and so on, four rows of video at a time being displays, and then finally, after the gate bus line GB of the last, 4320th row gate bus line GB is selected, the next video signals are written starting from the top again.

The drive method is not restricted to being the above-noted four-line simultaneous writing and may be scanned one line at a time from the top, as long as the interconnect capacity is sufficiently small and also the liquid crystal response speed is sufficient fast.

Next the optical control member 9 will be described in detail.

Figure 5:
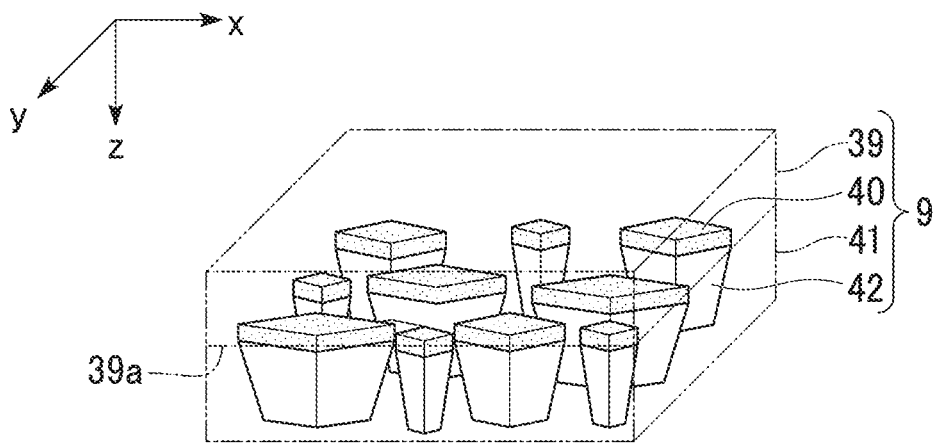
FIG. 5 is an oblique view of an optical control member seen from the viewing side.
Figure 6:
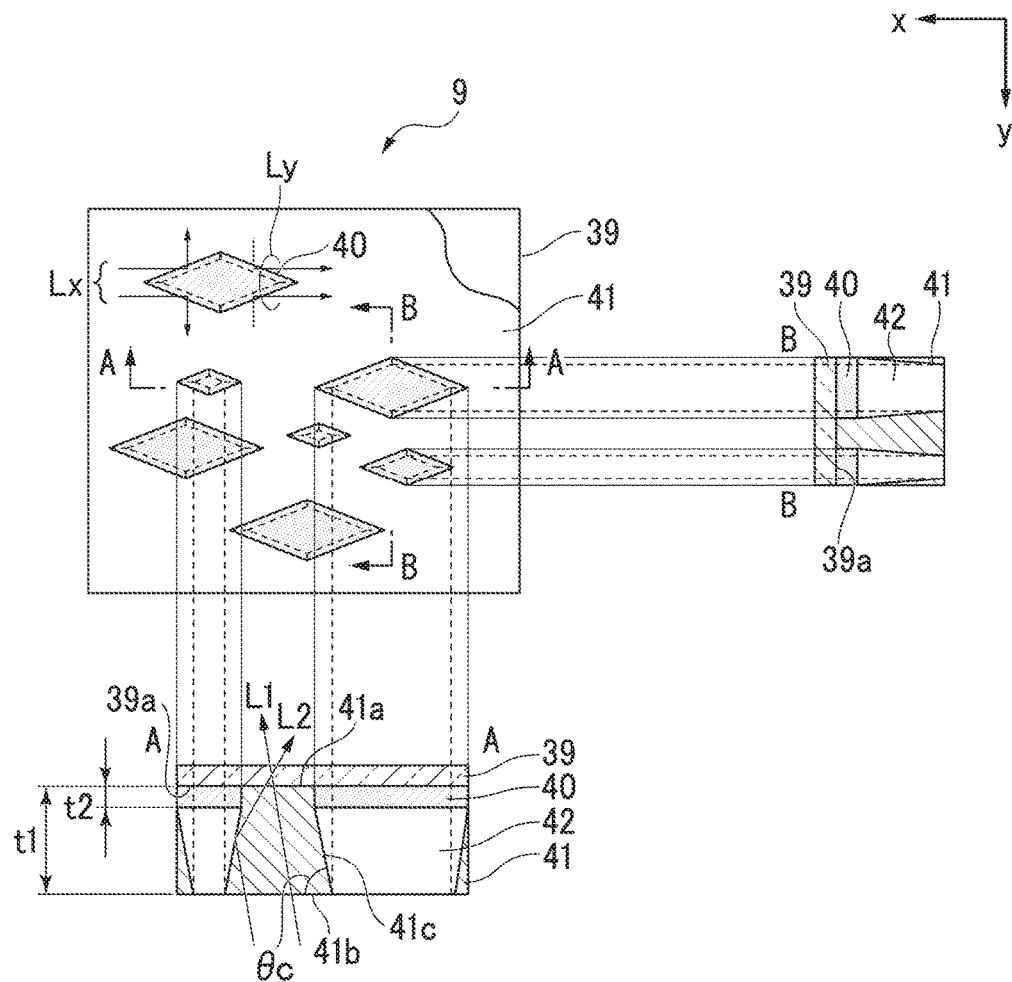
FIG. 6 is a plan view of and cross-sectional views of an optical control member seen from two directions.

FIG. 5 is an oblique view of the optical control member 9 as seen from the viewing side. FIG. 6 is a schematic representation of an optical control member 9. In FIG. 6, a plan view of the optical control member 9 is shown in the upper-left, the lower-left shows a cross-sectional view along the line A-A in the plan view in the upper-left, and the upper-right shows a cross-sectional view along the line B-B in the plan view in the upper-left.

As shown in FIG. 5, an optical control member 9 has a base 39, a plurality of light blocking layers 40, a light diffusion part 41, and a plurality of hollow parts 42. The plurality of light blocking layers 40 are formed on a first surface 39a (surface on the side opposite from the viewing side) of the base 39. The light diffusion part 41 is formed in the region of the first surface 39a of the base 39 in which the light blocking layers 40 are not formed. Stated conversely, the light blocking layers 40 are provided at positions that do not overlap with the light diffusion parts 41 when viewed from the normal direction of the base 39, of the first surface 39a. The hollow parts 42 are provided at positions that partially overlap with the light blocking layers 40 when viewed from the normal direction of the base 39.

The optical control member 9, as shown in FIG. 1, is disposed on the second polarizing sheet 7, with the light diffusion part 41 facing the second polarizing sheet 7 and the base 39 facing the viewing side. The optical control member 9 is fixed to the second polarizing sheet 7 via an adhesive layer 43.

A transparent resin substrate, such as, triacetyl cellulose (TAC) film, polyethylene terephthalate (PET), polycarbonate (PC), polyethylene naphthalate (PEN), polyethersulfone (PES) film is preferably used for the base 39. The base 39 serves as the underlayer in the manufacturing process for the subsequent coating of the material of the light blocking layers 40 and the light diffusion part 41. The base 39 is required to have heat resistance and mechanical strength in the heat treatment process steps of the manufacturing process. Therefore, rather than a substrate made of resin, a substrate made of glass may be used for the base 39. However, the thickness of the base 39 is preferably made thin, to an extent that heat resistance and mechanical strength are not sacrificed. The reason for this is that, the thicker the base 39 becomes, the thicker must the overall liquid crystal display device be made. It is preferable that the overall light transmissivity of the base 39 is 90% or greater, as set forth in JIS standard K7361-1. If the overall light transmissivity is 90% or greater, sufficient transparency is achieved.

In the present embodiment, a transparent resin substrate having, for example, a thickness of 100 μm is used as the base 39.

The light blocking layers 40 are disposed randomly when seen from the normal direction of the first surface 39a of the base 39. As an example, the light blocking layers 40 are constituted by an organic material having light-absorbing and photosensitive properties, such as black resist or black ink. In addition, metal film of chromium or a multilayer film such as Cr/chromium oxide may be used.

The light diffusion part 41 is constituted by, for example, an organic material having light transmissivity and photosensitivity, such as an acrylic resin or epoxy resin. The overall light transmissivity of the light diffusion part 41 is preferable 90% or greater as set forth in JIS standard K7361-1. If the overall light transmissivity is 90% or greater, sufficient transparency is achieved.

As shown in FIG. 6, the light diffusion part 41 has a light-exiting end surface 41a, a light-entering end surface 41b, and a reflecting surface 41c. The light-entering surface 41b contacts the base 39. The light-entering end surface 41b opposes the light-exiting end surface 41a. The reflecting surface 41c is a tapered inclined surface of the light diffusion part 41. The reflecting surface 41c reflects light incident from the light-entering end surface 41b. In the present embodiment, in all the light diffusion parts 41, the surface area of the light-entering end surface 41b is larger than the surface area of the light-exiting end surface 41a.

The light diffusion part 41 is a part that contributes to the transmission of light in the optical control member 9. As shown at the lower-left in FIG. 6, of the light incident to the light diffusion part 41, the light L1 exits from the light-exiting end surface 41a without being reflected at the reflecting surface 41c. Of the light incident to the light diffusion part 41, the light L2 totally reflected by the reflecting surface 41c as it is guided within the light diffusion part 41 in a state of being substantially constrained therein, and then exits from the light-exiting end surface 41a.

The optical control member 9 is disposed that the base 39 faces the viewing side. For that reason, of the two opposing surfaces of light diffusion part 41, the light-exiting end surface 41a is the surface with the smaller surface area. In contrast, the light-entering end surface 41b is the surface with the larger surface area.

The inclination angle of the reflecting surface 41c of the light diffusion part 41 (the angle θc formed by the light-entering end surface 41b and the reflecting surface 41c) is, as one example, approximately 80°±5°. The inclination angle θc of the reflecting surface 41c of the light diffusion part 41 is not particularly restricted, as long as it is possible to sufficient diffuse the incident light when it exits from the optical control member 9. In the present embodiment, the inclination angle of the reflecting surface 41c of the light diffusion part 41 is uniform.

The height t1 from the light-entering end surface 41b to the light-exiting end surface 41a of the light diffusion part 41 is set to be larger than the layer thickness t2 of the light blocking layer 40. In the case of the present embodiment, the layer thickness t2 of the light blocking layer 40 is, as one example, approximately 150 nm. The height t1 from the light-entering end surface 41b to the light-exiting end surface 41a of the light diffusing part 41 is, as one example, approximately 10 to 20 μm. The part surrounded by the reflecting surface 41c of the liquid crystal panel 41 and the light blocking layer 40 is the hollow part 42. Air exists in the hollow part 42.

It is desirable that the refractive index of the base 39 and the refractive index of the light diffusion part 41 are substantially the same. The reason for is as follows. For example, consider a case in which the refractive index of the base 39 and the refractive index of the light diffusion part 41 are greatly different. In this case, when the light incident from the light-entering end surface 41b exits from the light diffusion part 41, unnecessary refraction or reflection of light might occur at the boundary between the light diffusion part 41 and the base 39. In this case, there is a risk that problems might occur such as the desired viewing angle not being obtained or the amount of exiting light being decreased.

In the case of the present embodiment, air exists as a medium in the hollow part 42 (part outside the light diffusion part). For that reason, if the light diffusion part 41 is formed from, for example, transparent acrylic resin, the reflecting surface 41c of the light diffusion part 41 becomes the boundary between the transparent acrylic resin and air. In this case, the hollow 42 may be filled with another low refractive index material. However, the difference in refractive index at the boundary between inside and outside the light diffusion part 41 is maximum when air exists, regardless of how low the refractive index of the material on the outside is.

Therefore, from Snell's Law, with the constitution of the present embodiment, the critical angle is minimum, and the incidence angle range of totally reflected light at the reflecting surface 41c of the light diffusion part 41 is made the broadest. As a result, light loss is suppressed more, and it is possible to achieve a high luminance.

The hollow part 42 in the present embodiment corresponds to the "low refractive index part" as recited in the claims.

Figure 9:
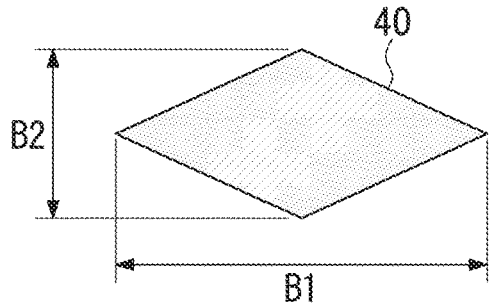
FIG. 9 is a plan view showing a light-blocking layer of an optical control member.

The optical control member 9 of the present embodiment, as shown in the upper-left of FIG. 6, is provided with a plurality of light blocking layers 40 scattered on the first surface 30a of the base 39. The planar shape of a light blocking layer 40 when seen from the normal line direction of the base 39 is a long, narrow rhombic shape. That is, the light blocking layers 40 exhibit an anisotropic shape having a major axis and a minor axis. As shown in FIG. 9, the ratio of the major-axis dimension B1 to the minor-axis dimension B2 (B1/B2) of the rhombic shape that is the planar shape of the light blocking layers 40 is, for example, one or greater and no greater than 3.

The major-axis dimension B1 of the light blocking layer 40 is, for example, 10 to 20 μm, and the minor-axis dimension B2 of the light blocking layer 40 is, for example, 5 o to 10 μm. In the optical control member 9 of the present embodiment, although the minor-axis dimensions B2 themselves and the major-axis dimensions B1 themselves of each of the light blocking layers 40 differ, the ratios of the major-axis dimensions B1 to the minor-axis B2 are substantially the same.

The proportion of the total surface area of the first surface 39a of the base 39 occupied by the light blocking layers 40 is, for example, 30%±10%.

As shown in the lower-left and upper-right of FIG. 6, the part corresponding to below the light blocking layer 40 is the square frustum shaped hollow 42. An optical control member 9 has a plurality of hollows 42 corresponding to a plurality of light blocking layers 40. The light diffusion part 41 is provided connected throughout the parts other than the plurality of hollows 42.

In the optical control member 9 of the present embodiment, the major-axis directions of the rhombic planar shapes of the light blocking layers 40 are substantially the x-axis direction. In the following, major axis direction of the rhombi will sometimes be called the major-axis direction of the light blocking layer 40. The minor-axis direction of the rhombic planar shapes of the light blocking layers 40 are substantially the y-axis direction. In the following, the minor-axis direction of the rhombi will sometimes be called the minor-axis direction of the light blocking layer 40. Because the reflecting surface 41c of the light diffusion part 41 faces each side of the rhombic planar shapes of the light blocking layer 40, considering the orientation of the reflecting surface 41c of the light diffusion part 41, of the reflecting surfaces 41c of the light diffusion part 41, the proportion of the reflecting surfaces 41c parallel to the x-axis direction and the y-axis direction is very small, and reflecting surfaces 41c that form an angle with the x-axis direction and the y-axis direction is the majority. For that reason, if the path of travel of the light is projected onto the xy plane, the proportion of the light Lx that is incident from the x-axis direction and reflected at the reflecting surface 41c proceeding in the y-axis direction, and the light Ly that is incident from the y-axis direction and reflected at the reflecting surface 41c proceeding in the x-axis direction is large. Additionally, as will be described later, compared with the above-noted two types of light, the light Lx from the x-axis direction parallel to the major-axis of the light blocking layer 40 that is diffused toward the y-axis direction that is parallel to the minor-axis is large.

The planar shapes of the light blocking layers 40 may include some that are circular, elliptical, polygonal, semicircular, or the like. The light blocking layers 40 may be formed as to partially overlap.

Figure 7:
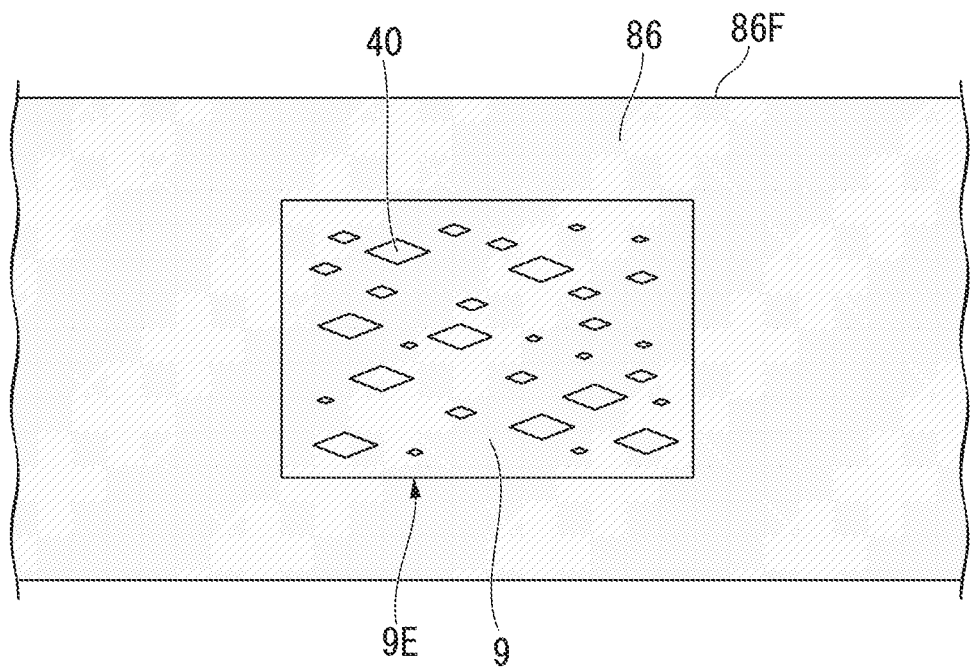
FIG. 7 is a plan view of one example of a base material for manufacturing an optical control member.
Figure 8:
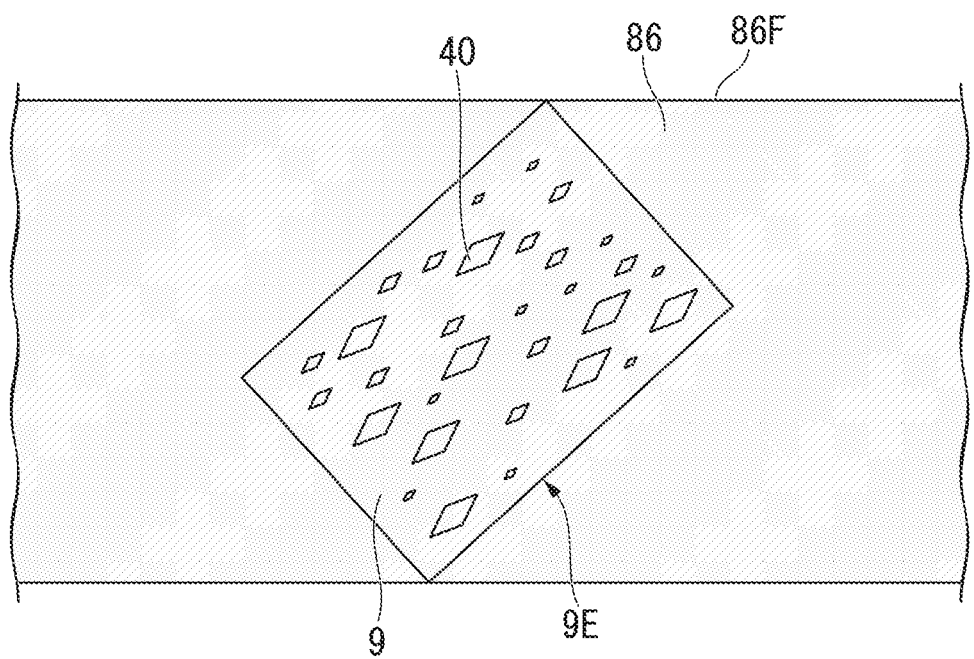
FIG. 8 is a plan view of another example of a base material for manufacturing an optical control member.

FIG. 7 and FIG. 8 are schematic representations of the disposition directions of the light blocking layers 40 relative to the optical control member 9.

As shown in FIG. 7 and FIG. 8, when manufacturing the optical control member 9, a base material 86 for manufacturing an optical control member that is larger than the size of the region 9E for forming one optical control member 9 may be manufactured beforehand, after which the base material 86 for manufacturing an optical control member may be cut and divided to cut away an optical control member 9 of the desired size.

Alternatively, a base material 86 for manufacturing an optical control member that includes the region 9E for formation of a plurality of optical control members 9 may be manufactured beforehand, after which the base material 86 for manufacturing an optical control member may be cut and divided to manufacture a plurality of optical control members 9 at one time. That is, the base material 86 for manufacturing an optical control member includes a region 9E for forming at least one optical control member 9. For example, the base material 86 for manufacturing an optical control member shown in FIG. 7 and FIG. 8 is a part of a rolled material used in a roll-to-roll method.

When manufacturing an optical control member 9 by the above-noted method, as shown in FIG. 7, the major-axis directions of the light blocking layers 40 are arranged in parallel with the edge 86F of the base material 86 for manufacturing an optical control member, and the base material 86 for manufacturing an optical control member may be divided by a straight line parallel to the edge 86F. Alternatively, as shown in FIG. 8, the major-axis direction of the light blocking layer 40 makes an angle of 45° with the edge 86F of the base material 86 for manufacturing an optical control member, and the base material 86 for manufacturing an optical control member may be divided by a straight line that makes an angle of 45° with the edge 86F of the base material 86 for manufacturing an optical control member. The angle formed by the major-axis direction of the light blocking layer 40 and the edge 86F of the base material 86 for manufacturing an optical control member need not be 45°, and can be approximately 45°±15°.

In particular in the case in which a polarizing sheet and an optical control member 9 are formed as one and also the polarizing sheet has uniaxial orientation, due to the manufacturing process, the absorption axis or transmission axis of the polarizing sheet often coincides with the longitudinal direction of the base material 86 for manufacturing an optical control member. For that reason, it is desirable to adopt the disposition as shown in FIG. 8, in which the major-axis direction of the light blocking layers 40 form an angle of 45° with the edge 86F of the base material 86 for manufacturing an optical control member, so that the longitudinal direction of the light blocking layers are inclined by 45° with respect to the absorption axis or transmission axis of the polarizing sheet.

Figure 10:
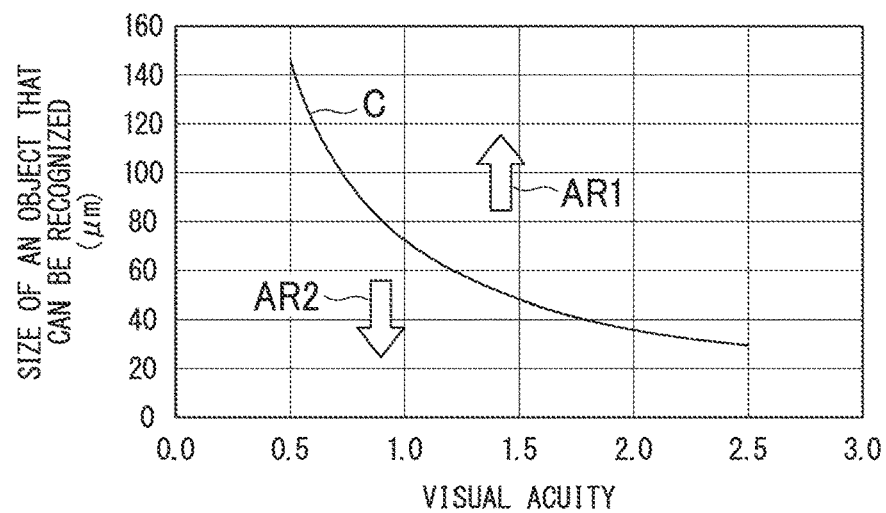
FIG. 10 is a graph showing the relationship between the human visual acuity and the size of an object that can be recognized by the human eye.

FIG. 9 and FIG. 10 describe the planar sizes of the light blocking layers 40.

FIG. 9 is a plan view showing one light blocking layer 40 of a plurality of light blocking layers 40. FIG. 10 is a graph showing the relationship between the human visual acuity and the size of an object that can be recognized by the human eye. In FIG. 10, the horizontal axis represents the human visual acuity, and the vertical axis represents the size of an object that can be recognized by the human eye.

In the optical control member 9, the planar size of the light blocking layers 40 is better made small to some extent. The reason for this is that, if the planar size of the light blocking layers 40 is made excessively large, when an observer views the display screen of the liquid crystal display device 1, there is a risk that the light blocking layers 40 will be recognized as dots.

As shown in FIG. 9, the length in the major-axis direction of a light blocking layer 40 is taken as B1, and the length in the minor-axis direction thereof is taken as B2. To make it difficult for a light blocking layer 40 be recognized as a dot, it is preferable that the major-axis direction length B1 of the light blocking layer 40 be 100 μm or smaller. A method of determining the major-axis direction length B1 of the light blocking layer 40 will be described below.

As shown in FIG. 10, a certain relationship exists between human visual acuity and the size of an object that can be recognized by the human eye. The region AR1 above the curve C shown in FIG. 10 is the region in which the human eye can recognize an object. The region AR2 below the curve C is the region in which the human eye cannot recognize an object. The curve C is defined by Equation (3) defined by the following equations.

In the human eye, if the minimum viewing angle is β (minutes), the visual acuity α is given by the Equation (1).

$$\alpha = 1/\beta \tag{1}$$

If the size of an object that can be recognized by the human eye is V (mm) and the distance from the human eye to the object is W (m), the minimum viewing angle β is given by Equation (2).

$$\beta = (V/1000)/\{W \times 2\pi/(360/60)\} \tag{2}$$

From the above Equation (1) and Equation (2), the viewing angle α is expressed as in Equation (3).

$$\alpha = \{W \times 2\pi/(360/60)\}/(V/1000) \tag{3}$$

Rearranging the above-noted Equation (3), the size V of an object that can be recognized by the human eye is expressed by Equation (4).

$$V = [\{W \times 2\pi/(360/60)\} \times 1000]/\alpha \tag{4}$$

When using a portable electronic device such as a mobile telephone handset, the distance W from the human eye to an object is approximately 20 cm to 30 cm. In this case, as an example, the distance W from the human eye to the object will be made 25 cm.

The minimum visual acuity to obtain a driver's license for a vehicle is 0.7. In this case, the size V of an object that can be recognized by the human eye is 100 μm. If the size V of an object is smaller than 100 μm, it is thought that it becomes difficult for the human eye to recognize the object. That is, it is preferable that the major-axis direction length B1 of the light blocking layers 40 is less than 100 μm. This avoids having the light blocking layers 40 recognized as dots on the display screen of the liquid crystal display device 1. In this case, the minor-axis direction length B2 of the light blocking layers 40 is set to be shorter than the major-axis direction length B1 of the light blocking layers 40 and also to be less than 100 μm.

Additionally, the size V of an object that can be recognized by the human eye with a visual acuity of 2.0 is 40 μm. If the size V of an object is smaller than 40 μm, it is thought that it is impossible for the human eye to recognize the object. That is, it is preferable that the major-axis direction length B1 of the light blocking layers 40 is less than 40 μm. This reliably avoids having the light blocking layers 40 recognized as dots on the display screen of the liquid crystal display device 1. In this case, the minor-axis direction length B2 of the light blocking layers 40 is set to be shorter than the major-axis direction length B1 of the light blocking layers 40 and also to be less than 40 μm.

A display accommodating 85V Super Hi-Vision is approximately 103 pixels/inch and one for 60V is approximately 146 pixels/inch. If the color filters are constituted by the three colors R, G, and B, the pixel size is approximately 82 μm×246 μm for 85V and 58 μm×174 μm for 60V. As described above, if the size of the light blocking layers 40 is 40 µm or smaller, they will not be recognized as dots when viewed. However, when a large number of light blocking layers 40 are straddled on a plurality of pixels, because light exiting from different pixels is mixed, a feeling of reduced definition occurs. Thus, it is desirable that major-axis direction dimension of the light blocking layers 40 be ⅓ to ½ of the pixel width. For example, in the case of 60V Hi-Vision, it is desirable that the major-axis direction dimension of the light blocking layers 40 be, for example, 19 µm or smaller. However, experiments of shown that, in the case of forming hollows 42 by a photolithography process to be described later, it is desirable that the thickness of the light diffusion part 41 is the same or smaller than the width of the light blocking layers 40. From that standpoint, for example, in the case of a major-axis direction dimension of the light blocking layer 40 of 15 µm, it is desirable that the thickness of the light diffusion part 41 be 15 µm or smaller.

The effect of combining the optical control member 9 with a VA mode liquid crystal panel 2 will now be described.

Figure 11:
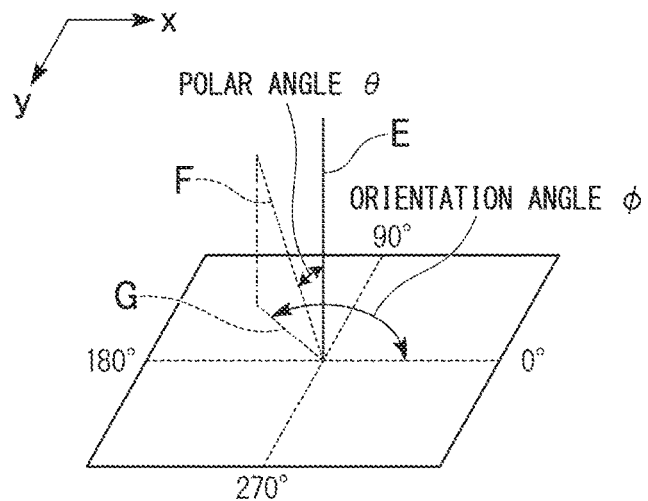
FIG. 11 is a drawing describing the definitions of polar angle and orientation angle.

FIG. 11 describes the definitions of the orientation angle and the polar angle.

In this case, as shown in FIG. 11, the angle formed by the viewing direction F of an observer, referenced to the normal line direction E of the screen of the liquid crystal display device 1 is taken as the polar angle θ. The angle formed by the direction of the line segment G when the viewing direction F of an observer is projected onto the screen, referenced to the x-axis position direction (0° direction) is taken as the orientation angle φ.

Figure 12:
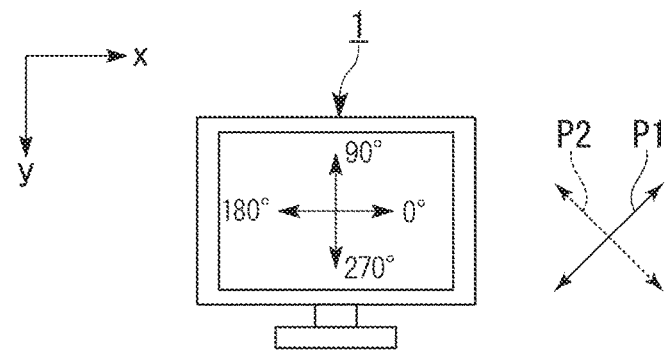
FIG. 12 is a front view of a liquid crystal display device.

FIG. 12 is a front view of the liquid crystal display device 1.

As shown in FIG. 12, on the screen of the liquid crystal display device 1, the horizontal direction (x-axis direction) is taken as the orientation angle φ from 0° to 180°. The vertical direction (y-axis direction) is taken to be the orientation angle φ from 90° to 270°. In the present embodiment, the transmission axis P1 of the first polarizing sheet 3 is disposed with an orientation angle φ of 45° to 225°, and the transmission axis P2 of the second polarizing sheet 7 is disposed with an orientation angle φ of 135° to 315°.

Figure 13:
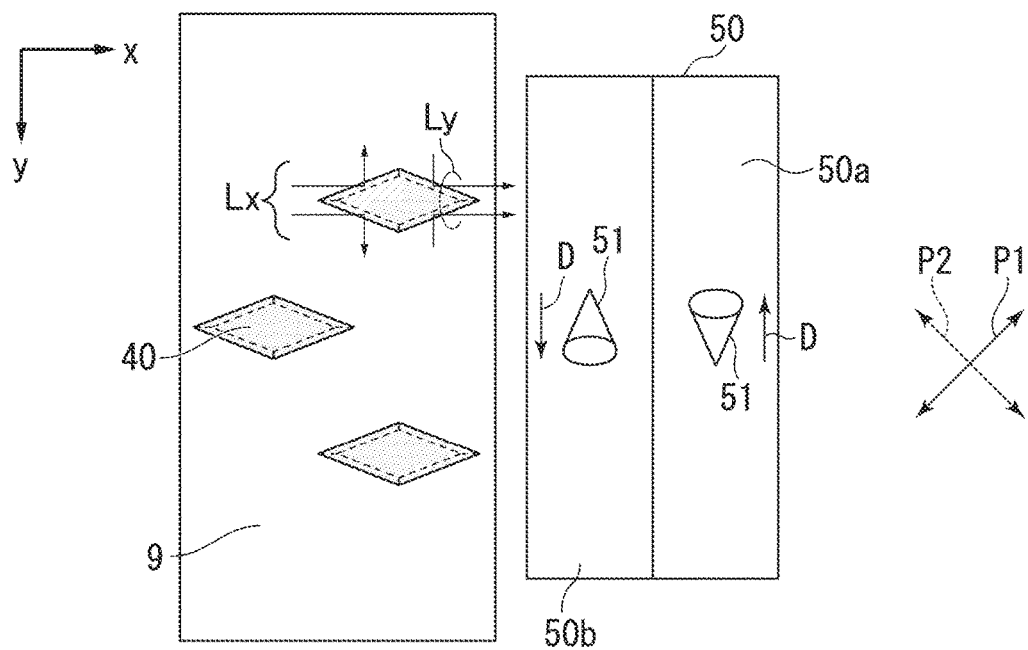
FIG. 13 is a schematic representation of the positional relationship between the director direction of the liquid crystal molecules of each domain within a pixel and the optical control member and polarizing sheet.

FIG. 13 is a schematic representation of the positional relationship between a VA-mode pixel 50 and an optical control member 9 included in the liquid crystal display device 1. Although, as shown in FIG. 1, an optical control member 9 is actually disposed over the pixel 50, for the purpose of illustration, in FIG. 13 the pixel 50 and the optical control member 9 are disposed next to each other. The transmission axis P1 of the first polarizing sheet 3 and the transmission axis P2 of the second polarizing sheet 7 are shown to the right side of the pixel 50.

In the pixel 50 in the present embodiment, a VA construction is adopted in which one pixel 50 is divided into two domains, the first domain 50a and the second domain 50b, in a so-called two-domain VA construction. In this case, a straight line parallel to the longitudinal direction of the rectangular pixel is used to divide it in two, forming vertically long domains. The liquid crystal molecules 51 included in the pixel 50, when in the state in which a voltage is not applied, are aligned substantially vertically. In FIG. 13, the liquid crystal molecules 51 are shows as being conical. The vertices of the cones signify rear-side end parts of the liquid crystal molecules 51. The bases of the cones show the viewing-side end parts of the liquid crystal molecules 51. In the present embodiment, the direction of the director of a liquid crystal molecule 51 signifies the longitudinal direction of the liquid crystal molecule 51, and the orientation of the director of a liquid crystal molecule 51 is defined as the direction from the end part of the reverse side of the liquid crystal molecule 51 to the end part on the viewing side. The director of a liquid crystal molecule 51 is shown by the arrow with the reference symbol D. The direction of the director of a liquid crystal molecule 51 coincides with the longitudinal direction of the pixel or the longitudinal direction of the domain.

As shown in FIG. 13, the liquid crystal molecule 51 included in the first domain 50a and the liquid crystal molecule 51 included in the second domain 50b are inclined at directions that are mutually 180° different, in the orientation φ direction of 90° to 270°. Specifically, the liquid crystal molecule 51 included in the first domain 50a is oriented so that the polar angle θ is made greater than 0° at an orientation angle φ of 90°. The liquid crystal molecule 51 included in the second domain 50b is oriented so that the polar angle θ is made greater than 0° at an orientation angle φ of 270°.

By orienting the liquid crystal molecules 51 in this manner, in the first domain 50a, when a voltage is applied, in the center part in the thickness direction of the liquid crystal layer 11 the liquid crystal molecules 51 fall over so as to approach an orientation angle φ of 90° and also a polar angle of 90°. In the second domain 50b, when a voltage is applied, in the center part in the thickness direction of the liquid crystal layer 11 the liquid crystal molecules 51 fall over so as to approach an orientation angle φ of 270° and also a polar angle of 90°. That is, when a voltage is applied in the center part in the thickness direction of the liquid crystal layer 11, the liquid crystal molecules 51 included in the first domain 50a and the liquid crystal molecules 51 included in the second domain 50b fall over in orientations that mutually differ by 180° at an orientation angle φ direction of 90° to 270°. Because the alignment is constrained by the first vertical alignment film 27 and the second vertical alignment film 34, the liquid crystal molecules 51 in the vicinity of the first vertical alignment film 27 and the second vertical alignment film 34 are remain substantially vertical even when a voltage is applied.

Figure 15:
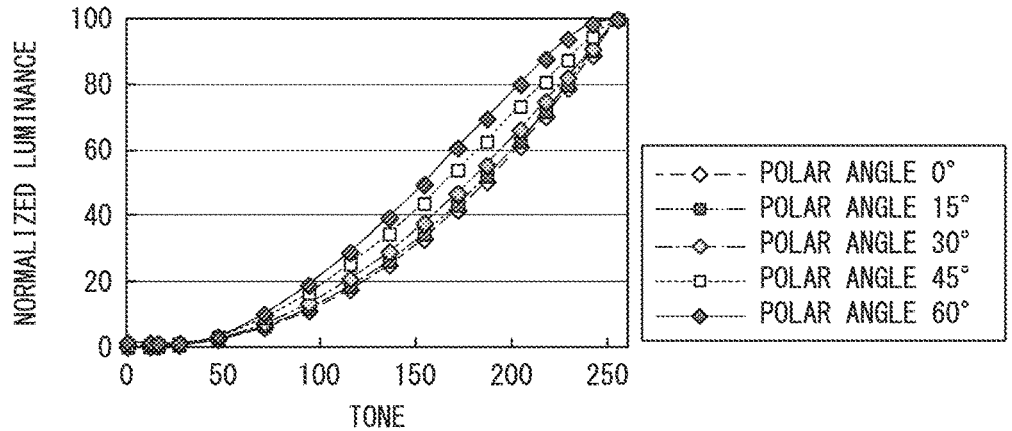
FIG. 15 shows the gamma characteristics for the case of varying the polar angle θ at an orientation angle φ of 0° in a liquid crystal display device not having an optical control member.

FIG. 15 shows the gamma characteristics for the case of varying the polar angle θ at an orientation angle φ of 0° in a liquid crystal display device of a comparative example not having an optical control member 9. In FIG. 15 the horizontal axis represents the tone and the vertical axis represents the normalized luminance. The normalized luminance indicates the luminance normalized with the luminance at a tone of 255 being 100%. FIG. 15 shows the gamma characteristics at polar angles θ of 0°, 15°, 30°, 45°, and 60°. The direction of the directors of the liquid crystal molecules 51, as shown in FIG. 13 is a direction in the range 90° to 270°.

As shown in FIG. 15, if the liquid crystal display device having the pixel is viewed at an orientation angle φ direction of 0° to 180° while varying the polar angle θ, the variation in the gamma characteristics is relatively small.

Figure 16:
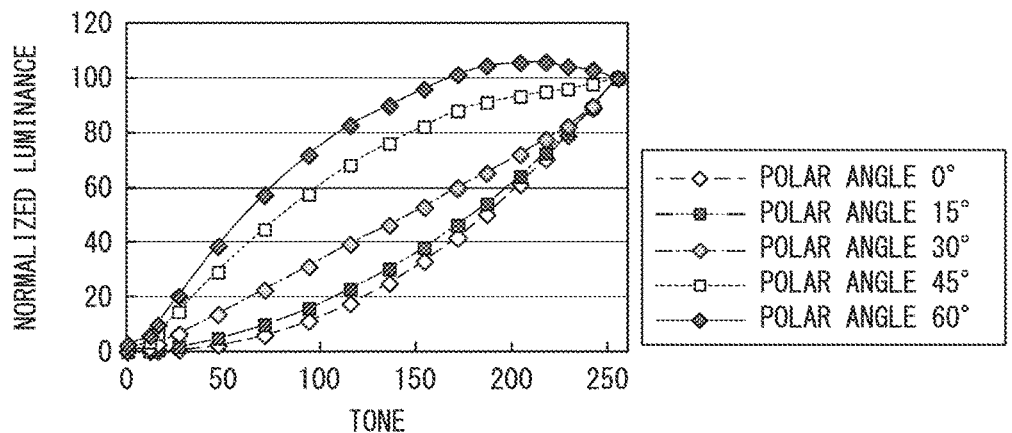
FIG. 16 shows the gamma characteristics for the case of varying the polar angle θ at an orientation angle φ of 90° in a liquid crystal display device not having an optical control member.

FIG. 16 shows the gamma characteristics for the case of varying the polar angle θ at an orientation angle φ of 90° of the comparative example of the liquid crystal display device that does not have an optical control member 9. FIG. 16 shows the gamma characteristics at the polar angle θ of 0°, 15°, 30°, 45° and 60°. The direction of the directors of the liquid crystal molecules 51, as shown in FIG. 13, is taken to be an angle of 90° to 270°.

As shown in FIG. 16, if an observation is made, varying the polar angle θ at an orientation angle φ direction of 90° to 270°, the variation in the gamma characteristics is large.

Comparing this with FIG. 15, it can be seen that there is a great change in the gamma characteristics, dependent upon the polar angle θ.

In this manner, in a liquid crystal display device of a comparison example that does not have the optical control member 9, the difference in the viewing angle characteristics between an orientation angle φ direction of 0° to 180° and an orientation angle φ direction of 90° to 270° is caused by the liquid crystal molecules being oriented so as to fall over only at an orientation angle φ direction of 90° to 270°.

If the polar angle θ of the viewing point of an observer in the orientation angle φ direction of 0° to 180° is varied, because the viewing point is moved in the short-axis direction of the liquid crystal molecule, the difference in birefringence of the liquid crystal molecule is not that great. In contrast, if the polar angle θ of the viewing point of the observer is varied with an orientation angle φ direction of 90° to 270°, the viewing point is moved in the long-axis direction of the liquid crystal molecule, and because the viewing point is moved further in the direction in which the liquid crystal molecules fall, the difference in birefringence is large.

In the present embodiment, as shown in FIG. 13, an optical control member 9 is disposed so that the direction in which the liquid crystal molecules 51 fall over when a voltage is applied, that is, the direction D of the directors of the liquid crystal molecules and the minor-axis direction of the light blocking layers 40 of the optical control member 9 substantially coincide. Because the direction D of the directors of the liquid crystal molecules and the absorption axes P1 and P2 of the first polarizing sheet 3 and the second polarizing sheet 7 form an angle of 45°, the minor-axis direction of the light blocking layers 40 of the optical control member 9 and the absorption axes P1 and P2 of the second polarizing sheet 7 form an angle of 45°.

Stated differently, seen from the normal line direction of the base 39, a rhombus, which is the planar shape of a light blocking layer 40 has a straight-line part that forms an angle of smaller than 45° with the absorption axis P1 and P2 of one of the first polarizing sheet 3 and the second polarizing sheet 7. In the case of the present embodiment, the straight line parts correspond to the four sides of the rhombus. In this case, if the path of travel of the light is projected onto the xy plane, the proportion of the light Lx that is incident from the x-axis direction and reflected at the reflecting surface 41c proceeding in the y-axis direction, and the light Ly that is incident from the y-axis direction and reflected at the reflecting surface 41c proceeding in the x-axis direction is large. Additionally, if the amount of light Lx incident from the x-axis direction and progressing in y-axis direction is compared with the amount of light Ly incident from the y-axis direction and progressing in the x-axis direction, the amount of light Lx incident from the x-axis direction and progressing in the y-axis direction is greater than the amount of light Ly incident from the y-direction and progressing in the x-axis direction.

The reason for the above will be described using FIG. 14A to FIG. 14F.

FIG. 14A to FIG. 14F show light blocking layers having various shapes and dispositions and the manner in which light is reflected. In FIG. 14A to FIG. 14F, the direction of progression of light is shown by arrows, these arrows being indicated as projections of the direction of progression of light onto the xy plane, and the actual light direction of progression has a z-axis direction component. The angles φ1 to φ6 are the angles formed between the light direction of incidence and the light exiting direction when projected onto the xy plane.

For example, in order to change the direction of progression of the orientation angle direction of light incident from the x-axis direction, it is sufficient that there be reflecting surface that makes an angle of greater than 0° and less than 90° with respect to the x axis.

Figure 14A:
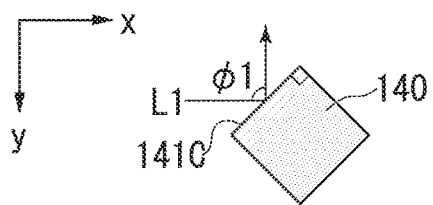
FIG. 14A is a first drawing describing the operating effect of the planar shape of the light blocking part in the present embodiment.

First, consider, as shown in FIG. 14A, a light blocking layer 40 having a square planar shape in which one side is rotated by 45° with respect to the x axis and the y axis. In this case, the reflecting surface 141c forms an angle of 45° with respect to the x axis. Consider the case in which the reflecting surface 141c is disposed facing into the paper in FIG. 14A in a direction perpendicular to the surface on which the light blocking layer 40 is formed. In this case, the light L1 incident to the reflecting surface 141c from the negative side toward the positive side of the x axis is reflected by the reflecting surface 141c, thereby changing its direction by 90° on the xy plane, so that it progresses in a direction parallel to the y axis. That is, the direction of incidence of the light L1 projected on the xy plane makes an angle φ1 of 90° with the exiting direction.

Figure 14B:
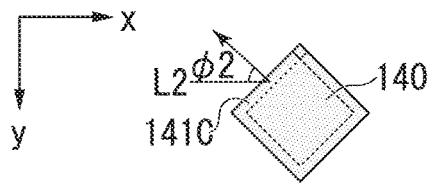
FIG. 14B is a second drawing describing the operating effect of the planar shape of the light blocking part in the present embodiment.

If, however, we consider the optical control member of the present embodiment, the reflecting surface 141c is not disposed perpendicularly with respect to the light blocking layer 140, but rather, as shown in FIG. 14B, is inclined into the paper, with an inclination toward the dashed-line square on the inside of the solid-line square (outer shape of the hollow part) indicating the outer shape of the light blocking layer 140. In this case, the angle φ2 becomes smaller than 90°, and the light L2 incident to the reflecting surface 141c from the positive side of the x axis towards the positive side is reflected at the reflecting surface 141c, after which, rather than progressing in a direction parallel to the y axis, it progresses in a direction that is inclined more with respect to the negative side of the x axis than the direction parallel to the y axis.

Figure 14C:
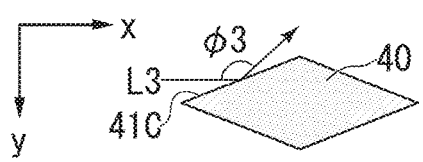
FIG. 14C is a third drawing describing the operating effect of the planar shape of the light blocking part in the present embodiment.
Figure 14D:
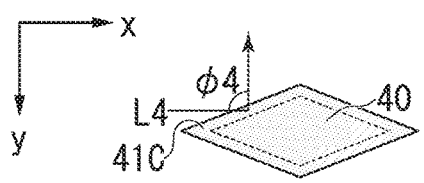
FIG. 14D is a fourth drawing describing the operating effect of the planar shape of the light blocking part in the present embodiment.

In contrast to the above, as shown in FIGS. 14C and 14D, as in the present embodiment, consider a case in which the light blocking layers 40 in the rhombus are disposed so that the major-axis directions thereof face in the x-axis direction. In this case, as shown in FIG. 14C, if it is assumed that the reflecting surface 41c is disposed so as to be in a direction perpendicular to the surface on which the light blocking layers 40 are formed, the angle φ3 becomes larger than 90°, and the light L3 incident to the reflecting surface 41c from the negative side of the x axis toward the positive side is reflected at the reflecting surface 41c, after which, rather than progressing in a direction parallel to the y axis, it progresses in a direction that is inclined more with respect to the positive side of the x axis than the direction parallel to the y axis. However, as shown in FIG. 14D, the actual reflecting surface 41c is inclined toward the dashed-line rhombus (outer shape of the hollow part) indicated inside the solid-line rhombus indicating the outer shape of the light blocking layer 40. This enables the angle φ4 to be made 90°, so that the light L4 incident to the reflecting surface 141c from the negative side toward the positive side of the x axis is reflected at the reflecting surface 141c, after which it proceeds in a direction parallel to the y axis.

Figure 14E:
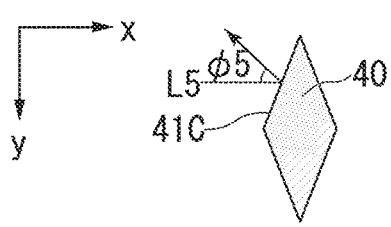
FIG. 14E is a fifth drawing describing the operating effect of the planar shape of the light blocking part in the present embodiment.
Figure 14F:
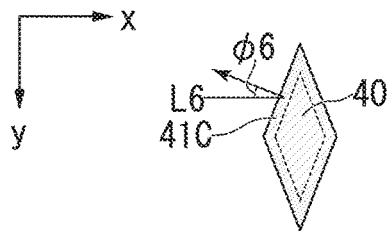
FIG. 14F is a sixth drawing describing the operating effect of the planar shape of the light blocking part in the present embodiment.

As a comparison example, consider the case in which, as shown in FIG. 14E and FIG. 14F, in contrast to the present embodiment, the rhombic light blocking layers 40 are disposed so that the long-axis direction is directed in the y-axis direction. In this case, as shown in FIG. 14E, if we assume that the reflecting surface 41c is disposed in the direction perpendicular to the plane in which the light blocking layer 40 is formed, the angle φ5 is smaller than 90°, and the light L5 that is incident to the reflecting surface 41c from the negative x-axis side toward the positive side, is reflected by the reflecting surface 41c, after which, rather than progressing in the direction parallel to the y axis, it progresses in a direction that is inclined toward the negative side of the x axis more than the direction parallel to the y axis. However, as shown in FIG. 14F, because the actual reflecting surface 41c is inclined, the angle φ6 is even smaller than the angle φ5, so that the light L6 incident to the reflecting surface 141c from the negative side of the x axis toward the positive side is reflected by the reflecting surface 141c, after which it progresses in a direction inclined to the negative side of the x axis more than the direction parallel to the y axis.

As described above, if we compare the three cases of when the light blocking layers 140 have a planar shape that is square, when the planar shapes of the rhombic light blocking layers 40 are disposed so that the long-axis directions thereof are directed toward the x axis, and when the planar shapes of the rhombic light blocking layers 40 are disposed so that the long-axis directions thereof are directed toward the y axis, the amount of light that is incident to the reflecting surface from a direction parallel to the x axis and progresses in a direction parallel to the y axis is the greatest when the planar shape of the rhombic light blocking layers 40 is disposed so that the long-axis direction thereof is directed toward to the x axis.

From the above, if the amount of light incident from the x-axis direction and progressing in the y-axis direction is compared with the amount of light incident from the y-axis direction and progressing in the x-axis direction, the amount of light incident from the x-axis direction and progressing in the y-axis direction is greater than the amount of light incident from the y-axis direction and progressing in the x-axis direction.

Stated differently, in the case of the present embodiment, light that is incident to the optical control member 9 from an orientation angle φ of 0° to 180° direction is reflected by the reflecting surface 41c of the light diffusion part 41 that is disposed opposite the planar shape of the rhombic light blocking layer 40 and exits at an orientation angle φ direction of 90° to 270°. When that occurs, because the inclination angle θc of the light diffusion part 41 is smaller than 90° (refer to FIG. 6), the polar angle θ of the progression direction of the light is changed to an angle that is larger than before striking the optical control member 9. As described using FIG. 16, if the optical control member 9 were not to be used, the difference in viewing angle characteristics is large at orientation angle φ directions from 90° to 270° and φ directions of 0° to 180°. In order to solve this problem, the optical control member 9 can be used to intentionally mix light that progresses in the orientation angle φ direction of 0° to 180° into the orientation angle φ direction from 90° to 270°, which has deteriorated viewing angle characteristics, thereby alleviating the difference in angle characteristics due to the direction, and averaging the dispersion of variations in luminance to improve the change in the gamma characteristics depending on the polar angle θ in the orientation angle φ direction from 90° to 270°.

Figure 17:
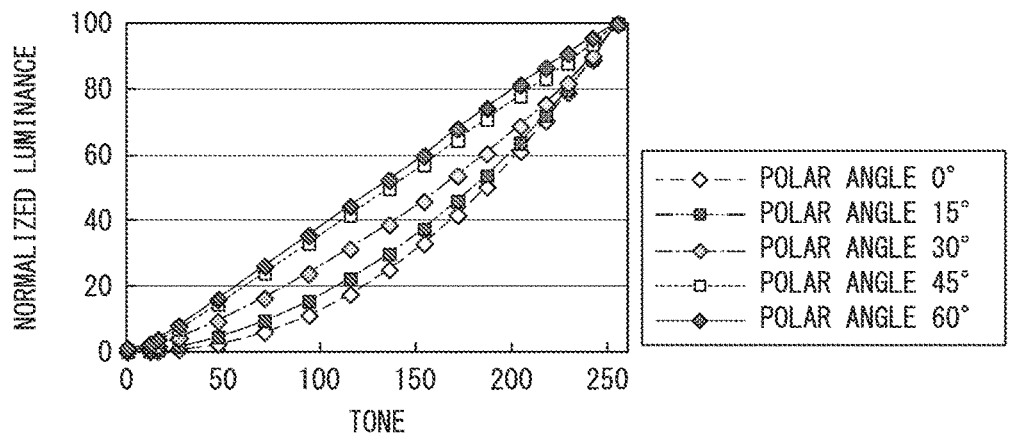
FIG. 17 shows the gamma characteristics for the case of varying the polar angle θ at an orientation angle φ of 90° in a liquid crystal display device of the first embodiment.

FIG. 17 shows the gamma characteristics for the case of varying the polar angle θ at an orientation angle φ of 90° in the liquid crystal display device 1 of the present embodiment. In FIG. 17, the vertical axis represents tone, and the horizontal axis represents the normalized luminance. FIG. 17 shows the gamma characteristics at polar angles θ of 0°, 15°, 30°, 45°, and 60°. According to the graph in FIG. 17, it can be seen that, compared with the case of a liquid crystal display device not having the optical control member shown in FIG. 16, the change in gamma characteristics depending on the polar angle θ is small. In particular at a polar angle θ of 45° or greater, the gamma characteristics approach those at a polar angle θ of 0°. From this, it can be seen that, when the liquid crystal display device is viewed from a direction that is inclined, at an orientation angle φ of 90°, the change in color is alleviated.

Although FIG. 17 shows the change in gamma characteristics at an orientation angle φ of 90°, the change in gamma characteristics at an orientation angle φ of 270 are equivalent to those shown in FIG. 17. The reason for this is the adoption of a two-domain VA system as the constitution of the pixels in the present embodiment. Because the liquid crystal molecules 51 in each of the domains 50a and 50b are mutually inclined and oriented in directions that differ by 180° at an orientation angle φ direction of 90° to 270°, the gamma characteristics at an orientation angle φ of 90° are equivalent to the gamma characteristics at an orientation angle φ of 270°. In the same manner, although FIG. 15 shows the change in gamma characteristics at an orientation angle φ of 0°, the change in gamma characteristics at an orientation angle φ of 180° is also equivalent to that shown in FIG. 15. Also, although FIG. 16 shows the change in gamma characteristics at an orientation angle φ of 90°, the change in gamma characteristics at an orientation angle φ of 270° is also equivalent to that shown in FIG. 16.

In this manner, in a liquid crystal display device that adopts a two-domain VA arrangement, by combining the optical control member 9 of the present embodiment, the viewing angle characteristics at an orientation angle φ direction of 90° to 270°, which is the direction of the director of the liquid crystal molecules 51, are improved. Although, in a conventional two-domain VA liquid crystal display device, the viewing angle characteristics at an orientation angle φ direction of 0° to 180°, which is perpendicular to the direction of falling over of the liquid crystal molecule is good, by combing this with the optical control member 9 of the present embodiment, the effect is obtained of the viewing angle characteristics at an orientation angle φ direction of 90° to 270° being further improved, and the difference in viewing angle characteristics dependent on the orientation angle being decreased. In particular in a high-definition display, the viewing angle characteristics can be improved while maintaining the high transmissivity without making the constitution within a cell complex.

(Method of Manufacturing a Liquid Crystal Display Device)

FIG. 18 to FIG. 21 are oblique views showing the sequence of process steps in the process of manufacturing the optical control member 9.

The method of manufacturing the liquid crystal display device 1 of the above-noted constitution will now be described, focusing on the process of manufacturing the optical control member 9.

The description of the process of manufacturing the liquid crystal panel 2 will be described first.

First, the TFT substrate 10 and the color filter substrate 12 are each manufactured. After that, the surface on the side of the TFT substrate 10 on which the TFTs 19 are formed and the surface on the side of the color filter substrate 12 on which the color filters 31 are formed are brought into opposition with each other. After that, the TFT substrate 10 and the color filter substrate 12 are adhered together with an intervening sealing member. After that, a liquid crystal is injected into the space surrounded by the TFT substrate 10, the color filter substrate 12, and the sealing member. Optical adhesive or the like is used to adhere a first phase difference film 4, a first polarizing sheet 3, a second phase difference film 6, and a second polarizing sheet 7 to both sides liquid crystal cell 5 made in the above-noted manner. The above-noted process steps complete the liquid crystal panel 2.

The methods of manufacturing the TFT substrate 10 and the color filter substrate 12 may be conventional methods, the description of which will be omitted.

The process of manufacturing the optical control member 9 will now be described.

Figure 18:
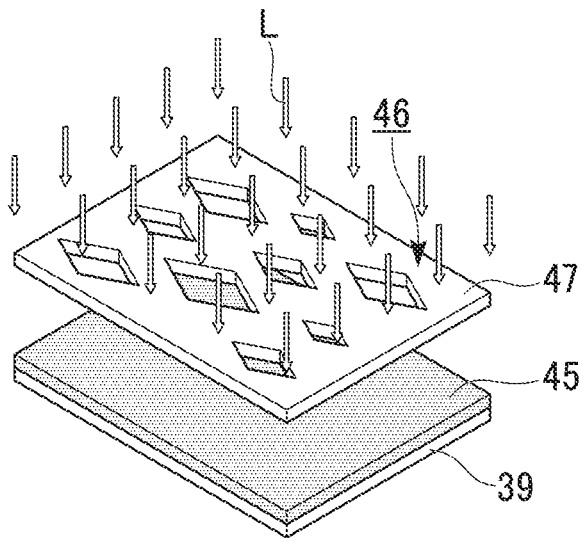
FIG. 18 is an oblique view of one process step in the method of manufacturing an optical control member of the first embodiment of the present invention.

As shown in FIG. 18, a base 39 of polyethylene terephthalate having a thickness of 100 μm is prepared. Next, a slit coater is used to coat black negative resist that has carbon as a light blocking layer material over the entire surface of the base 39. This forms a coating film 45 having a thickness of 150 nm.

A heater is used to heat the coating film 45 noted above and prebake the coating film 45 at a temperature of 90°. This evaporates away the solvent of the black negative resist.

A stepper is used to perform exposure, by shining a light L onto the coating film 45 via a photomask 47 in which a plurality of, for example, the aperture patterns 46, which have a planar rhombus shape are formed. When this is done, a stepper is used that utilizes a mixed beam having an i beam having a wavelength of 365 nm, an h beam having a wavelength of 404 nm, and a g beam having a wavelength of 436 nm. The exposure dose is 100 mJ/cm$^2$.

After exposure using the above-noted photomask 47, the coating film 45 made of black negative resist is developed using a special developer and dried at 100° C., so as to form over the entire surface of the base 39, a plurality of, for example, light blocking layers 40, as shown in FIG. 19, with a planar rhombic shape. In the case of the present embodiment, in the next process step a transparent negative resist is exposed, with the light blocking layers 40 made of black negative resist as a mask, so as to form the hollow parts 42. The positions of the aperture patterns 46 of the photomask 47 are thus opposite the positions at which the hollow parts 42 are formed.

The light blocking layers 40 with planar rhombic shapes correspond to the regions in which the light diffusion parts 41 are not formed (the hollow parts 42) in the next process step. In this example, the plurality of aperture patterns 46 are all rhombus-shaped patterns. These are constituted by patterns with various major axes and minor axes. The disposition of spacing (pitch) between neighboring aperture patterns 46 is neither regular nor periodic. It is desirable that the spacing (pitch) between aperture patterns 46 be smaller than the spacing (pitch) between pixels of the liquid crystal panel 2 (for example, 60 μm). This forms at least one light blocking layer 40 within a pixel. For that reason, there is a particular broad viewing angle achieved when used in combination with a high-definition display.

Although in the present embodiment light blocking layers 40 are formed using photolithography that utilizes black negative resist, this is not a restriction. Alternatively, if a photomask in which the aperture patterns 46 in the present embodiment are reversed from the light blocking patterns, it is possible to use a positive resist that absorbs light. The light blocking layers 40 may be directly formed, using deposition, printing, or the like.

For example, if the light blocking layers are formed by printing using an ink jet method, the light blocking layers 440F are constituted as a plurality of point-like parts 440a, as shown in FIG. 57. The point-like part 440a is a dot, which is the smallest unit constituting the pattern formed by the printer. In this manner, the light blocking layers are not restricted to being constituted by a uniform film, but may constituted by an aggregate of a plurality of minute regions.

If the light blocking layers are formed continuously by a roll-to-roll process using photolithography, rather than a flat photomask, a rolling-mask photolithographic method using a cylindrical photomask and a UV lamp within the cylindrical mask may be used.

Continuing, as shown in FIG. 20, a slit coater is used to coat a transparent negative resist made of an acrylic resin onto the upper surface of the light blocking layers 40 as a light diffusion part member. This forms a coating film 48 having a thickness of 20 μm.

Next, the base 39 on which the above-noted coating film 48 is formed is heated by a heater, and coating film 48 is prebaked at a temperature of 95°. This evaporates away the solvent of the transparent negative resist.

Continuing, exposure is done by shining a diffused light F from the base 39 side onto the coating film 48 via the light blocking layers 40 used as a mask. When this is done, a stepper is used that utilizes a mixed beam having an i beam having a wavelength of 365 nm, an h beam having a wavelength of 404 nm, and a g beam having a wavelength of 436 nm. The exposure dose is 500 mJ/cm$^2$.

After the above, the base 39 onto which the above-noted coating film 48 is formed is heated by a heater to subject the coating film 48 to post-exposure baking (PEB) at a temperature of 95° C.

Next, a special developer is used to develop the coating film 48, which is made of a transparent negative resist, post-baking is done at 100° C. and, as shown in FIG. 21, a transparent resin layer 41 having a plurality of hollow parts 42 is formed over the entire surface of the base 39. In the present embodiment, as shown in FIG. 20, because exposure is done using the diffused light F, the transparent negative resist forming the coating film 48 is exposed in radiating fashion, broadening outward from the region in which the light blocking layers 40 are not formed. This forms the forward-tapered hollow parts 42. The light diffusion part 41 has a reverse-tapered shape. The inclination angle of the reflecting surface 41c of the light diffusion part 41 can be controlled by the degree of diffusion of the diffused light F.

Parallel light, diffused light, or light having a relative intensity at a specific exiting angle that is different from the intensity at a different exiting angle, that is, light having intensity that varies with a specific exiting angle, can be used as the light F in this case. If parallel light is used, the inclination angle of the reflecting surface 41c of the light diffusion part 41 is a single inclination angle of, for example, approximately 60° to 90°. If diffused light is used, the inclined surface has a curved line cross-section shape, in which the inclination angle changes continuously. If light having intensity that varies with the specific exiting angle is used, the inclined surface has an inclination angle corresponding to the relative intensity. In this manner, the inclination angle of the reflecting surface 41c of the light diffusion part 41 can be adjusted, thereby enabling adjustment of the light-diffusing characteristics of the optical control member 9 so as to obtain the desired visibility.

One means of shining the parallel light F exiting from a stepper onto the base 39 may be, for example, that of disposing a light-diffusing sheet with a haze of approximately 50 in the light path of the light exiting from the stepper, so that light is shined through the light-diffusing sheet.

When developing using a developer, the developer may be pressurized and sprayed onto a transparent negative resist, to promote removal of unwanted resist.

By proceeding through the steps of the above-noted FIG. 18 to FIG. 21, the optical control member 9 of the present embodiment is completed.

Overall light transmissivity of the optical control member 9 is preferably 90% or greater. If the overall light transmissivity is 90% or greater, sufficient transparency is achieved, and the optical performance demanded from the optical control member is sufficient achieved.

The overall light transmissivity is set forth in MS standard K7361-1. In the present embodiment, although the example of using a liquid resist has been given, a film resist may be used in place of this constitution.

Finally, the completed optical control member 9, as shown in FIG. 2, is adhered to the liquid crystal panel, via an adhesive layer, with the base 39 facing the viewing side and the light diffusion part 41 opposite the second polarizing sheet 7.

When the optical control member 9 is adhered to the liquid crystal panel 2 via the adhesive layer, heating and pressure application may be done. By heating and applying pressure, in addition to improving the intimate contact of the optical control member 9 with respect to the liquid crystal panel 2, the pressure can reduce the inclination angle of the reflecting surface 41c of the light diffusion part 41 and increase the light-diffusing properties. A method that can be used for heating and applying pressure is, for example, using an autoclave or a heating laminator.

The above process steps complete the liquid crystal display device 1 of the present embodiment.

In the liquid crystal display device 1 of the present embodiment, because the optical control member 9 is disposed on the out light exit side of the liquid crystal panel 2, by the optical control member 9, the mixing of light at different positions alleviates the directional dependence of the viewing angle characteristics. Therefore, if an observer is at an inclination to either direction from straight-on (normal line direction) of the liquid crystal display device 1, it is possible to view a good display, thereby enabling the provision of a liquid crystal display device 1 having superior viewing angle characteristics.

It is known that, in general, if patterns having regularity, such as stripes or a matrix are overlapped, if the frequency of the patterns are slightly skewed, interference stripes (moire pattern) are seen. For example, if an optical control member having a plurality of light diffusion parts arranged in a matrix is overlaid with a liquid crystal panel having a plurality of pixels in a matrix arrangement, a moire pattern will occur between the periodic pattern of the light diffusion parts of the optical control member and the periodic pattern of the pixels in the liquid crystal panel, thereby risking a lowering of the display quality.

In contrast, in the liquid crystal display device 1 of the present embodiment, the plurality of light blocking layers 40 are arranged randomly in a plane. The light diffusion part 41 is formed in regions other than those in which the light blocking layers 40 are formed. For that reason, a moire pattern does not occur due to interference by light with the regular arrangement of the pixels of the liquid crystal panel 2, making it possible to maintain the display quality.

Although in the present embodiment the disposition of the plurality of light blocking layers 40 has been random, it is not necessary that the plurality of light blocking layers 40 be randomly disposed. As long as the disposition of the plurality of light blocking layers 40 is non-periodic, it is possible to suppress the occurrence of a moire pattern. Additionally, if the situation and application allows the occurrence of a moire pattern to some extent, the plurality of light blocking layers 40 may be periodically disposed.

In the present embodiment, there is no particular restriction regarding the thickness of the color filter substrate 12. The relationship between the thickness of the TFT substrate 10 and the thickness of the color filter substrate 12, as shown in FIG. 22, may be such that the thickness dc of the color filter substrate 12 is larger than the thickness dt of the TFT substrate 10. As shown in FIG. 23, the thickness dc of the color filter substrate 12 may be smaller than the thickness dt of the TFT substrate 10. However, in the case of a liquid crystal display device provided with the optical control member 9, as shown in FIG. 22, the greater the distance separating the color filters 31 and the light diffusion part 41, the larger becomes the light-path difference K between the light L11 reflected by the light diffusion part 41 and the light L12 that passes through as is. For that reason, there is a possibility of the blurring being perceived when viewing from an inclination.

From the above standpoint, therefore, in order to shorten the distance between the color filters 31 and the light diffusion part 41, it is desirable that the color filter substrate 12 disposed on the optical control member 9 side be thinner than the TFT substrate 10. For example, if the thickness of the color filter substrate 12 is reduced to 0.5 mm with respect to the thickness 0.7 mm of the TFT substrate 10, there is an approximately 28% improvement of the blurring compared to using a color filter substrate having a thickness of 0.7 mm, and there is an approximately 86% improvement if the thickness is further reduced to 0.1 mm, making this very effective.

The method known as dithering may be combined as a method of drive. Dithering is a method whereby the display tones are pseudo-increased by purposely changing the display tone of a plurality of neighboring pixels. For example, if the tones (128, 128, 128, 128) are displayed for four neighboring pixels, the tones of all four pixels are simultaneously raised by one to (129, 129, 129, 129). In contrast, if the tone of one of the four pixels is first increased by one (129, 128, 128, 128) and then the tone of one more pixel is increased by one (129, 129, 128, 128), and so on, one pixel at a time in sequence, it is possible to render four pseudo-intermediate tones for the four pixels. This means an increase of two bits in tone, so that an 8-bit driver would able to render 10 bits of tone, a 10-bit driver would be able to render 12 bits of tones, and a 12-bit driver would be able to render 14 bits of tones. The liquid crystal display device of the present embodiment enables improvement of the viewing angle characteristics at an inclination, without a reduction of the contrast when viewing the liquid crystal panel straight on. For that reason, by combining with dithering drive it is possible to render fine differences in color from straight on or at an inclination. The dithering method may be one such as above, in which a plurality of spatially different pixels are used, or one that renders pseudo-tones with by time-division.

Second Embodiment

The second embodiment of the present invention will be described below using FIG. 24.

The basic constitution of the liquid crystal display device of the present embodiment is the same as that of the first embodiment, and the difference from the first embodiment is the disposition of a plurality of light diffusion parts in the optical control member. For that reason, in the present embodiment, the description will be of the optical control member.

FIG. 24 is a schematic representation of an optical control member 309. In FIG. 24, the upper-left is a plan view of the optical control member 309, the lower-left is a cross-sectional view along the line C-C in the plan view in the upper-left, and the upper-right is a cross-sectional view along the line D-D in the plan view in the upper-left.

In the optical control member 309 of the present embodiment, as shown in the upper-left of FIG. 24, a plurality of light diffusion parts 341 are provided scattered over the surface of the base 339. The planar shapes of the light diffusion parts 341 when seen from the normal line direction of the base 339 are thin rhombi, and their planar shapes have a major axis and a minor axis. That is, in the optical control member 309 of the present embodiment, the positional relationship between the light diffusion parts 341 and the light blocking layers 340 when seen from the normal line direction of the base 339 is the reverse of the optical control member 9 in the first embodiment.

The lower-left of FIG. 24, as shown in the upper-right, the part corresponding to below the light blocking layer 340 is the hollow part 342. Air exists in the hollow part 342. The optical control member 309 has a continuous hollow part 342 in which air exists. A plurality of light diffusion parts 341 are provided scatter in the parts other than the hollow part 342.

The long axis of the rhombic shapes that are the planar shapes of the plurality of light diffusion parts 341 are substantially aligned in the x-axis direction. The short axes of the rhombic shapes that are the planar shapes of the plurality of light diffusion parts 341 are substantially all aligned in the y direction. From this, if we consider the orientation of the reflecting surfaces 341c of the light diffusion parts 341, similar to the first present embodiment, of the light incident to the reflecting surfaces 341c from x-axis direction, the proportion of light reflected toward a direction parallel to the y-axis direction is larger than light returning inclined toward the x-axis direction with respect to the y axis.

In the present embodiment, an optical control member 309 is disposed on the light-exiting side of the liquid crystal panel 2. Additionally, in the center part in the thickness direction of the liquid crystal layer 11, when a voltage is applied to the liquid crystal panel 2, the orientation angle (orientation angle φ of the direction 90° to 270°) in which the liquid crystal molecules fall substantially coincides with the short-axis direction of the light diffusion parts 341 of the optical control member 309.

Even if the optical control member 309 of the present embodiment is used, similar to the first embodiment, a change in the gamma characteristics when the display screen is viewed at an inclination from any direction is suppressed, and it is possible to achieve a display image with superior viewing angle characteristics.

The planar shapes of the light diffusion parts 341 need not be rhombic at all of the light diffusion parts 341, and may include circular, elliptical, polygonal, semicircular, or other shapes. The aperture parts of light diffusion parts 341 may be formed so as to overlap.

Third Embodiment

The third embodiment of the present invention will now be described, using FIG. 25 to FIG. 29 and FIG. 58 to FIG. 62.

The basic constitution of the liquid crystal display device of the present embodiment is the same as that of the first embodiment, and the difference from the first embodiment is the planar shapes of the light blocking layers in the optical control member.

In the present embodiment, therefore, the description of the basic constitution of the liquid crystal display device will be omitted, and the light blocking layers will be described.

FIG. 25 to FIG. 29 are plan views of the light blocking layers of the present embodiment.

Specifically, the planar shape of the light blocking layer 440A shown in FIG. 25 is hexagonal. This hexagonal shape is the rhombic shape that is the planar shape of the light blocking layer 40 of the first embodiment, with the corner parts at the top and bottom cut by straight lines parallel to the x axis.

The planar shape of the light blocking layer 440B shown in FIG. 26 is octagonal. This octagonal shape is the rhombic shape that is the planar shape of the light blocking layer 40 of the first embodiment, with the corner parts at the top and bottom cut by straight lines parallel to the x axis, and also the corner parts on the left and right cut by straight lines parallel to the y axis.

The planar shape of the light blocking layer 440C shown in FIG. 27 is the rhombic shape that is the planar shape of the light blocking layer 40 of the first embodiment, with the four corner parts rounded.

The light blocking layer having the octagonal constitution shown in FIG. 26 will now be described more specifically.

FIG. 58 is a plan view illustrating the light blocking layer of FIG. 26 more specifically.

The planar shape of the light blocking layer 440B shown in FIG. 58 is a rhombic shape with the four corner parts cut away by straight lines to form an octagon. This octagonal shape is the rhombic shape that is the planar shape of the light blocking layer 40 of the first embodiment, with the left and right corner parts 40A cut by straight lines parallel to the y axis, and also with the upper and lower corner parts 40B cut away by straight lines parallel to the x axis. That is, the light blocking layer 440B has first straight line parts 441 where the left and right corner parts 40A of the rhombus are cut by straight lines parallel to the y axis, second straight line parts 442 where the upper and lower corner parts 40B of the rhombus are cut by straight lines parallel to the x axis, and inclined side parts 443 constituted by the inclined sides of the rhombus before the cutting away. The angle formed by the second straight line parts 442 and the inclined side parts 443 is, as one example, 33.7°. This angle can be adjusted appropriately as needed in accordance with the required viewing angle characteristics. The total length of the inclined side parts 443 is greater than the total of the lengths of the first straight line parts 441 and the second straight line parts 442. The length h1 of the perpendiculars dropped from the left and right corner parts 40A down to the first straight line parts 441 is greater than the length h2 of the perpendiculars dropped from the upper and lower corner parts 40B of the rhombus to the second straight line parts 442.

The optical control member having the planar shape of the light blocking layer 440B has first reflecting surfaces 441c having the first straight line parts 441, second reflecting surfaces 442c having the second straight line parts 442, and third reflecting surfaces 443c having the inclined side parts 443.

FIG. 59 shows the reflection of light by the optical control member having a light blocking layer 440B. In FIG. 59, the direction of progression of light is shown by arrows. However, these arrows indicate the direction of progression of light projected onto the xy plane, and the actual light direction of progression has a z-axis direction component.

Consider the case of a light blocking layers 440B disposed with the long-axis direction in the x-axis direction. The first reflecting surfaces 441c, the second reflecting surfaces 442, and the third reflecting surfaces 443c are at inclinations that face the broken-line octagon (outer shape of the hollow part) indicated inside of the solid-line rhombus that indicates the outer shape of the light blocking layer 440B. The inclination angles are set so that light incident from a direction perpendicular to the drawing surface from the rear (polar angle of 0°) has a maximum intensity of reflected light at a polar angle θ of 30°.

At the third reflecting surfaces 443c, similar to the optical control member 4 of the first embodiment, light incident from an orientation angle φ direction of 0° and a polar angle of 20° of the liquid crystal panel 2 is mixed with light exiting at an orientation angle φ direction of 90°. In contrast, at the first reflecting surfaces 441, light incident from an orientation angle φ direction of 0° and a polar angle of 20° of the liquid crystal panel 2 is oriented to the high polar angle side at the orientation angle φ direction of 0°. At the second reflecting surfaces 442, light incident from an orientation angle φ direction of 0° and a polar angle of 20° of the liquid crystal panel 2 exits in the orientation angle direction 125°.

FIG. 60A and FIG. 60B show the transmitted light distribution of parallel light incident to the optical control member from a direction perpendicular to the drawing surface from the rear (polar angle of 0°), FIG. 60A showing the case in which the shape of the light blocking layers in the first embodiment are rhombi, and FIG. 60B showing the case in which the shape of the light blocking layers shown in FIG. 58 are octagonal.

As shown in FIG. 60A, in the case of rhombic light blocking layers, light incident to the optical control member is distributed with high intensity in four directions by the optical control member. In contrast, as shown in FIG. 60B, in the case of the octagonal light blocking layers 440B, light incident to the optical control member, in addition to being distributed in four directions with high intensity by the optical control member, is further distributed in four directions with medium intensity. This is because the parallel light is reflected by the first reflecting surfaces 441c and the second reflecting surfaces 442c.

This phenomenon is limited to the case in which parallel light is shined from a direction perpendicular to the drawing surface from the rear (polar angle of 0°). For example, even in the case in which light is incident from an orientation angle φ direction of 0 to 180° of the liquid crystal panel 2, by providing the first reflecting surfaces 441c and the second reflecting surfaces 442c, the directions in which light exits are increased as shown in FIG. 59.

For that reason, light incident from an orientation angle φ direction of 0 to 180° of the liquid crystal panel 2 not only is mixed with light exiting at an orientation angle φ direction of 90° to 270°, but also can be mixed at a different orientation angle. That is, by making the shape of the light blocking layers a shape in which a part of the rhombus is cut away, it is possible to increase the viewing angle characteristics.

When this is done, the total length of the inclined side parts 443 is greater than that of the first straight line parts 441 and the second straight line parts 442. If the proportion of the light blocking layers 440B occupied by the first straight line parts 441 and the second straight line parts 442 becomes large, the exiting amount from the orientation angle φ direction from 90° to 270° decreases commensurately.

As described earlier, the change in the gamma characteristics dependent upon the polar angle θ is greatest at an orientation angle φ direction from 90° to 270°. For that reason, if the total length of the inclined side parts 443 is greater than the total length of the first straight line parts 441 and the second straight line parts 442, the change in the gamma characteristics dependent upon the polar angle θ at an orientation angle φ direction from 90° to 270° can be sufficiently reduced.

FIG. 61 and FIG. 62 are plan views of other forms of light blocking layers according to the present embodiment. As shown in FIG. 61 and FIG. 62, it is not necessary to cut away the light blocking layers 440F and 440G at the end parts in both the x-axis direction and y-axis direction of the rhombi circumscribing them.

In a liquid crystal display device adopting a two-domain VA system, as shown in FIG. 15 and FIG. 16, in contrast to the change in gamma characteristics in the case of observing while varying the polar angle θ in the orientation angle φ direction from 0° to 180° (the x-axis direction in FIG. 61) in a liquid crystal display device having pixels being relatively small, the change in gamma characteristics in the case of varying the polar angle θ in the orientation angle φ direction from 90° to 270° (the y-axis direction in FIG. 61) is relatively large. For that reason, light that exits in the orientation angle φ direction from 0° to 180° of the liquid crystal display is preferably distributed and mixed at other orientation angles. When the end parts in the x-axis direction of the rhombus circumscribing the light blocking layers 440F and 440G are cut away, the light exiting in the orientation angle φ direction from 0° to 180° can be mixed at other directions. In contrast, when the end parts in the y-axis direction of the rhombus circumscribing the light blocking layers 440F and 440G are cut away, the light exiting in the orientation angle φ direction from 90° to 270° can be mixed at other directions. For that reason, considering the use of a liquid crystal display device that utilizes the two-domain VA system, it is preferable that the end parts in the x-axis direction of the rhombi that circumscribe the light blocking layers be cut away.

Specifically, the planar shape of the light blocking layer 440F shown in FIG. 61 is a shape in which the left and right corner parts of the rhombus that is the planar shape of the light blocking layer 40 of the first embodiment are cut by two straight lines that intersect.

The planar shape of the light blocking layer 440G shown in FIG. 62 is the shape of the light blocking layer 440F shown in FIG. 61, with the left and right corner parts cut by straight lines parallel to the y axis.

With either of these shapes, light incident to the optical control member can exit at an inclination existing between the orientation angle φ direction from 0° to 180° and the polar angle φ direction from 90° to 270°.

As shown in the light blocking layers 440A, 440B, 440C, 440F, and 440G shown in FIG. 25 to FIG. 27 and FIG. 58, FIG. 60A, FIG. 60B, and FIG. 61, all of the edges of the graphic shapes forming the planar shapes of the light blocking layers need not be constituted by straight line parts that intersect at an inclination with respect to the x axis and the y axis. At least one part of the edges of the graphic shapes forming the planar shapes of the light blocking layers can be a straight line part intersecting at an inclination with the x axis and the y axis. Therefore, a part of the graphic shape forming the planar shape of a light blocking layer may include a straight line part parallel to the x axis, or a straight line part parallel to the y axis, or a rounded part. When combined with a liquid crystal panel, all of the edges of the graphic shapes forming the planar shapes need not be constituted by straight line parts that intersect at an inclination with the directors of liquid crystal molecules. It is sufficient that at least a part of the edges of the graphic shapes forming the planar shapes of the light blocking layers be straight line parts that intersect at an inclination with the directors of the liquid crystal molecules.

Although the planar shape of the light blocking layer 440D shown in FIG. 28 is basically a rhombus, the sides are not straight lines, but rather have fine unevennesses. These unevennesses may be regular shapes, or may be irregular shapes. In the light blocking layer 440D as well, if the amplitude H of the unevennesses is sufficiently small with respect to the dimensions of the light blocking layer 440D, for example approximately ⅒ of the minor axis dimension B2, these can be treated as being straight lines.

In the first embodiment, it has been described that it is desirable that the major-axis direction of the light blocking layers having a rhombic planar shape be disposed so as to be directed toward the x-axis direction. However, it is not that a light blocking layer having a square planar shape or a rhombic planar shape with the major-axis direction oriented in the y-axis direction cannot be used. Although the effect is somewhat reduced, a light blocking layer 440E such as shown in FIG. 29 having a square planar shape and a straight line part that intersects at an inclination with the x axis and the y axis may be used. Alternatively, a light blocking layer having a rhombic planar shape with the major-axis direction oriented toward the y-axis direction may be used. A light blocking layer with a major axis disposed so as to be inclined from the x-axis direction may be used. When this is done, it is not necessary for the angle of inclination of the individual plurality of light blocking layers to coincide. It is preferable that the average value of the angle formed by the major axes of the light blocking layers with the x axis be 0°±5°. That is, when viewing the overall optical control member, it is preferable that the inclination of the major axes of the light blocking layers substantially coincides with the x-axis direction. A "rhombus" as used in the present invention is a quadrangle having four sides of substantially the same length, this including the concept of not only a quadrangle with four sides having substantially equal lengths and four internal angles that are not 90°, but also a quadrangle in which the four internal angles that are 90°, that is, a square.

In the present embodiment, when a certain voltage is applied to the liquid crystal panel 2, the short-axis direction of the light blocking layers 440A, 440B, 440C, 440D, 440F, and 440G and the orientation angle direction in which the liquid crystal molecules 51 fall (orientation angle φ direction from 90° to 270°) substantially coincide. The diagonal line direction of the light blocking layer 440E and the orientation angle direction in which the liquid crystal molecules 51 fall (orientation angle φ direction from 90° to 270°) when a certain voltage is applied to the liquid crystal panel 2 substantially coincide.

Using the light blocking layers 440A to 440G of the present embodiment as well, a change in the gamma characteristics when the display screen is viewed at an inclination from any direction is suppressed, and it is possible to achieve a liquid crystal display device with superior viewing angle characteristics.

Fourth Embodiment

The fourth embodiment of the present invention will now be described, using FIG. 30 to FIG. 33.

The basic constitution of the liquid crystal display device of the present embodiment is the same as that of the first embodiment, and the difference from the first embodiment is the constitution of the light blocking layers in the optical control member.

In the present embodiment, therefore, the description of the basic constitution of the liquid crystal display device will be omitted, and the optical control member will be described.

FIG. 30 to FIG. 33 are plan views of optical control members 509A, 509B, 509C, and 509D of the present embodiment.

As shown in FIG. 30 to FIG. 33, the optical control members 509A, 509B, 509C, and 509D of the present embodiment have light blocking layers with a different constitution from the optical control member 9 of the first embodiment.

Specifically, in the optical control member 9 of the first embodiment, the ratio of the major-axis dimension B1 to the minor-axis dimension B2 is substantially uniform across all the light blocking layers 40. In contrast, as shown in FIG. 30 in the optical control member 509A of the present embodiment, there is a mixture of light blocking layers 540A, having different ratios of the major-axis dimension B1 to the minor-axis dimension B2. It is desirable that the ratios of the major-axis dimension B1 with respect to the minor-axis dimension B2 be in the range from 1 or greater up to and including 3.

In the optical control member 9 of the first embodiment, the major-axis direction of all the light blocking layers 40 is oriented in the orientation angle φ direction from 0° to 180°. In contrast, as shown in FIG. 31, in the optical control member 509B of the present embodiment, of the plurality of light blocking layers 540B, the major axis of some of the light blocking layers 540B is oriented in a direction that differs from the major axis of other light blocking layers 540B. The major axis direction of some of the light blocking layers 540B is offset from the orientation angle φ direction from 0° to 180°.

In the optical control member 9 of the first embodiment, all the light blocking layers 40 are scattered over the base 39. In contrast, as shown in FIG. 32, in the optical control member 509C of the present embodiment, some of the plurality of light blocking layers 540C are linked to some other light blocking layers 540C.

In the optical control member 9 of the first embodiment, the planar shape of all the light blocking layers 40 is rhombic. In contrast, as shown in FIG. 33, in the optical control member 509D of the present embodiment, some of the plurality of light blocking layers 540D are circular or elliptical. In additional to circular or elliptical, there may be a mixture of light blocking layers having other shapes, such as hexagonal and the like.

FIG. 63 shows a more specific example of the optical control member 509D, which has a mixture of light blocking layers 540E, which have a rhombic planar shape, and light blocking layers 540F, which have a circular planar shape. In the optical control member 509D, the number of the rhombic light blocking layers 540E is greater than the number of circular light blocking layers 540F. The distance r1 between opposite sides of the rhombic light blocking layers 540E and the diameter r2 of the circular light blocking layers 540F are substantially equal. In this case, the distance between opposite sides of a rhombus means the minimum distance between one side of the rhombus and a side opposite thereto.

FIG. 64 is the transmitted light distribution of parallel light incident to the optical control member 509D in the direction perpendicular to the drawing from the rear (polar angle 0°). As shown in FIG. 64, light that has passed through the optical control member 509D is distributed with a medium intensity to all directions at a polar angle of 30° and is distributed with a strong intensity to four further specific orientation angles. The light distributed with medium intensity to all directions is due to light totally reflected at the boundary between the circular light blocking layers 540F and the light diffusion part. In contrast, the light distributed with high intensity to four specific orientations is due to light totally reflected at the boundary between the rhombic light blocking layers 540E and the light diffusion part.

This transmitted light distribution can be controlled by appropriately varying the proportion of rhombic light blocking layers 540E and circular light blocking layers 540F in the optical control member 509D, and can also be controlled by appropriately varying the side-to-side distance r1 in the rhombic light blocking layers 540E and the diameter r2 of the circular light blocking layers 540F. That is, by causing a mixture of light blocking layers with a rhombic planar shape and light blocking layers with a circular or elliptical planar shape, the viewing angle characteristics can be appropriately adjusted as necessary.

It is preferable that the side-to-side distance r1 of the rhombic light blocking layers 540E and the diameter r2 of the circular light blocking layers 540F be substantially equal. An example of the case in which the diameter r2 of the circular light blocking layers 540F is shorter than the side-to-side distance r1 of the rhombic light blocking layers 540E will be described. Because these light blocking layers are formed on the same flat surface, the exposure conditions for fabricating the light diffusion parts (diffused light conditions, exposure dose, and the like) are the same. Because the rhombic light blocking layers 540E have a prescribed side-to-side distance r1, it is possible to form appropriate reflecting surfaces using these exposure conditions. The circular light blocking layers 540F have a short maximum edge-to-edge width, and the size thereof is small. For that reason, the light that leaks out to the transparent negative resist formed around the light blocking layers 540E increases, and the transparent negative resist formed over the light blocking layers 540E also reacts to light. Therefore, if the diameter r2 of the circular light blocking layers 540F is shorter than the side-to-side distance r1 of the rhombic light blocking layers 540E, it is difficult to form appropriate reflecting surfaces on the light blocking layers 540E uniformly. There are cases in which all of the transparent negative resist formed over the light blocking layers 540E reacts to light, and in which it can be envisioned that a light diffusion part is not formed over the light blocking layers 540E. For that reason, it is preferable that the side-to-side distance r1 of the rhombic light blocking layers 540E and the diameter r2 of the circular light blocking layers 540F be substantially equal.

There is no restriction to a mixture of rhombic and circular light blocking layers, and there may be a mixture of rhombic and square light blocking layers. FIG. 65 illustrates an optical control member 509E in which light blocking layers 540G having a rhombic planar shape and light blocking layers 540H having a square planar shape are mixed. In the optical control member 509E, the number of rhombic light blocking layers 540G is greater than the square light blocking layers 540H. The opposing side-to-side distance r1 of the rhombic light blocking layer 540G and the distance r3 between opposite sides of the square light blocking layer 540H are substantially equal. This is because the side-to-side distance r1 of the above-noted rhombic light blocking layers 540E and the diameter r2 of the circular light blocking layers 540F are the same.

FIG. 66 is the distribution of transmitted light when parallel light is incident to the optical control member 509E from direction perpendicular to the drawing surface from the rear (polar angle 0°). As shown in FIG. 66, light that has passed through the optical control member 509E is distributed with a strong intensity to four specific directions at a polar angle of 30° and is distributed with a medium intensity to four different specific directions. The light distributed with medium intensity is due to the square light blocking layers 540H, and the light distributed with a strong intensity is due to the rhombic liquid crystal layers 540G.

This transmitted light distribution can be controlled by appropriately varying the proportion of the rhombic light blocking layers 540G and the square light blocking layers 540H in the optical control member 509E. It can also be controlled by appropriately varying the opposite side-to-side distance r1 in the rhombic light blocking layers 540G and the diameter r2 of the square light blocking layers 540H. That is, by causing a mixture of light blocking layers with a rhombic planar shape and light blocking layers with a square planar shape, the viewing angle characteristics can be appropriately adjusted as necessary.

Using the light blocking layers 509A, 509B, 509C, 509D, and 509E of the present embodiment as well, a change in the gamma characteristics when the display screen is viewed at an inclination from any direction is suppressed, and it is possible to achieve a liquid crystal display device with superior viewing angle characteristics.

Fifth Embodiment

The fifth embodiment of the present invention will now be described, using FIG. 34 to FIG. 37.

The basic constitution of the liquid crystal display device of the present embodiment is the same as that of the first embodiment, and the difference from the first embodiment is the constitution of the reflecting surfaces of the light diffusion part in the optical control member.

In the present embodiment, therefore, the description of the basic constitution of the liquid crystal display device will be omitted, and the optical control member will be described.

FIG. 34 and FIG. 35 are cross-sectional views of optical control members 609A and 609B of the present embodiment.

As shown in FIG. 34 and FIG. 35, in the optical control members 609A and 609B of the present embodiment, the reflecting surfaces 641Ac and 641Bc of the light diffusion parts 641A and 641B are different from in the optical control member 9 of the first embodiment.

Specifically, in the optical control member 9 of the first embodiment, the inclination angle of the reflecting surface 41c of the light diffusion part 41 is constant. In contrast, in the optical control members 609A and 609B shown in FIG. 34 and FIG. 35, the inclination angle of the reflecting surfaces 641Ac and 641Bc of the light diffusion parts 641A and 641B vary continuously. The cross-sectional shapes of the reflecting surfaces 641Ac and 64aBc are curved-line inclined surfaces.

In the optical control member 609A shown in FIG. 34, the reflecting surface 641Ac of the light diffusion part 641A is curved toward the hollow part 642A side, and the reflecting surface 641Ac side part of the hollow part 642A is convex.

In the optical control member 609B shown in FIG. 35, the reflecting surface 641Bc of the light diffusion part 641B is curved toward the hollow part 642B side, and the reflecting surface 641Bc side part of the hollow part 642B is convex.

FIG. 36 and FIG. 37 are drawings for describing the relationship between the inclination angle and the surface area ratio of the reflecting surface of the light diffusion part.

FIG. 36 shows the case in which the distribution of the inclination angles of the reflecting surfaces of the light diffusion part is the same for first reflecting surface and for the second reflecting surface. FIG. 37 shows the case in which the distribution of the inclination angles of the reflecting surfaces of the light diffusion part are different between the first reflecting surface and the second reflecting surface. In FIG. 36 and FIG. 37, the horizontal axis represents the inclination angle of the reflecting surface of the light diffusion part, and the vertical axis represents the surface area ratio of the reflecting surface of the light diffusion part. The surface area ratio is the ratio of the surface area of the part having some inclination angle with respect to the surface area of the overall reflecting surface when the reflecting surface of the light diffusion part is seen from the side. In the present embodiment, because the reflecting surfaces are curved, the inclination angle is the angle formed by the line tangent at a prescribed position on the curved part of the reflecting surface and the light incidence end face of the light diffusion part. In this case, as one example, the case in which the inclination angle $\phi 1$ of the first reflecting surface is larger than the inclination angle $\phi 2$ of the second reflecting surface will be described.

In the present embodiment, the inclination angle of the reflecting surface of the light diffusion part has a distribution with a spread about a main inclination angle. The distribution of the inclination angle of the reflecting surface of the light diffusion part, as shown in FIG. 36, is the same for the inclination angle $\phi 1$ of the first reflecting surface and the inclination angle $\phi 2$ of the second reflecting surface. The inclination angles may be different between the inclination angle $\phi 1$ of the first reflecting surface and the second inclination angle $\phi 2$ of the second reflecting surface, as shown in FIG. 37.

However, the contribution of the inclination angle $\phi 1$ of the first reflecting surface to the symmetry of the luminance distribution is greater than that of the inclination angle $\phi 2$ of the second reflecting surface. For that reason, to improve the symmetry of the luminance distribution, it is better to make the distribution of the inclination angle $\phi 1$ of the first reflecting surface narrow.

Using the optical control members 609A and 609B of the present embodiment as well, a change in the gamma characteristics when the display screen is viewed at an inclination from any direction is suppressed, and it is possible to achieve a liquid crystal display device with superior viewing angle characteristics.

Sixth Embodiment

The sixth embodiment of the present invention will now be described, using FIG. 38 and FIG. 39.

The basic constitution of the liquid crystal display device of the present embodiment is the same as that of the fifth embodiment, and the difference from the fifth embodiment is the constitution of the reflecting surfaces of the light diffusion part in the optical control member.

In the present embodiment, therefore, the description of the basic constitution of the liquid crystal display device will be omitted, and the optical control member will be described.

FIG. 38 and FIG. 39 are cross-sectional views showing optical control members 709A and 709B of the present embodiment.

As shown in FIG. 38 and FIG. 39, in the optical control members 709A and 709B of the present embodiment, the constitution of the reflecting surfaces of the optical control members is different from that of the optical control members 609A and 609B of the fifth embodiment.

Specifically, in the optical control members 609A and 609B of the fifth embodiment, the inclination angles of the reflecting surfaces of the light diffusion parts 641A and 641B change continuously and the cross-sectional shape of the reflecting surfaces 641A and 641B is a curved-line inclined surface. In contrast, in the optical control members 709A and 709B shown in FIG. 38 and FIG. 39, the reflecting surfaces 741Ac and 741Bc of the light diffusion parts 741A and 741B have a plurality of different inclination angles. The cross-sectional shapes of the reflecting surfaces 741Ac and 741Bc of the light diffusion parts 741A and 741B are piecewise linear inclined surfaces.

In the optical control member 709A shown in FIG. 38, the reflecting surface 741Ac of the light diffusion part 741A has three inclined surfaces having different inclination angles, and the reflecting surface 741Ac side part of the hollow part 742A is concave.

In the optical control member 709B shown in FIG. 39, the reflecting surface 741Bc of the light diffusion part 741B has three inclined surfaces having different inclination angles, and the reflecting surface 741Bc side part of the hollow part 742B is convex.

Using the optical control members 709A and 709B of the present embodiment as well, tone inversion of the display screen viewed at an inclination is suppressed, and it is possible to achieve a liquid crystal display device with superior viewing angle characteristics.

Seventh Embodiment

The seventh embodiment of the present invention will now be described, using FIG. 40 and FIG. 41.

The basic constitution of the light crystal display device of the present embodiment is the same as that of the first embodiment, and the difference from the first embodiment is the constitution of the reflecting surfaces of the light diffusion part in the optical control member.

In the present embodiment, therefore, the description of the basic constitution of the liquid crystal display device will be omitted, and the optical control member will be described.

FIG. 40 is an oblique view of an optical control member 809 of the present embodiment. In the first embodiment, the planar shape of the light blocking layers 40 is rhombic and the hollow parts 42 are square frustums having shapes corresponding thereto. In contrast, in the optical control member 809 of the present embodiment, the planar shapes of the light blocking layers 840 are elliptical. The hollow parts 842 are elliptic cylinders at the parts close to the light blocking layer 840, and change into square frustums with increasing distance from the light blocking layer 840. Therefore, the planar shapes of the hollow parts 842 on the light incidence end face 841a side of the light diffusion part 841 are rhombic. That is, the planar shapes of the light blocking layers 840 and the planar shapes of the hollow parts 842 cut by a plane parallel to the first plane of the base 39 are different.

The direction in which light incident to the optical control member 809 is reflected is not determined by the planar shapes of the light blocking layers 840, but rather by the orientation of the reflecting surface 841c of the light diffusion part 841. Therefore, even if the planar shapes of the light blocking layers 840 are elliptic cylinders, if a large part of the hollow parts 842 is a square frustum, the same effect as the optical control member 9 of the first embodiment can be obtained. That is, even in the optical control member 809 of the present embodiment, similar to the optical control member 9 of the first present embodiment, because light incident from the x-axis direction is preferentially reflected toward the y-axis direction, the direction dependency of the viewing angle characteristics of the liquid crystal display device can be alleviated.

FIG. 41 is a plan view showing the exposure method in the process of manufacturing the optical control member 809 of the present embodiment. In the present embodiment, parallel light is used when exposing the resist, which is the light diffusion part material, exposure being done four times in four directions; the orientation angle φ 45° direction (direction of arrow A), the orientation angle φ 135° direction (direction of arrow B), the orientation angle φ 225° direction (direction of arrow C), and the orientation angle φ 315° direction (direction of arrow D), in the condition in which there is inclination toward the polar angle from the normal line direction. The exposure dose of parallel light only, compared with other directions, is greater, and curing is done preferentially. By doing this, even if the planar shapes of the light blocking layers 840 are elliptical, after developing it is possible to form hollow parts 842 that are square frustums, such as shown in FIG. 40.

Eight Embodiment

The eighth embodiment of the present invention will now be described, using FIG. 42 to FIG. 44.

The basic constitution of the liquid crystal display device of the present embodiment is the same as that of the first embodiment, and the difference from the first embodiment is the constitution of the light blocking layers in the optical control member.

In the present embodiment, therefore, the description of the basic constitution of the liquid crystal display device will be omitted, and the optical control member will be described.

FIG. 42 is an exploded oblique view of a liquid crystal display device of the present embodiment.

In the optical control member 9 of the first embodiment, the light blocking layers 40 are disposed randomly within a plane and there is no difference between the density of the light blocking layers 40 depending on location. In contrast, in an optical control member 829 of the present embodiment, as shown in FIG. 42, the light blocking layers 830 are disposed to have a high density directly above the black matrix 30 of the liquid crystal panel 2 and to have a reduced density directly above the color filters 31. In FIG. 42, the individual light blocking layers are omitted. Because light exiting from the liquid crystal panel 2 in a perpendicular direction is reflected when it strikes the boundary between the light diffusion part of the optical control member 829 and the hollow parts, if there exists an optical control member 829, compared with the case of no optical control member 829, the amount of light passing through in the straight-on direction (orientation angle φ=0° and polar angle θ=0° direction) is reduced. This trend becomes prominent, the more light blocking layers 830 are disposed.

In the present embodiment, because the light blocking layer 830 is disposed in a region in which light that had progressed in the perpendicular direction by the black matrix 30 is absorbed, there is no reduction in the amount of light in the straight-on direction. Also, because light that has passed through the color filters 31 at an inclination and is incident to the optical control member 829 directly above the black matrix 30 is reflected by the reflecting surfaces of the light diffusion part directly below the light blocking layer 830, it is possible to increase the overall diffusion.

As a result, by increasing the number of light blocking layers 830 directly above the black matrix 30, diffusion can be increased without reducing the amount of light in the straight-on direction, and the effect of improving the viewing angle characteristics of the liquid crystal display device can be enhanced.

FIG. 43 is an exploded oblique view of a liquid crystal display device of the present embodiment.

When the orientation of liquid crystal molecules at the boundary G of the two domains 50a and 50b is disturbed, a localized dark line-like region appears in the displayed image seen through the polarizing sheet. For that reason, in addition to the black matrix 30, by increasing the number of light blocking layers 830 directly over the domain boundary G, the light diffusion is increased without reducing the amount of light in the straight-on direction, and the effect of improving the viewing angle characteristics of the liquid crystal display device can be enhanced.

Regardless of the method, in order to align regions in which the density of the light blocking layers 830 is high with the positions of the black matrix 30 or the boundaries G between domains, it is necessary to align the positions of the liquid crystal panel 2 and the light diffusion part 829 when adhering them together. For that purpose, for example as shown in FIG. 44, registration marks 832 can be formed on the liquid crystal panel 2 and registration marks 834 can be formed on the light diffusion part 829, the liquid crystal panel 2 and the light diffusion part 829 being adhered together while a camera is used to verify the matching of the opposing marks 832 and 834. By adhering in this manner, it is possible to implement a liquid crystal display device in which the registration between a region having a high density of light blocking layers 830 and the black matrix 30 or domain borders G is highly precise.

Ninth Embodiment

The ninth embodiment of the present invention will now be described, using FIG. 45 to FIG. 47.

The basic constitution of the light control member the present embodiment is the same as that of the first embodiment, and the difference from the first embodiment is the constitution of the backlight.

In the present embodiment, therefore, the description of the liquid crystal panel and the optical control member will be omitted, and the backlight will be described.

The optical control member 9 of the first embodiment has the function of preferentially mixing light that has exited from the orientation angle φ direction from 0° to 180° of the liquid crystal panel 2 with light that has exited toward the orientation angle φ direction from 90° to 270°. Therefore, the greater is the amount of light exiting from the backlight in the orientation angle φ direction from 0° to 180°, the greater is the amount of light reflected in the orientation angle φ direction from 90° to 270°. As a result, the effect of improving the viewing angle characteristics with respect to the orientation angle φ direction from 90° to 270° is enhanced. For that reason, it is desirable that, in the backlight 8, the amount of light exiting in the orientation angle φ direction from 0° to 180° be greater than the amount of light exiting in the orientation angle φ direction from 90° to 270°.

The backlights 908, 918, and 928 shown in FIG. 45 to FIG. 47 each have characteristics in which the amount of light exiting in the orientation angle φ direction from 0° to 180° is greater than the amount of light exiting in the orientation angle φ direction from 90° to 270°. Each of the backlights 908, 918, and 928 has a structure for the purpose of making the amount of light exiting in the orientation angle φ direction from 0° to 180° greater than the amount of light exiting in the orientation angle φ direction from 90° to 270°.

The backlight 908 shown in FIG. 45 has a light-guiding sheet 37, a light source 36, and two prism sheets 909. The light-guiding sheet 37 and the light source 36 are the same as in the backlight 8 of the first embodiment. The two prism sheets 909 are the same. As a structure, the prism sheet 909 has, on the side thereof that opposes the liquid crystal panel 2, a plurality of convex parts 909S having a triangular cross-section when cut by a plane (the yz plane) perpendicular to the light-exiting surface 37b and also perpendicular to the end surface 37c of the light-guiding sheet 37. A BEF sheet (product name) made by 3M, for example, is used as the prism sheets 909. If two prism sheets 909 are used, light is collected in the orientation angle φ direction from 0° to 180° more than with the use of only one prism sheet.

The backlight 918 shown in FIG. 46 has a light-guiding sheet 37, a light source 36, and a prism sheet 919. The light-guiding sheet 37 and the light source 36 are the same as in the backlight 8 of the first embodiment. As a structure, the prism sheet 919 has, on the side thereof that opposes light-guiding sheet 37, a plurality of convex parts 919S having a triangular cross-section when cut by a plane (the yz plane) perpendicular to the light-exiting surface 37b and also perpendicular to the end surface 37c of the light-guiding sheet 37, and extending in a direction parallel to the end surface 37c. The prism sheet 919 is a so-called turning lens sheet.

The backlight 928 shown in FIG. 47 has a light-guiding sheet 929, a light source 36, and a prism sheet 919. The light source 36 is the same as in the backlight 8 of the first embodiment. As a structure, the light-guiding sheet 929 has, on the surface opposite from the side opposing the prism sheet 919, a plurality of convex parts 929S having a triangular cross-section when cut by a plane (the yz plane) perpendicular to the light-exiting surface 929b of the light guiding sheet 929 and also perpendicular to the end surface 929c of the light guiding sheet 929t of the light-guiding sheet 929, and extending in a direction parallel to the end surface 929c. As a structure, the prism sheet 919 has, on the surface on the side opposing the light-guiding sheet 37b of the light-guiding sheet 37, a plurality of convex parts 919S having a triangular cross-section when cut by a plane (the yz plane) perpendicular to the light-exiting surface 37b of the light guiding-sheet 37 and also perpendicular to the end surface 37c, and extending in a direction parallel to the end surface 37c. The prism sheet 919 is the same as in the backlight 918 shown in FIG. 46.

Because each of the backlights 908, 918, and 928 has a relatively large amount of light exiting in the orientation angle φ direction from 0° to 180°, it can enhance the effect of improving the viewing angle characteristics by the optical control member.

Tenth Embodiment

The tenth embodiment of the present invention will now be described, using FIG. 48 and FIG. 49.

The basic constitution of the light crystal display device of the present embodiment is the same as that of the first embodiment, and the difference from the first embodiment is the constitution of the light diffusion part in the optical control member.

In the present embodiment, therefore, the description of the basic constitution of the liquid crystal display device will be omitted, and the optical control member will be described.

In the optical control member 9 of the first embodiment, in the entire light diffusion part 41 the light incidence end surface 41a of the light diffusion part 41 is larger than the light-exiting end surface 41b thereof. In contrast, in the optical control member 1009 of the present embodiment, as shown in FIG. 48, of a plurality of light diffusion parts, among the light diffusion parts 41 in which the surface of the light incidence end face 41b is larger than the surface area of the light-exiting end face 41a, there are mixed some light diffusion parts 941, in which the surface area of the light incidence end surface 941b is smaller than the surface area of the light-exiting end face 941a. Whereas the inclination angle θc of the reflecting surface 41c of the light diffusion part 41 is smaller than 90°, the inclination angle θc' of the reflecting surface 941c of the light diffusion part 941 is larger than 90°. By this difference in constitution, the function of the light diffusion part 41 and the function of the light diffusion part 941 are different. When light is incident to the reflecting surface 941c of the light diffusion part 941, the light is reflected in a direction that makes the angle of the light beam smaller with respect to the normal line direction of the base 39, and a part of the light exits in the normal line direction (straight-on direction) of the liquid crystal display device. When the light diffusion part 41 mixes light in the straight-on direction in an inclined direction and the light diffusion part 941 mixes inclined light in the straight-on direction, the difference between the straight-on direction and the inclined direction light is alleviated. As a result, the inclined direction viewing angle characteristics are improved when the straight-on direction image is adjusted.

In this manner, according to the optical control member 1009 of the present embodiment, in addition to the effect of alleviating, as in the first embodiment, the difference in viewing angle characteristics in the orientation angle φ direction from 0° to 180° and from 90° to 270°, the different viewing angle characteristics between the normal line direction of the light crystal display device, that is, the straight-on direction to the screen of the liquid crystal display device and an inclined direction is alleviated. This improves the difference in the display quality between the straight-on direction and an inclined direction when the screen is viewed from a greater inclined direction.

FIG. 49 is a schematic representation of the exposure process in the process for manufacturing the optical control member 1009 of the present embodiment. A method for mixing a region in which the inclination angle of the reflecting surface of the light diffusion part is greater than 90° and a region in which the inclination angle of the reflecting surface is smaller than 90° is to divide the exposure process into two parts, as shown in FIG. 49, using a photomask 1010 in the first exposure step so that a part of the resist 1011 is not exposed, and removing the photomask 1010 for the second exposure step so that the entire surface of the resist 1011 is exposed. By controlling the doses of the first and second exposures, regions with a small exposure dose can be made to have an inclination angle greater than 90°, and regions with a large exposure dose can be made to have an inclination angle less than 90°. By changing the degree of light diffusion between the first and the second exposure steps, the degree of control of the inclination angle can be changed.

By reflecting inclined light toward the straight-on direction by an optical control member 1009 that includes a light diffusion part 941 having a reflecting surface 941c with an inclination angle greater than 90°, the straight-on direction characteristics, such as luminance and chromaticity of an image output with respect to input tones, might differ from the condition in which there is no optical control member 1009. In this case, a solution can be achieved either by the method of adjusting the image after adhering the optical control member 1009 or, assuming that the luminance and chromaticity will change due to the optical control member 1009, by the method of adjusting the image differently beforehand.

Eleventh Embodiment

The eleventh embodiment of the present invention will now be described, using FIG. 50 to FIG. 52.

The basic constitution of the liquid crystal display device of the present embodiment is the same as that of the first embodiment, and the difference from the first embodiment is the constitution of the pixels of the liquid crystal panel. The liquid crystal panel of the present embodiment has a so-called multi-pixel drive pixel constitution.

In the present embodiment, therefore, the description of the basic constitution of the liquid crystal display device will be omitted, and the pixels of the liquid crystal panel will be described.

FIG. 50 is a schematic representation of the electrical constitution of a liquid crystal display device 200 of the present embodiment.

A pixel 60 has a first sub-pixel 60a and a second sub-pixel 60b, the voltage applied to the liquid crystal layer of each of which can be controlled individually. A TFT 66a and a supplementary capacitance (CS) 72a are connected to the first sub-pixel 60a, and a TFT 66b and a supplementary capacitance (CS) 72b are connected to the second sub-pixel 60b. The gate electrodes of the TFT 66a and the TFT 66b are connected to the scanning line 62. The source electrodes are connected in common to the same signal line 64. The supplementary capacitances 72a and 72b are connected, respectively, to a supplementary capacitance interconnect (CS bus line) 74a and a supplementary capacitance interconnect 74b. The supplementary capacitance 72a and the supplementary capacitance 72b are formed by supplementary capacitance electrodes electrically connected, respectively, to the sub-pixel electrode 68a and the sub-pixel electrode 68b, the supplementary capacitance opposing electrodes electrically connected to the supplementary capacitance interconnect 74a and the supplementary capacitance interconnect 74b, and an insulating layer (not shown) provided therebetween. The supplementary capacitance opposing electrodes of the supplementary capacitance 72a and the supplementary capacitance 72b are mutually independent, and mutually different supplementary capacitance opposing electrode voltages can be supplied respectively from the supplementary capacitance interconnect 74a and from the supplementary capacitance interconnect 74b.

The first sub-pixel 60a further has two domains 61a and 61b. When a voltage is applied, the liquid crystal molecules 51 included in the domain 61a and the liquid crystal molecules 51 included in the domain 61b fall over in directions that are mutually 180° different. In the same manner, the second sub-pixel 60b further has two domains 61c and 61d. When a voltage is applied, the liquid crystal molecules 51 included in the domain 61c and the liquid crystal molecules 51 included in the domain 61d fall over in directions that are mutually 180° different.

Next, the principle of being able to apply mutually different effective voltages to the two sub-pixels 60a and 60b of the liquid crystal display device 200 will be described, using FIG. 51.

FIG. 51 is a schematic representation of the equivalent circuit of one pixel of the liquid crystal display device 200. In the electrical equivalent circuit, the liquid crystal layers of the sub-pixels 60a and 60b are represented as the liquid crystal layers 63a and 63b. The liquid crystal capacitances formed by the supplementary capacitance electrodes 68a and 68b, the liquid crystal layers 63a and 63b, and the opposing electrodes 67 (common to the sub-pixels 60a and 60b) are taken to be C1ca and C1cb.

The capacitance values of the liquid crystal capacitances C1ca and C1cb are taken to be the same value CLC (V). The value of CLC (V) is dependent on the effective voltage (V) applied to each sub-pixel 60a and 60b. The supplementary capacitances 72a and 72b connected independently to the liquid crystal capacitances of the sub-pixel 60a and 60b are taken to be Ccsa and Ccsb, and the capacitance values thereof are taken to be the same value CCS.

One electrode of the supplementary capacitance Ccsa of the sub-pixel 60a is the sub-pixel electrode. The sub-pixel electrode 68a of the liquid crystal capacitance C1ca and the sub-pixel electrode of the supplementary capacitance Ccsa are connected to the drain electrode of the TFT 66a provided for driving the sub-pixel 60a. The other electrode of the liquid crystal capacitance C1ca is the opposing electrode. The other electrode of the supplementary capacitance Ccsa is connected to the supplementary capacitance interconnect 74a. One electrode of the supplementary capacitance Ccsb of the sub-pixel 60b is the sub-pixel electrode. The sub-pixel electrode 68b of the liquid crystal capacitance C1cb and the sub-pixel electrode of the supplementary capacitance Ccsb are connected to the drain electrode of the TFT 66b provided for driving the sub-pixel 60b. The other electrode of the liquid crystal capacitance C1cb is the opposing electrode. The other electrode of the supplementary capacitance Ccsb is connected to the supplementary capacitance interconnect 74b. Both of the gate electrodes of the TFT 66a and the TFT 66b are connected to the scanning line 62. The source electrodes are both connected to the signal line 64.

FIG. 52(a) to FIG. 52(f) show, in schematic form, the timing of the various voltages when the liquid crystal display device 200 of the present embodiment is driven.

FIG. 52(a) shows the voltage waveform Vs of the signal line. FIG. 52(b) shows the voltage waveform Vcsa on the supplementary capacitance interconnect 74a. FIG. 52(c) shows the voltage waveform Vcsb on the supplementary capacitance interconnect 74b. FIG. 52(d) shows the voltage waveform Vg on the scanning line 62. FIG. 52(e) shows the voltage waveform V1ca on the pixel electrode 68a of the sub-pixel 60a. FIG. 52(f) shows the voltage waveform V1cb on the pixel electrode 68b of the sub-pixel 60b. The broken lines in the drawings indicate the voltage waveform common voltage (Vcom) of the opposing electrode.

The operation of the equivalent circuit of FIG. 51 will now be described, using FIG. 52(a) to FIG. 52(f).

At time T1, by the voltage Vg changing from VgL to VgH, the TFT 66a and the TFT 66b simultaneously go into the conducting (on) state, and the voltage Vs of the signal line 64 reaches the sub-pixel electrodes 68a and 68b of the sub-pixels 60a and 60b and is charged in the sub-pixels 60a and 60b. In the same manner, the supplementary capacitances Csa and Csb of the sub-pixels 60a and 60b are charged from the signal line 64.

At time T2, by the voltage Vg on the scanning line 62 changing from VgH to VgL, the TFT 66a and the TFT 66b simultaneously go into the non-conducting (off) state, and sub-pixels 60a and 60b and supplementary capacitances Csa and Csb are all electrically isolated from the signal line 64. Immediately after this, because of the pull-in phenomenon caused by the influence of parasitic capacitances of the TFT 66a and the TFT 66b, the voltages V1ca and V1cb of the respective sub-pixel electrodes are reduced by the substantially same voltage Vd, as expressed by the following equations.

$$V1ca = Vs - Vd \quad (1)$$

$$V1cb = Vs - Vd \quad (2)$$

When this occurs, the voltages Vcsa and Vcsb on the respective supplementary capacitance interconnects are given by the following equations.

$$Vcsa = Vcom - Vad \quad (3)$$

$$Vcsb = Vcom + Vad \quad (4)$$

At time T3, the voltage Vcsa on the supplementary capacitance interconnect 74a connected to the supplementary capacitance Csa changes from Vcom−Vad to Vcom+Vad, and the voltage Vcsb on the supplementary capacitance interconnect 74b connected to the supplementary capacitance Csb changes by two times Vad, from Vcom+Vad to Vcom−Vad. Accompanying the change in voltage on the supplementary capacitance interconnects 74a and 74b, the respective voltages V1ca and V1cb on the sub-pixel electrodes change as shown in the following equations.

$$V1ca = Vs - Vd + 2 \times K \times Vad \quad (5)$$

$$V1cb = Vs - Vd - 2 \times K \times Vad \quad (6)$$

In the above, K=CCS/(CLC (V)+CCS).

At time T4, Vcsa changes by two times Vad from Vcom+Vad to Vcom−Vad and Vcsb changes by two times Vad from Vcom−Vad to Vcom+Vad, V1ca and V1cb changing from Equation (7) and Equation (8) to Equation (9) and Equation (10).

$$V1ca = Vs - Vd + 2 \times K \times Vad \quad (7)$$

$$V1cb = Vs - Vd - 2 \times K \times Vad \quad (8)$$

$$V1ca = Vs - Vd \quad (9)$$

$$V1cb = Vs - Vd \quad (10)$$

At time T5, Vcsa changes by two times Vad from Vcom−Vad to Vcom+Vad and Vcsb changes by two times Vad from Vcom+Vad to Vcom−Vad, V1ca and V1cb changing from Equation (11) and Equation (12) to Equation (13) and Equation (14).

$$V1ca = Vs - Vd \quad (11)$$

$$V1cb = Vs - Vd \quad (12)$$

$$V1ca = Vs - Vd + 2 \times K \times Vad \quad (13)$$

$$V1cb = Vs - Vd - 2 \times K \times Vad \quad (14)$$

Vcsa, Vcsb, V1ca, and V1cb alternately repeat the above-noted changes at T4 and T5 at an interval that is an integral multiple of the horizontal write period 1H. Whether to make the repetition period of the above-noted T4 and T5 one, two, three, or a greater multiple of 1H can be set appropriately, in consideration of the method of driving the liquid crystal display device (for example, polarity inversion) and the display state (for example, flickering and feeling of roughness). This repetition continues until the next pixel 60 is overwritten, that is, until a time equivalent to T1 is reached. Therefore, the effective values of the voltages V1ca and V1cb on the respective sub-pixel electrodes are as follows.

$$V1ca = Vs - Vd + K \times Vad \quad (15)$$

$$V1cb = Vs - Vd - K \times Vad \quad (16)$$

Thus, the effective voltages V1 and V2 applied to the liquid crystal layers 13a and 13b of the sub-pixels 60a and 60b are given as follows.

$$V1 = V1ca - Vcom \quad (17)$$

$$V2 = V1cb - Vcom \quad (18)$$

That is, the effective voltages V1 and V2 can be rewritten as follows.

$$V1 = Vs - Vd + K \times Vad - Vcom \quad (19)$$

$$V2 = Vs - Vd - K \times Vad - Vcom \quad (20)$$

Therefore, the effective voltage difference ΔV12 (=V1−V2) between the voltages applied to the liquid crystal layers 13a and 13b of the respective sub-pixels 60a and 60b is ΔV12=2×K×Vad (where K=CCS/(CLC (V)+CCS), enabling mutually different voltages to be applied.

In the present embodiment, the optical control member 9 is combined with the liquid crystal display device 200 having the above-described constitution. Similar to the first embodiment, the optical control member 9 is disposed so that, when a voltage is applied, the direction in which the liquid crystal molecules 51 fall and the short-axis orientation of the liquid crystal layers 40 of the optical control member 9 substantially coincide.

Light incident to the optical control member 9 from the orientation angle φ direction from 0° to 180° is preferentially mixed by the optical control member 9 toward the orientation angle φ direction from 90° to 270°. As a result, the change in the gamma characteristics dependent on the polar angle θ in the orientation angle φ direction from 90° to 270° is alleviated.

In addition, by the effect of multi-pixel drive, there is further alleviation of the color difference when viewing at an inclined direction at an orientation angle φ direction from 90° to 180°.

There is no restriction to the multi-pixel drive method used in the present embodiment, and another multi-pixel drive method can be applied to the present embodiment. For example, the pixel constitutions described in Japanese Patent Application Publications No. 2006-48055, Japanese Patent Application Publication No. 2006-133577, Japanese Patent Application Publication No. 2009-199067, and International Patent Publication 2008/18552 may be used.

Twelfth Embodiment

The liquid crystal display devices described above in the first embodiment to the eleventh embodiment can be used in various electronic devices.

Electronic devices having the liquid crystal display device described above in the first embodiment to the eleventh embodiment will now be described below, using FIG. 53 to FIG. 55.

The liquid crystal display device described above in the first embodiment to the eleventh embodiment is, for example, the flat-panel TV shown in FIG. 53.

The flat-panel TV 250 shown in FIG. 53 has a display 251, a speaker 252, a cabinet 253, a stand 254, and the like.

A liquid crystal display device of the above-described first embodiment to eleventh embodiment is preferably applied as the display 251. By applying the liquid crystal display device of the above-described first embodiment to eleventh embodiment as the display 251 of the flat-panel TV 250, it is possible to display video with little dependency on the viewing angle.

A liquid crystal display device of the above-described first embodiment to eleventh embodiment can be applied, for example, to the smartphone 240 shown in FIG. 54.

The smartphone 240 shown in FIG. 54 has a sound input 241, a sound output 242, an operating switch 244, a display 245, a touch panel 243, and an enclosure 246 and the like.

A liquid crystal display device of the above-described first embodiment to eleventh embodiment be preferably used as the display 245. By applying the liquid crystal display device of the above-described first embodiment to eleventh embodiment as the display 245 of the smartphone 240, it is possible to display video with little dependency on the viewing angle.

A liquid crystal display device of the above-described first embodiment to eleventh embodiment can be applied in a laptop computer 270 such as shown in FIG. 55.

The laptop computer 270 shown in FIG. 55 has a display 271, a keyboard 272, a touch panel 273, a main switch 274, a camera 275, a recording medium slot 276, and an enclosure 277 and the like.

The liquid crystal display device of the above-described first embodiment to eleventh embodiment can be preferably applied as the display 271. By applying the liquid crystal display device of the above-noted first embodiment to eleventh embodiment as the display 271 of the laptop computer 270, it is possible to display video with little dependency on the viewing angle.

The technical scope in the several aspects of the present invention is not restricted to the foregoing embodiments, and can be subjected to various modifications, within the scope of the spirit of the aspects of the present invention.

For example, it is not absolutely necessary for the orientation angle direction at which the change in the gamma characteristics dependent on the polar angle of the liquid crystal panel is large to coincide totally with the minor-axis direction of the light blocking layers in the optical control member, and they may substantially coincide.

The case in which the offset between the orientation angle direction at which the change in the gamma characteristics dependent on the polar angle of the liquid crystal panel and the minor-axis direction of the light blocking layers in the optical control member is within approximately ±5° also falls within the technical scope of the aspects of the present invention. From this, in a liquid crystal display device of one aspect of the present invention, it is preferable that the liquid crystal panel have a plurality of pixels having at least two domains, in which the directors of liquid crystal molecules in a liquid crystal layer are in the first direction and are in mutually opposite orientations, wherein the absorption axis of the first polarizing sheet and the absorption axis of a second polarizing sheet are mutually orthogonal and form an angle of 45°±5° with respect to the first direction.

The reason for this is that exceeding the above-noted angle range can lead to a decrease in the transmissivity. Although the ideal designed value of the above-noted angle is normally 45°, the ideal value might be offset somewhat from 45° due to the constitution within the panel and the manufacturing process. This is because, if there is a 5° offset from 45°, it can be thought that there will be an approximately 10% decrease in the transmissivity, but if this becomes greater than 5°, there is a great increase in the degree of reduction in the transmissivity, thereby affecting the display performance.

The constitution may be one in which at least one of an anti-reflective structure, a polarizing filter layer, an anti-static layer, an anti-glare treated layer, an anti-contamination treated layer is provided on the viewing side of the base of the optical control member in the above-noted embodiments. According to this constitution, in accordance with the type of layer provided on the viewing side of the base, it is possible to add functions such as reduction of the reflection of outside light, prevention of the attachment of dust and dirt, and prevention of damage, thereby preventing a deterioration of the viewing angle characteristics with aging.

In particular, as one example of an anti-reflective structure, an anti-glare layer may be provided on the viewing side of the base of the optical control member. For example, a multilayer dielectric film or the like that cancels out external light using light interference is used as an anti-glare layer.

Another example of an anti-reflective structure that may be used is a constitution in which a so-called moth-eye structure is provided on the viewing side of the base of the optical control member. In the present invention, the moth-eye structure is encompasses the following structures and shapes. The moth-eye structure has a shape and structure with unevenness having a period smaller than the wavelengths of visible light, using the principle of the constitution of a moth's eye. The period of the unevenness is controlled to be below the wavelengths of visible light ($\lambda$=380 nm to 780 nm). The two-dimensional size of the protrusions constituting the unevenness is 10 nm or greater and less than 500 nm. Reflection is controlled by varying the refractive index with respect to light incident to the base, along the depth direction of the unevenness, continuously from the refractive index of the medium from which the light is incident (air) up until the refractive index of the base.

Although in the foregoing embodiments the shape of the hollow parts or the light diffusion part is a square frustum, it may be another shape. Also, the inclination angles of the reflecting surface of the light diffusion part need not be symmetrical about the optical axis as the center. If, as in the foregoing embodiments, the hollow part or the light diffusion part shape is a square frustum, because the inclination angles of the reflecting surfaces of the light diffusion part exhibit line symmetry about the optical axis as the center, the angular distribution obtained exhibits line symmetry about the optical axis as the center. In contrast, if an intentionally asymmetrical angular distribution is demanded in accordance with the application or method of use of the display device, and there is a need to broaden the viewing angle, for example, on the upper side only or right side only of the screen, the inclination angle of the reflecting surfaces of the light diffusion part may be made asymmetrical.

Regarding the domains within the liquid crystal display device, the surface areas of the two domains may be different, and the directors of the liquid crystal molecules need not be completely 180° different. Although the present invention is applied in the case in which there are at least two domains inside a pixel, there may be three or more domains, in which case, the minor-axis direction of the light blocking layers of the optical control member can be disposed to match the orientation angle direction in which it is desired to improve the viewing angle characteristics.

In the foregoing embodiments, one pixel PX of the liquid crystal panel 2, as shown in FIG. 56A, is constituted by three rectangular sub-pixels for red (R), green (G), and blue (B), these three sub-pixels being oriented with their long sides along the vertical direction (indicated by the arrow as V) and arranged along the horizontal direction (indicated by the arrow as H). The arrangement of the sub-pixels is not restricted to the above, and, as shown in FIG. 56B, the three sub-pixels R, G, and B may be arranged with their long sides oriented along the horizontal direction (indicated by the arrow as H) and arranged along the vertical direction (indicated by the arrow as V).

Also, as shown in FIG. 56C, one pixel in the liquid crystal panel 2 may be constituted by four sub-pixels for red (R), green (G), blue (B), and yellow (Y), these four sub-pixels being oriented with their long sides along the vertical direction (indicated by the arrow as V) and arranged along the horizontal direction (indicated by the arrow as H). Alternatively, as shown in FIG. 56D, the four sub-pixels R, G, B, and Y may be arranged with their long sides along the horizontal direction (indicated by the arrow as H) and arranged along the vertical direction (indicated by the arrow as V) or, as shown in FIG. 56E, one pixel of the liquid crystal panel may be constituted by the four sub-pixels R, G, B, Y arranged as a square, with two rows and two columns thereof in the horizontal and vertical directions, respectively.

In addition, in the specific constitution, regarding, for example, the materials of, numbers of, and dispositions of each of the constituent elements of the liquid crystal display device and the optical control member are not restricted to the foregoing embodiment and may be appropriately modified. For example, although in the foregoing embodiments the example is shown of the arrangement of a polarizing sheet and phase difference film on the outside of the liquid crystal panel, as an alternative to that constitution, a polarizing sheet and phase difference film may be formed on the inside of a pair of substrates constituting the liquid crystal panel.

INDUSTRIAL APPLICABILITY

A number of aspects of the present invention can be used liquid crystal display devices and optical control members.

DESCRIPTION OF THE REFERENCE SYMBOLS 1, 200 Liquid crystal display device
2 Liquid crystal panel
3 First polarizing sheet
7 Second polarizing sheet
8, 908, 918, 928 Backlight (illumination device)
9, 309, 509A, 509B, 509C, 509D, 609A, 609B, 709A, 709B, 809, 829 Optical control member
10 TFT substrate (first substrate)
11 Liquid crystal layer
12 Color filter substrate (second substrate)
27 First vertical alignment film
34 Second vertical alignment film
39, 339 Base
40, 140, 340, 440A, 440B, 440C, 440D, 440E, 440F, 540A, 540B, 540C, 540D, 830, 840 Light blocking layer
41, 341, 641A, 641B, 741A, 741B, 941 Light diffusion part
42, 642A, 642B, 742A, 742B, 842 Hollow part (low refractive index part)
50, 60, PX Pixel
51 Liquid crystal molecule
60a First sub-pixel
60b Second sub-pixel
86 Base material for manufacturing an optical control member
909, 919 Prism sheet
909S, 919S, 929S Convex part (structure)
929 Light-guiding sheet

The invention claimed is:

1. A liquid crystal display device comprising:
a liquid crystal panel comprising
a first substrate having a first vertical alignment film,
a second substrate having a second vertical alignment film,
a liquid crystal layer having negative dielectric anisotropy sandwiched between the first vertical alignment film and the second vertical alignment film,
a first polarizing sheet disposed on a light incidence side of the liquid crystal layer,
a second polarizing sheet disposed on a light-exiting side of the liquid crystal layer, and
a plurality of pixels having at least two domains, in which the directors of liquid crystal molecules in the liquid crystal layer are in a first direction and are in mutually opposite orientations;
an optical control member disposed on the light-exiting side, the optical control member comprising
a base having transparency to light,
a light diffusion part provided on a first surface of the base,
a light blocking part provided at a first position of the first surface that does not overlap with the light diffusion part when viewed from a first normal line direction of the base, and
a low refractive index part having a first refractive index lower than a second refractive index of the light diffusion part, the low refractive index part being provided at a second position that partially overlaps with the light blocking part when viewed from the first normal line direction,
wherein a first absorption axis of the first polarizing sheet and a second absorption axis of the second polarizing sheet are mutually orthogonal and form a first angle that is substantially 45° with respect to the first direction,
the light diffusion part has
a light-exiting end surface positioned on a first side of the base,
a light incidence end surface positioned on a second side opposite from the first side, and
an inclined surface positioned between the light-exiting end surface and the light incidence end surface, and
a first planar shape of the light blocking part when seen from the first normal line direction has
a straight line part forming a second angle of less than 45° with the one of the first absorption axis and the second absorption axis.

2. The liquid crystal display device according to claim 1, wherein the first planar shape has a major axis and a minor axis.

3. The liquid crystal display device according to claim 2, wherein the first planar shape is a polygon.

4. The liquid crystal display device according to claim 3, wherein the polygon is a rhombus.

5. The liquid crystal display device according to claim 2, wherein the first planar shape is a rhombus with at least one corner part cutaway by a straight line or a curved line.

6. The liquid crystal display device according to claim 5, wherein the first planar shape has a second straight line part parallel to the first direction and a third straight line part perpendicular to the first direction, and
a first total of lengths of the second straight line part and the third straight line part is shorter than a second total of lengths of a second straight line part parallel to or forming a third angle of smaller than 45° with the one of the first absorption axis and the second absorption axis.

7. The liquid crystal display device according to claim 2, wherein a ratio of a first dimension of the major axis to a second dimension of the minor axis is 1 or greater and no greater than 3.

8. The liquid crystal display device according to claim 2, wherein a second direction of the minor axis in the first planar shape forms a third angle that is substantially 45° with respect to the one of the first absorption axis and the second absorption axis.

9. The liquid crystal display device according to claim 1, wherein the first planar shape and a cross-sectional shape of the low refractive index part cut by a plane parallel to the first surface are different.

10. The liquid crystal display device according to claim 1, wherein the light blocking part is constituted by a plurality of point-like parts.

11. The liquid crystal display device according to claim 10, wherein some planar shapes of at least half of the plurality of point-like parts are rhombic, and
other planar shapes of the at least half of the plurality of point-like parts are different from rhombic.

12. The liquid crystal display device according to claim 1, wherein a third angle formed by the light incidence end surface and the inclined surface is 80°±5°.

13. The liquid crystal display device according to claim 1, wherein a proportion of surface area occupied by the light blocking part of an overall surface area of the first surface is 30%±10%.

14. The liquid crystal display device according to claim 1, wherein the light diffusion part comprises a plurality of light diffusion parts,
a first surface area of the light incidence end surface is larger than a second surface area of the light-exiting end surface in a part of the plurality of light diffusion parts, and
the first surface area is smaller than the second surface area in another part of the plurality of light diffusion parts.

15. The liquid crystal display device according to claim 1, wherein the second substrate is disposed on a third side of the optical control member, and
a first thickness of the second substrate is smaller than a second thickness of the first substrate.

16. The liquid crystal display device according to claim 1, the liquid crystal display device further comprising an illumination device disposed on the light incidence side,
wherein, the illumination device has a structure that makes a first amount of light exiting in a second direction perpendicular to the first direction greater than a second amount of light exiting from a third direction parallel to the first direction when viewed from the first normal line direction.

17. The liquid crystal display device according to claim 1, wherein the pixel comprises at least a first sub-pixel and a second sub-pixel, and
a voltage applied to the liquid crystal layer can be controlled independently.

18. The liquid crystal display device according to claim 1, wherein the liquid crystal panel comprises a black matrix, and
when viewed from a second normal line direction of the liquid crystal panel, a first density of light blocking layers provided in a first region that overlaps in a planar manner with a black matrix is higher than a second density of the light blocking layer provided in a second region not overlapping in a planar manner with the black matrix.

19. An optical control member comprising:
a base having transparency to light;
a light diffusion part provided on a first surface of the base;
a light blocking part provided at a first position of the first surface that does not overlap with the light diffusion part when viewed from a normal line direction of the base; and
a low refractive index part having a first refractive index lower than a second refractive index of the light diffusion part, the low refractive index part being provided at a second position that partially overlaps with the light blocking part when viewed from the normal line direction
wherein the light diffusion part has
a light-exiting end surface positioned on a first side of the base,
a light incidence end surface positioned on a second side opposite from the first side, and
an inclined surface positioned between the light-exiting end surface and the light incidence end surface,
a first planar shape of the light blocking part when seen from the normal line direction has a straight line part that forms an angle of larger than 0° and smaller than 90° with respect to one side of a second planar shape of the base, and
the first planar shape has a major axis and a minor axis.

20. A base material for manufacturing at least one optical control member that includes a first region in which the at least one optical control member is formed,
wherein the at least one optical control member has
a base having transparency to light,
a light diffusion part provided on a first surface of the base,
a light blocking part provided at a first position of the first surface other than a second region in which the light diffusion part is formed, and
a low refractive index part having a first refractive index lower than a second refractive index of the light diffusion part provided at a second position that partially overlaps with the light blocking part when viewed from a normal line direction of the base,
wherein the light diffusion part has
a light-exiting end surface positioned on a first side of the base,
a light incidence end surface positioned on a second side opposite from the base, and
an inclined surface positioned between the light-exiting end surface and the light incidence end surface, a first planar shape of the light blocking part when seen from the normal line direction has a straight line part that forms an angle of larger than 0° and smaller than 90° with respect to one side of a second planar shape of the first region, and the first planar shape has a major axis and a minor axis.

* * * * *